United States Patent
Choe et al.

(10) Patent No.: US 9,972,587 B2
(45) Date of Patent: May 15, 2018

(54) SIGNAL TRANSMISSION DEVICE USING ELECTROMAGNETIC RESONANCE COUPLER

(71) Applicant: Panasonic Intellectual Property Management Co., Ltd., Osaka (JP)

(72) Inventors: Songbaek Choe, Osaka (JP); Shuichi Nagai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 15/423,589

(22) Filed: Feb. 3, 2017

(65) Prior Publication Data
US 2017/0256507 A1    Sep. 7, 2017

(30) Foreign Application Priority Data

Mar. 2, 2016 (JP) .................................. 2016-040481
Jun. 2, 2016 (JP) .................................. 2016-111380

(51) Int. Cl.
*H04B 1/10* (2006.01)
*H01L 23/66* (2006.01)
(Continued)

(52) U.S. Cl.
CPC .......... *H01L 23/66* (2013.01); *H01L 21/4825* (2013.01); *H01L 21/4853* (2013.01); *H01L 23/49537* (2013.01); *H01L 23/49575* (2013.01); *H01L 24/48* (2013.01); *H04B 1/10* (2013.01); *H01L 2223/6611* (2013.01); (Continued)

(58) Field of Classification Search
CPC ............... H01L 23/66; H01L 23/49537; H01L 23/49575; H01L 24/48; H01L 21/4853; H01L 21/4825; H01L 2223/6611; H01L 2223/6661; H01L 2223/6616; H01L 2224/48245; H01L 2224/48195; H01L 2224/48265; H01P 1/2013; H04B 1/10
See application file for complete search history.

(56) References Cited

U.S. PATENT DOCUMENTS

| | | | |
|---|---|---|---|
| 9,735,456 B2 * | 8/2017 | Kawai | H01L 25/0655 |
| 2007/0093229 A1 * | 4/2007 | Yamakawa | H01L 23/66 455/333 |
| 2013/0147580 A1 * | 6/2013 | Nagai | H01P 1/2013 333/204 |

FOREIGN PATENT DOCUMENTS

JP    2008-067012    3/2008

* cited by examiner

*Primary Examiner* — Thanh Le
(74) *Attorney, Agent, or Firm* — McDermott Will & Emery LLP

(57) ABSTRACT

A signal transmission device comprises: a first lead frame having a first major surface and a second major surface opposite to the first major surface; a second lead frame having a third major surface and a fourth major surface and isolated from the first lead frame, the fourth major surface located opposite to the third major surface; a transmission circuit that sends a transmission signal, the transmission circuit located on the first major surface of the first lead frame; a receiving circuit located on the third major surface of the second lead frame; and an electromagnetic resonance coupler located across between the second major surface of the first lead frame and the fourth major surface of the second lead frame to transmit the transmission signal, sent by the transmission circuit, to the receiving circuit in a contactless manner.

16 Claims, 34 Drawing Sheets

(51) Int. Cl.
   *H01L 23/495* (2006.01)
   *H01L 23/00* (2006.01)
   *H01L 21/48* (2006.01)
(52) U.S. Cl.
   CPC .............. *H01L 2223/6616* (2013.01); *H01L 2223/6661* (2013.01); *H01L 2224/48195* (2013.01); *H01L 2224/48245* (2013.01); *H01L 2224/48265* (2013.01)

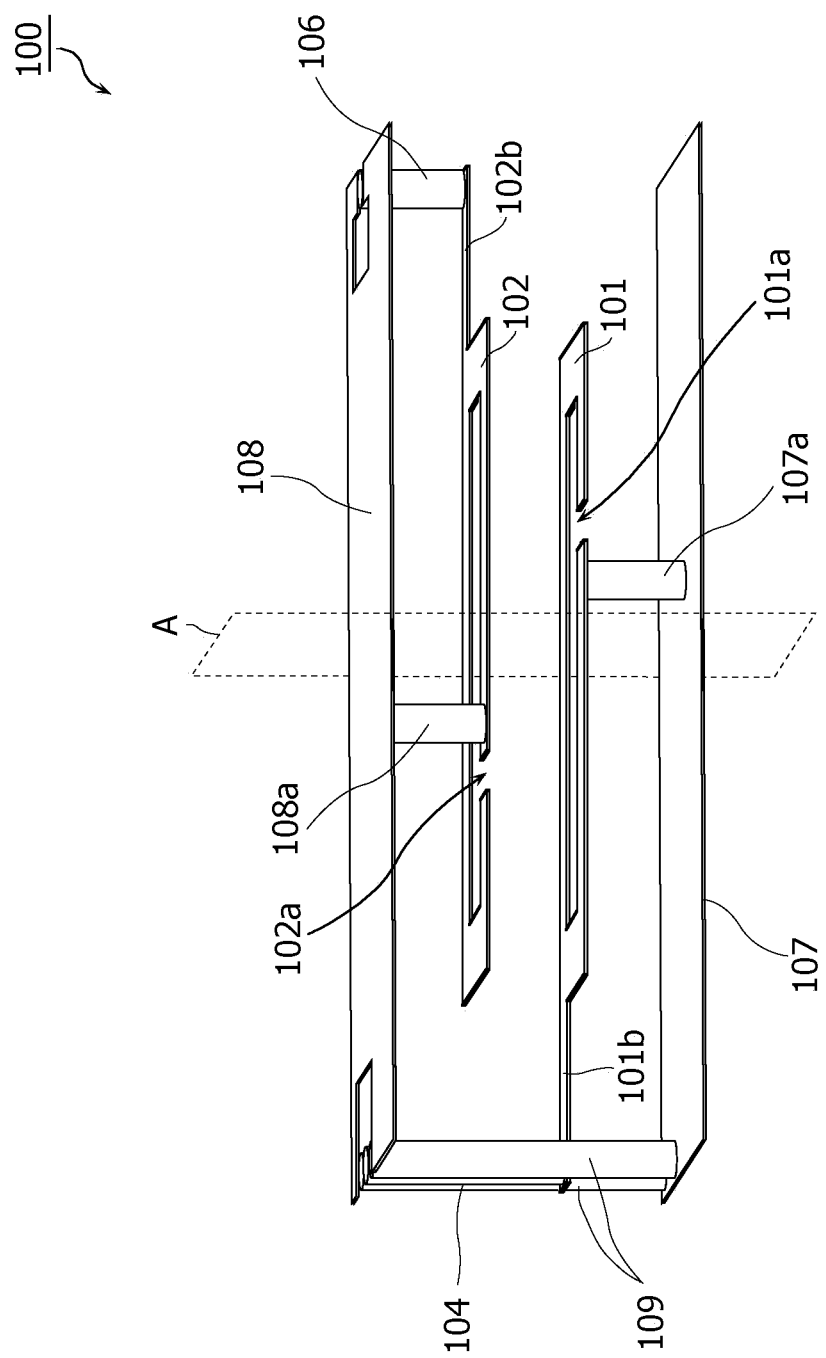

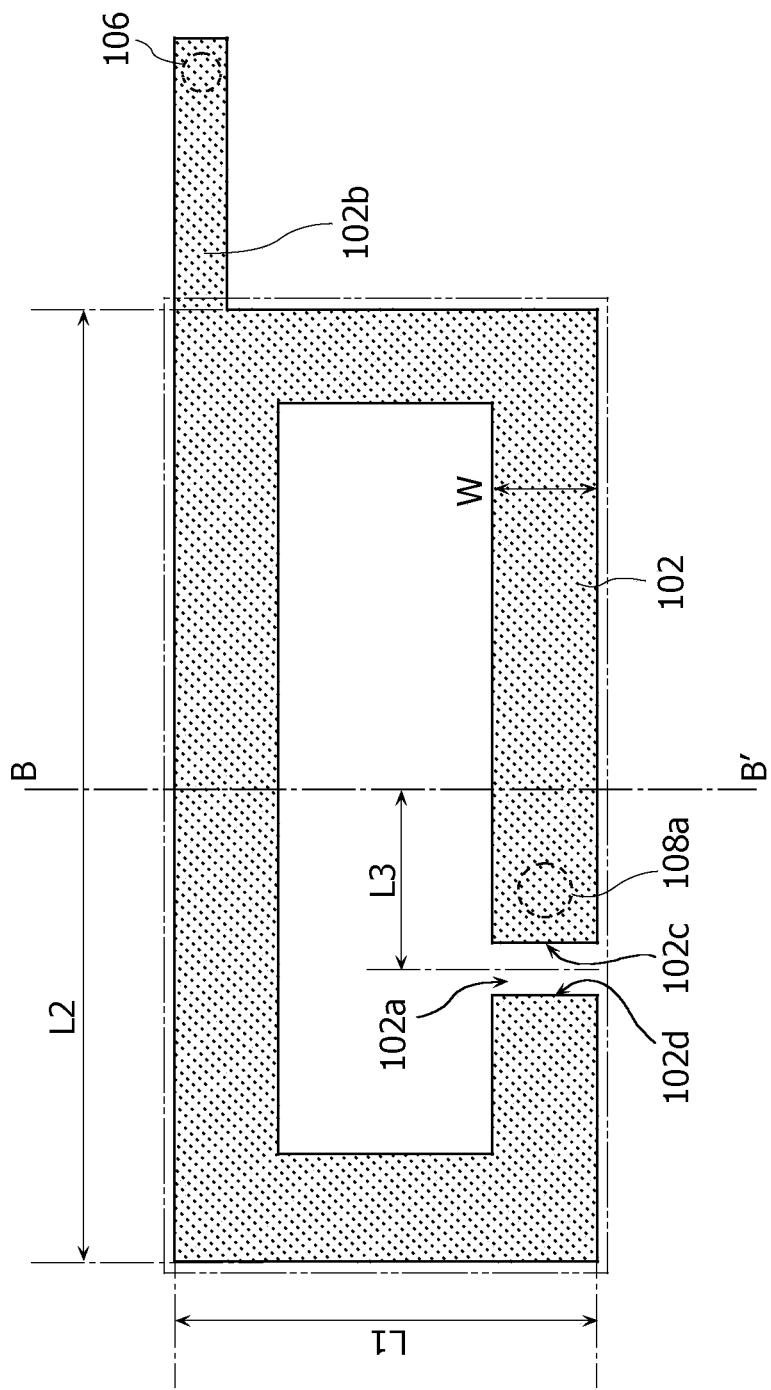

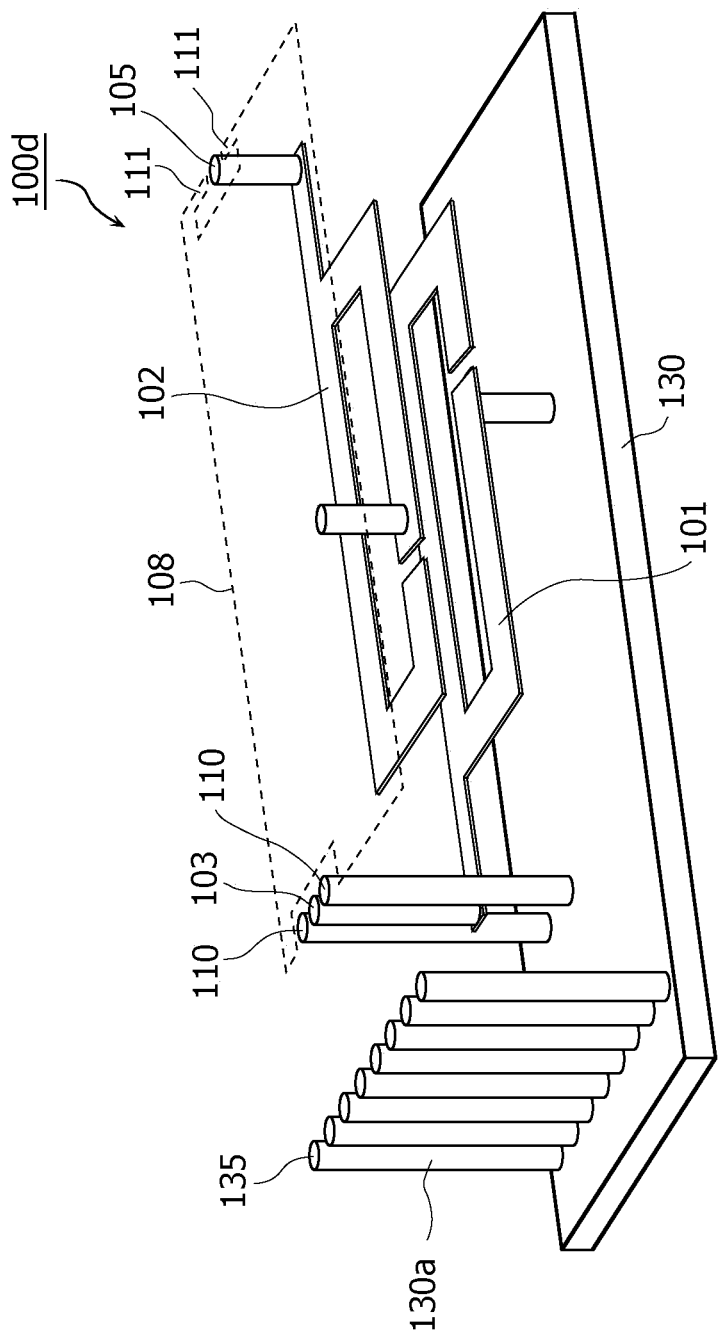

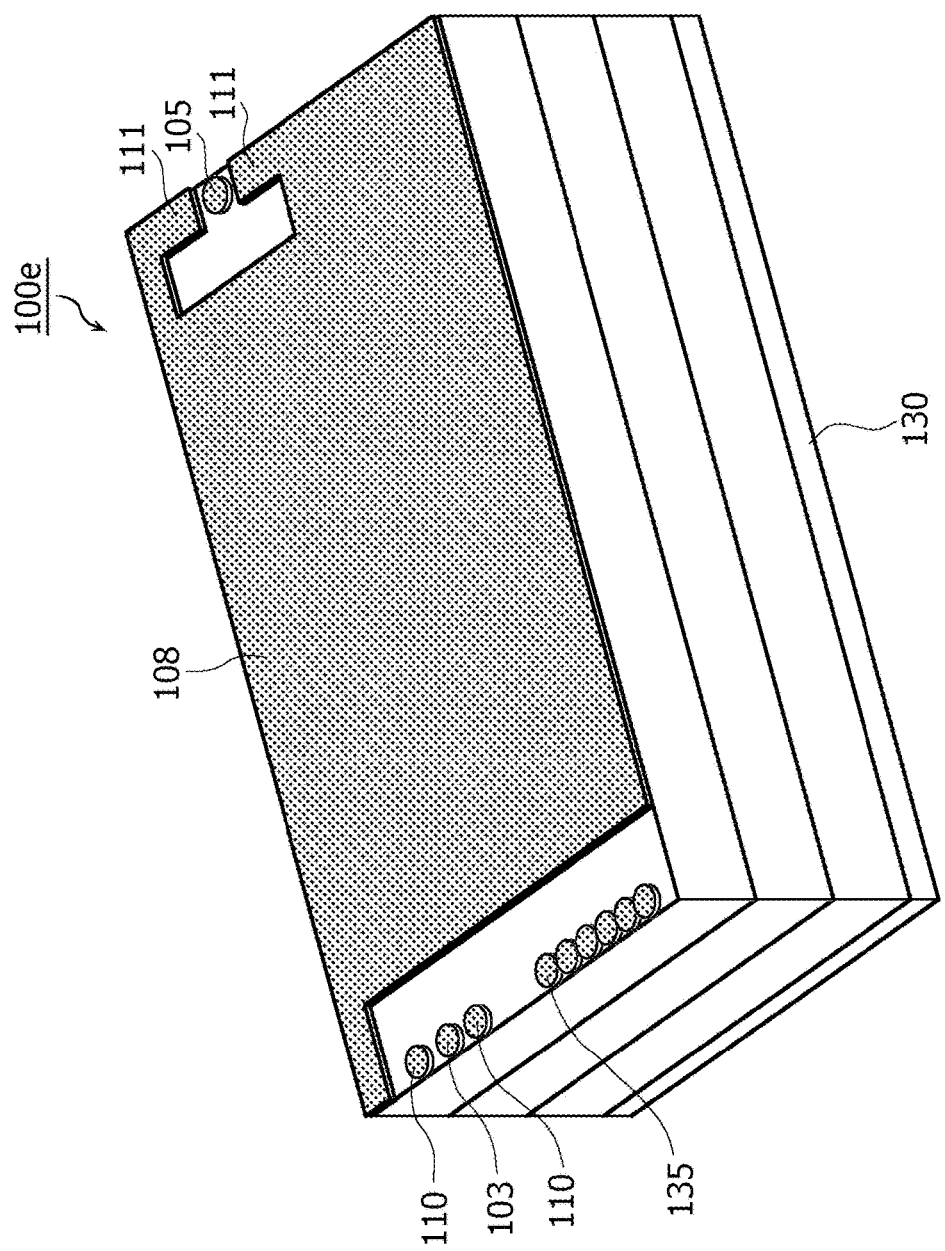

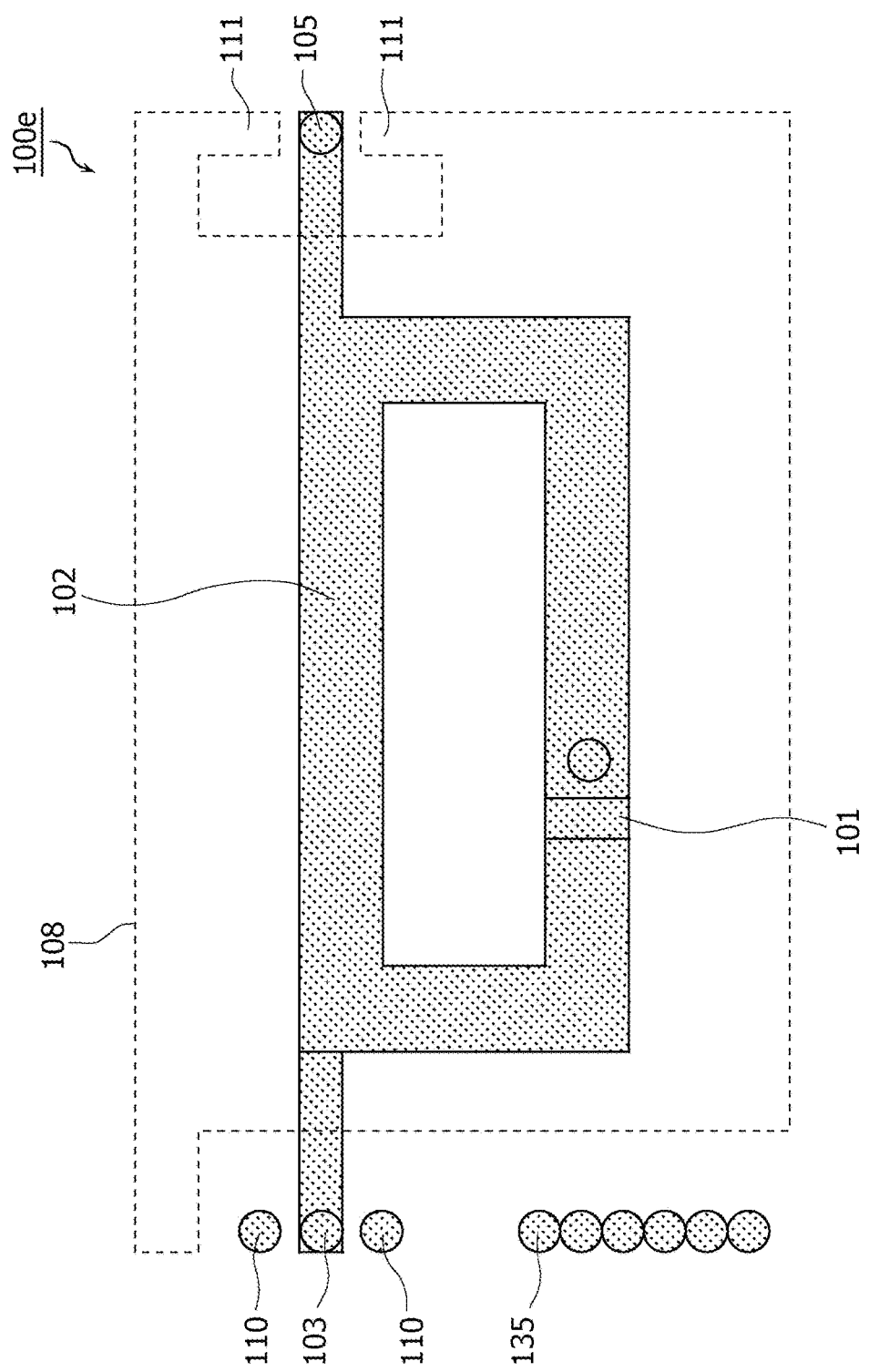

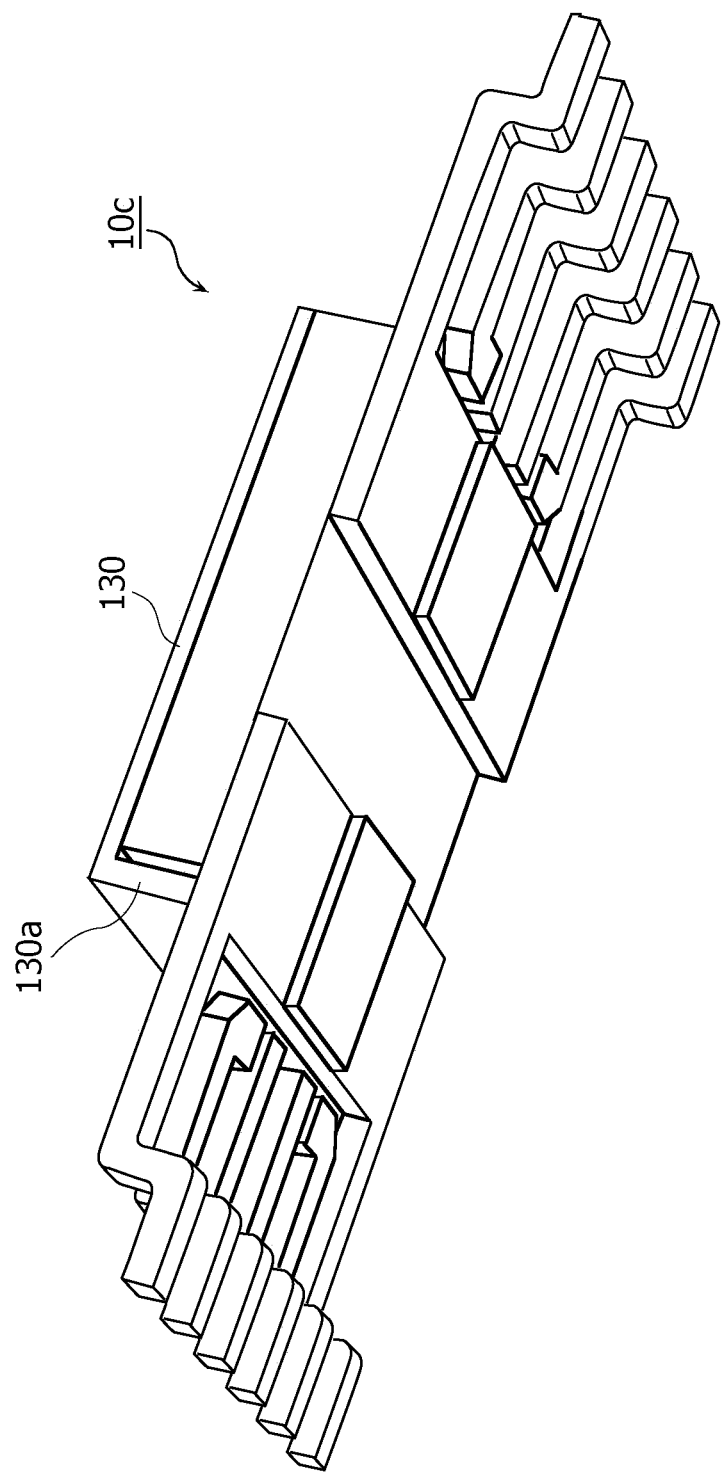

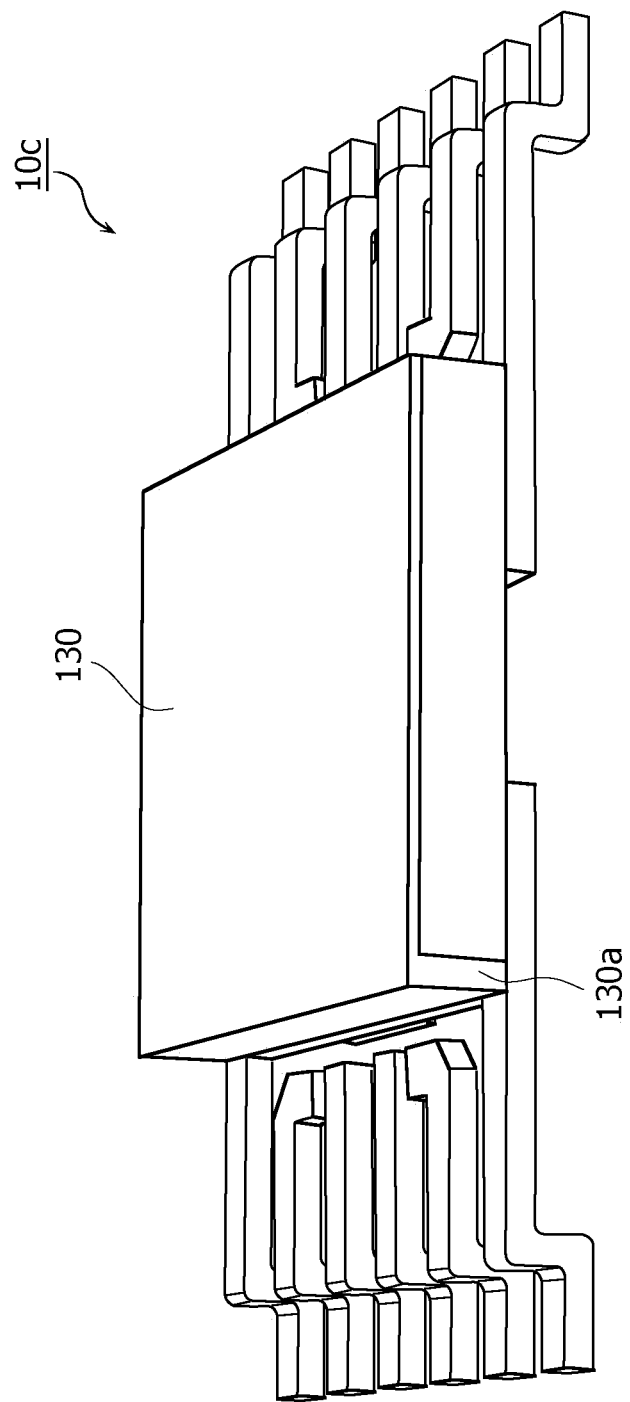

SIGNAL TRANSMISSION DEVICE USING ELECTROMAGNETIC RESONANCE COUPLER

BACKGROUND

1. Technical Field

The present disclosure relates to a signal transmission device using an electromagnetic resonance coupler.

2. Description of the Related Art

In various types of electronic equipment, there are demands for transmitting signals while ensuring electrical insulation between circuits. Japanese Patent No. 4835334 discloses an insulating element called an electromagnetic resonance coupler. In the insulating element, two resonators are coupled in electromagnetic resonance.

SUMMARY

One non-limiting and exemplary embodiment provides a signal transmission device that can be easily miniaturized.

In one general aspect, the techniques disclosed here feature a signal transmission device including: a first lead frame having a first major surface and a second major surface opposite to the first major surface; a second lead frame having a third major surface and a fourth major surface and isolated from the first lead frame, the fourth major surface located opposite to the third major surface; a transmission circuit that sends a transmission signal, the transmission circuit located on the first major surface of the first lead frame; a receiving circuit located on the third major surface of the second lead frame; and an electromagnetic resonance coupler located across between the second major surface of the first lead frame and the fourth major surface of the second lead frame to transmit the transmission signal, sent by the transmission circuit, to the receiving circuit in a contactless manner.

It should be noted that general or specific embodiments may be implemented as a system, a method, an integrated circuit, a computer program, a storage medium, or any selective combination thereof.

The present disclosure realizes a signal transmission device that can be easily miniaturized.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 2C is a second perspective view illustrating the wiring structure of the electromagnetic resonance coupler according to the first embodiment;

FIG. 3 is a plan view of a second resonator;

FIG. 17B is a second perspective view illustrating the wiring structure and the heat diffusion structure of the electromagnetic resonance coupler according to the sixth embodiment;

FIG. 18 is an external perspective view of an electromagnetic resonance coupler having heat transportation terminals aligned with an input terminal and sending-side ground terminals;

FIG. 19B is a top view illustrating the wiring structure and the heat diffusion structure of the electromagnetic resonance coupler having the heat transportation terminals aligned with the input terminal and the sending-side ground terminal;

FIG. 21A is an external perspective view of the signal transmission device during in the simulation;

FIG. 21B is an external perspective view of the signal transmission device in the simulation;

DETAILED DESCRIPTION

Knowledge Underlying Present Disclosure

Figure 1:
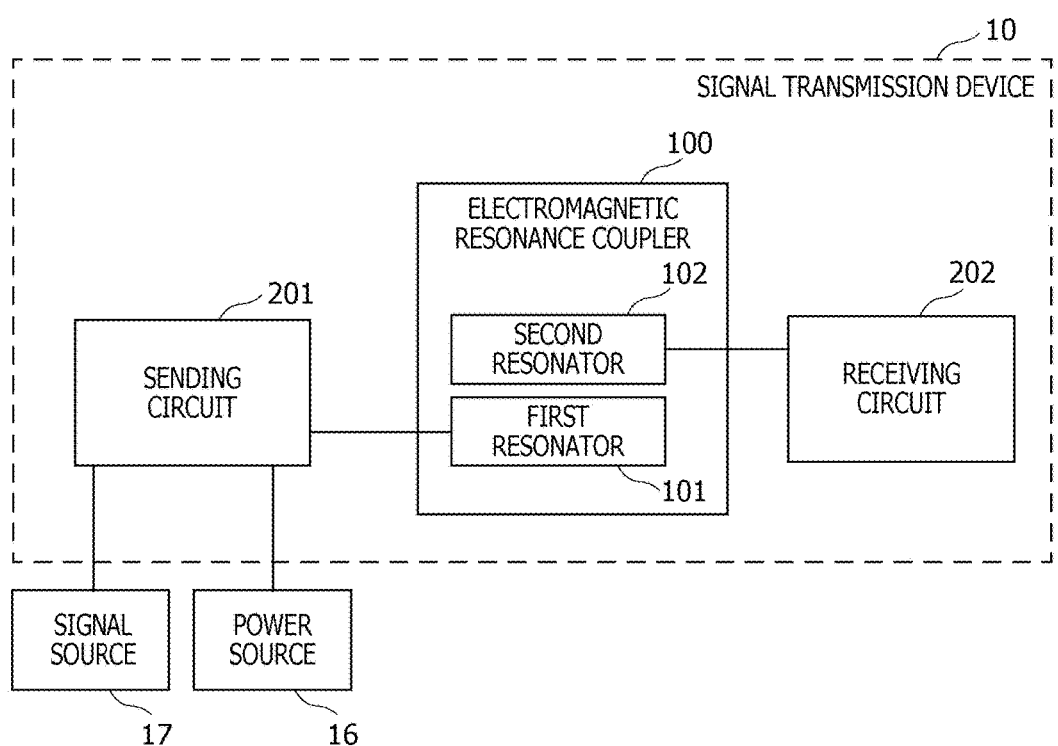
FIG. 1 is a block diagram illustrating the system configuration of a signal transmission device according to a first embodiment.

In various types of electronic equipment, there are demands for transmitting signals while ensuring electrical insulation between circuits.

For example, during operation of a high voltage circuit and a low voltage circuit, a ground loop between the high voltage circuit and the low voltage circuit is disconnected in order to prevent malfunction or failure of the low voltage circuit. With this scheme, application of an excessive voltage from the high voltage circuit to the low voltage circuit is suppressed when the high voltage circuit and the low voltage circuit are connected to each other.

Also, various problems arise with, for example, a motor drive circuit including a power switch and a control circuit. A motor drive circuit that drives a motor with a high voltage of a few hundred volts operates via switching of a control signal (i.e., a gate signal) with a low voltage of a few volts. Thus, noise is likely to be generated by a parasitic inductance and a parasitic capacitance of the motor drive circuit, and malfunction and a failure are likely to occur. In order to address the problem, it is important that a gate circuit and the power switch, which are used for the switching, be insulated from each other to thereby suppress influences of noise.

In general, a photocoupler is known as an element that can send and receive (which may hereinafter be expressed as "send/receive") a control signal in a state in which a sending side and a receiving side are isolated from each other. The photocoupler is an element into which a light-emitting element, a light-receiving element, and a control integrated circuit (IC) for controlling the light-emitting element and the light-receiving element control are incorporated. Through conversion between light and electrical signals, the photocoupler can send/receive a control signal in a state in which the sending side and the receiving side are isolated from each other. However, the photocoupler has problems that, for example, it is susceptible to heat, consumes a large amount of power, and deteriorates with time.

In order to overcome these problems, Japanese Patent No. 4835334 discloses a signal transmission device using an insulating element called an electromagnetic resonance coupler.

The electromagnetic resonance couplers send/receive (or transmit) signals by using high-frequency signals instead of light. The electromagnetic resonance coupler performs transmission of a high-frequency signal between circuits that are provided in respective different planes. In the electromagnetic resonance coupler, a resonator having a structure in which a closed curve line is partly opened and an input/output line connected to the resonator to input/output a high-frequency signal are formed on respective different planes. Each electromagnetic resonance coupler transmits high-frequency signals through electromagnetic resonance coupling between the resonators. Examples of the high-frequency signals include microwaves and millimeter waves. When the spacing between the resonators is appropriately adjusted, the electromagnetic resonance coupler can efficiently transmit high-frequency signals.

In this case, for example, a signal transmission device in which an electromagnetic resonance coupler, a transmission circuit that sends a signal to the electromagnetic resonance coupler, and a receiving circuit that receives a signal from the electromagnetic resonance coupler are aligned in the same plane has a problem in that it is difficult to miniaturize it.

Also, a signal transmission device in which a transmission circuit and a receiving circuit are located on an electromagnetic resonance coupler is also conceivable. Such a signal transmission device, however, has a poor heat-release characteristic of the electromagnetic resonance coupler, thus causing a problem in that heat generated in the transmission circuit and the receiving circuit cannot be released efficiently.

In many cases, the transmission circuits used to transmit high-frequency signals are analog circuits. The analog circuits have larger steady currents than typical digital circuits and thus generate a large amount of heat. Similarly, the receiving circuits also has a problem in heat generation, although it is not as severe as in the transmission circuit.

In general, the electromagnetic resonance couplers are formed of material, such as a synthetic resin, having a high heat resistance. Thus, a signal transmission device in which a transmission circuit and a receiving circuit are located on the electromagnetic resonance coupler cannot efficiently release heat generated in the transmission circuit and the receiving circuit. When heat cannot be efficiently released, a failure is more likely to occur in the circuit in the signal transmission device, and a package disorder (e.g., a crack or release) of the signal transmission device is more likely to occur.

Thus, there is room for considering the arrangement of the transmission circuit, the receiving circuit, and electromagnetic resonance coupler in the signal transmission device.

Accordingly, one aspect of the present disclosure provides a signal transmission device including: a first lead frame having a first major surface and a second major opposite to the first major surface; a second lead frame having a third major surface and a fourth major surface and isolated from the first lead frame, the fourth major surface located opposite to the third major surface; a transmission circuit located on the first major surface of the first lead frame to send a transmission signal; a receiving circuit located on the third major surface of the second lead frame; and an electromagnetic resonance coupler located across between the second major surface of the first lead frame and the fourth major surface of the second lead frame to transmit the transmission signal, sent by the transmission circuit, to the receiving circuit in a contactless manner.

With this arrangement, since the transmission circuit and the receiving circuit are located in a plane that is different from a plane in which the electromagnetic resonance coupler is located, the signal transmission device can be easily miniaturized. The electromagnetic resonance coupler may be fixed to the second major surface of the first lead frame and the fourth major surface of the second lead frame.

An end portion of the first lead frame may be bent toward the first major surface, and an end portion of the second lead frame may be bent toward the third major surface.

That is, the transmission circuit and the receiving circuit may be located below the lead frame portion (i.e., the first and second lead frames). For example, when the signal transmission device is located on a substrate, end portions of the lead frame portion are bent in order to obtain a region in which the transmission circuit and the receiving circuit are located between the substrate and the lead frame portion. Since each of the transmission circuit and the receiving circuit has a smaller thickness than that of the electromagnetic resonance coupler, it is possible to reduce the lengths of the bent end portions. Thus, the heat resistance of the lead frame portion decreases. This enhances the heat-release characteristic of the signal transmission device. Also, when the signal transmission device is mounted on a circuit board, the distance between the sending and receiving circuits and the circuit board decreases, thus enhancing a heat-release characteristic of the signal transmission device.

An end portion of the first lead frame may be bent toward the second major surface, and an end portion of the second lead frame may be bent toward the fourth major surface.

That is, the electromagnetic resonance coupler may be located below the lead frame portion. Such a structure in which the electromagnetic resonance coupler is located below the lead frame portion can also miniaturize the signal transmission device.

The electromagnetic resonance coupler may include: a first terminal electrically connected to the transmission circuit, and a second terminal electrically connected to the receiving circuit. When the electromagnetic resonance coupler is viewed from the first major surface, the first terminal and the second terminal may be located between the first lead frame and the second lead frame.

This arrangement can reduce the length of a metal wire that provides connection between the sending and receiving circuits and the electromagnetic resonance coupler. That is, this arrangement can facilitate wire bonding.

The signal transmission device may further include: a sealant that seals the transmission circuit, the receiving circuit, and the electromagnetic resonance coupler; and a heatsink that is provided on the second major surface of the first lead frame and is partly exposed from the sealant. When viewed from a direction orthogonal to the first major surface, the heatsink and the transmission circuit may at least partly overlap each other.

This can enhance the heat-release characteristic of the signal transmission device.

Also, a gap may be provided between the electromagnetic resonance coupler and the heatsink, and the first lead frame may have an opening that communicates with the gap between the electromagnetic resonance coupler and the heatsink.

With this arrangement, since the opening serves as an air vent hole, the gap between the electromagnetic resonance coupler and the heatsink can be sufficiently filled with the sealant.

The electromagnetic resonance coupler may include a first resonator that is electrically connected to the transmission circuit, and a second resonator that faces the first resonator and is electrically connected to the receiving circuit. The transmission circuit may send a signal, obtained by modulating a high-frequency signal with an input signal, to the first resonator as the transmission signal. The first resonator may transmit the transmission signal, sent by the transmission circuit, to the second resonator in a contactless manner. The second resonator may send the transmission signal, transmitted by the first resonator in a contactless manner, to the receiving circuit. The receiving circuit may receive the transmission signal sent by the second resonator and may demodulate the received transmission signal to generate an output signal corresponding to the input signal.

In such a manner, the signal transmission device can transmit the transmission signal in a contactless manner.

Each of a wiring-line length of the first resonator and a wiring-line length of the second resonator may be one-fourth of a wavelength of the high-frequency signal.

Thus, since the electromagnetic resonance coupler is miniaturized, the signal transmission device can be easily miniaturized. The "wiring-line length of the resonator" refers to the length of a wiring line of the resonator from one end of the opening portion in the resonator to the other end thereof.

The electromagnetic resonance coupler may further include a heat diffusion layer thermally connected to the first lead frame.

Such a heat diffusion layer can diffuse heat generated in the transmission circuit and transmitted via the first lead frame. That is, the heat diffusion layer can enhance the heat-release characteristic of the signal transmission device.

The electromagnetic resonance coupler may further include: a first terminal that provides electrical connection between the electromagnetic resonance coupler and the transmission circuit; and a second terminal that provides thermal connection between the heat diffusion layer and the first lead frame, that is directly connected to the first lead frame, and that is different from the first terminal.

With this arrangement, the heat diffusion layer is thermally connected to the first lead frame through the heat transportation terminal dedicated to heat release.

The heat diffusion layer may be a ground shield for the electromagnetic resonance coupler.

With this arrangement, the electromagnetic resonance coupler can also use the heat diffusion layer as a ground shield.

The heat diffusion layer may include a first ground shield for the electromagnetic resonance coupler, the first ground shield having the same potential as that of ground for the transmission circuit. The electromagnetic resonance coupler may further include: a first metal layer that includes a first resonator electrically connected to the transmission circuit; a second metal layer that includes a second resonator electrically connected to the receiving circuit; and a second ground shield that has the same potential as that of ground for the receiving circuit. A thickness of the heat diffusion layer may be larger than any of a thickness of the first metal layer, a thickness of the second metal layer, and a thickness of the second ground shield.

With this arrangement, the heat diffusion characteristic of the heat diffusion layer can be improved over other metal layers included in the electromagnetic resonance coupler.

The first major surface of the first lead frame and the third major surface of the second lead frame may be directed in the same direction. The electromagnetic resonance coupler may have a fifth major surface, and the second major surface of the first lead frame and the fourth major surface of the second lead frame may be located on the fifth major surface. The first major surface of the first lead frame and the third major surface of the second lead frame may be located in the same plane.

One aspect of the present disclosure also provides a manufacturing method for a signal transmission device including: a first lead frame having a first major surface and a second major opposite to the first major surface; a second lead frame having a third major surface and a fourth major surface and isolated from the first lead frame, the fourth major surface located opposite to the third major surface; a transmission circuit that sends a transmission signal; a receiving circuit; and an electromagnetic resonance coupler that transmits the transmission signal, sent by the transmission circuit, to the receiving circuit in a contactless manner. The manufacturing method includes: arranging the electromagnetic resonance coupler across the second major surface of the first lead frame and the fourth major surface of the second lead frame; arranging, after the arranging of the electromagnetic resonance coupler, the transmission circuit on the first major surface of the first lead frame; and arranging, after the arranging of the electromagnetic resonance coupler, the receiving circuit on the third major surface of the second lead frame.

With this arrangement, since the positional relationship between the first lead frame and the second lead frame is fixed earlier, it is possible to suppress deterioration of a manufacturing yield which is caused by positional displacement between the first lead frame and the second lead frame.

Embodiments will be described in detail with reference to the accompanying drawings. The embodiments described below each represent a general or specific example. Numerical values, shapes, materials, constituent elements, the arrangement and connection of constituent elements, steps, the order of steps, and so on described in the embodiments below are examples and are not intended to limit the present disclosure. Of the constituent elements in the embodiments described below, constituent elements not set forth in the independent claims that represent the broadest concept will be described as optional constituent elements.

Each accompanying figure is a schematic diagram and is not necessarily strictly depicted. In each figure, substantially the same elements are denoted by the same reference numerals, and a redundant description may be omitted or is briefly given herein.

In the embodiments described below, the term "stacking direction" refers to a direction that is orthogonal to a circuit board when a signal transmission device is mounted on the circuit board. The expressions "thickness", "height", and so on mean lengths in the stacking direction, unless otherwise particularly specified.

In the embodiments described below, an end portion of a signal transmission device means an end portion in a longitudinal direction when the signal transmission device is viewed from the stacking direction. The same also applies to an end portion of an electromagnetic resonance coupler.

First Embodiment

[System Configuration]

First, a description will be given of the system configuration of a signal transmission device according to a first embodiment. FIG. 1 is a block diagram illustrating the system configuration of the signal transmission device according to the first embodiment.

A signal transmission device 10 according to the first embodiment includes an electromagnetic resonance coupler 100, a transmission circuit 201, and a receiving circuit 202.

The transmission circuit 201 obtains power supplied from a power source 16 and an input signal supplied from a signal source 17. The transmission circuit 201 includes a modulation circuit, which modulates a high-frequency signal in accordance with the input signal and sends the modulated signal to the electromagnetic resonance coupler 100. That is, the transmission circuit 201 sends a signal (i.e., a modulated high-frequency signal), obtained by modulating a high-frequency signal in accordance with the input signal, to a first resonator 101 as a transmission signal. In other words, the high-frequency signal in this case has a higher frequency than the input signal.

The transmission circuit 201 is implemented by, for example, a semiconductor chip. The transmission circuit 201 may include a high-frequency signal generating circuit that generates a high-frequency signal or may externally obtain a high-frequency signal.

The frequency band of the high-frequency signal in the first embodiment is, for example, a microwave band (including a millimeter wave band). The frequency of the high-frequency signal is, specifically, in the range of 2.4 GHz to 5.8 GHz and is not particularly limited. The electromagnetic resonance coupler 100 employs signals with a considerably high frequency, compared with a magnetic coupling element using a transformer element.

The electromagnetic resonance coupler 100 has the first resonator 101 and a second resonator 102. By utilizing a resonant phenomenon that occurs based on LC resonance between the first resonator 101 and the second resonator 102, the electromagnetic resonance coupler 100 can send/receive power and signals while ensuring insulation between a sending side and a receiving side.

The second resonator 102 receives the transmission signal, sent from the transmission circuit 201, via the first resonator 101. Specifically, the first resonator 101 transmits the transmission signal, sent by the transmission circuit 201, to the second resonator 102 in a contactless manner. The second resonator 102 sends the transmission signal, transmitted by the first resonator 101 in a contactless manner, to the receiving circuit 202.

The receiving circuit 202 includes a rectifier circuit, which rectifies (i.e., demodulates) the transmission signal received by the second resonator 102. That is, the receiving circuit 202 receives the transmission signal sent by the second resonator 102 and demodulates the received transmission signal to thereby generate an output signal corresponding to the input signal. The receiving circuit 202 is implemented by, for example, a semiconductor chip.

[Configuration of Electromagnetic Resonance Coupler]

Figure 2A:
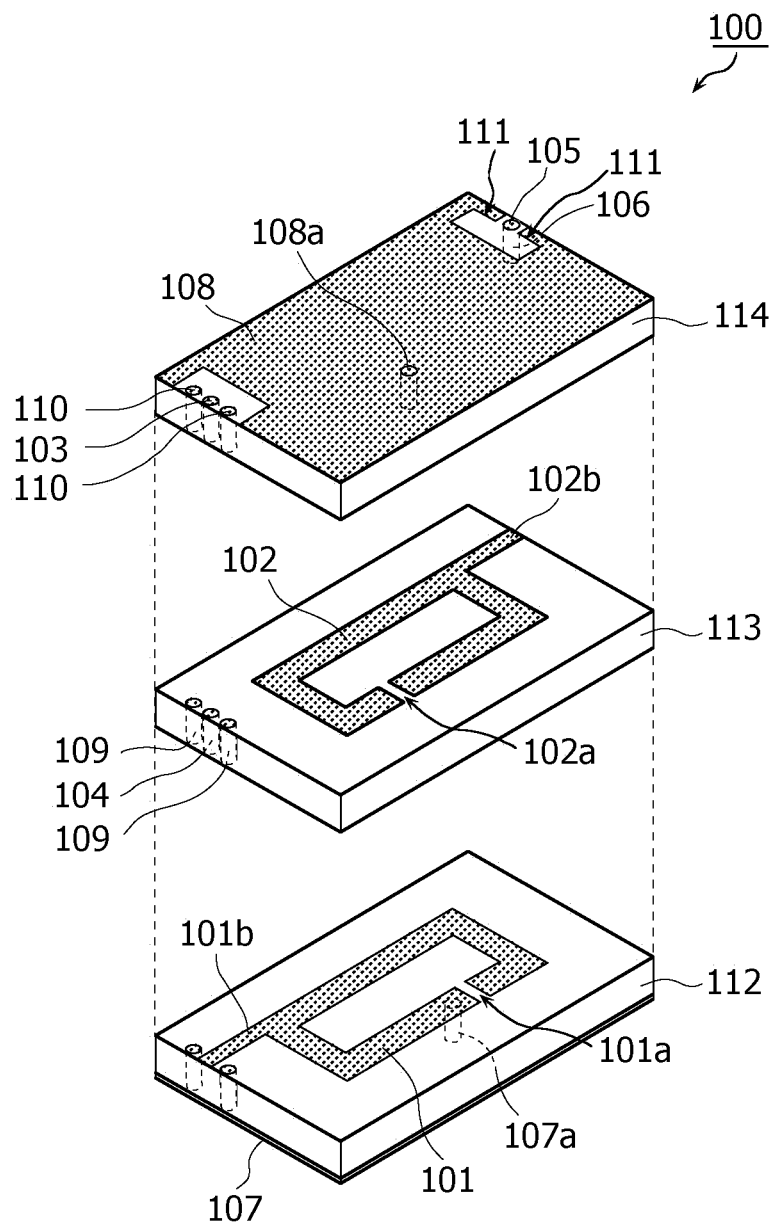
FIG. 2A is an exploded perspective view of an electromagnetic resonance coupler according to a first embodiment.
Figure 2B:
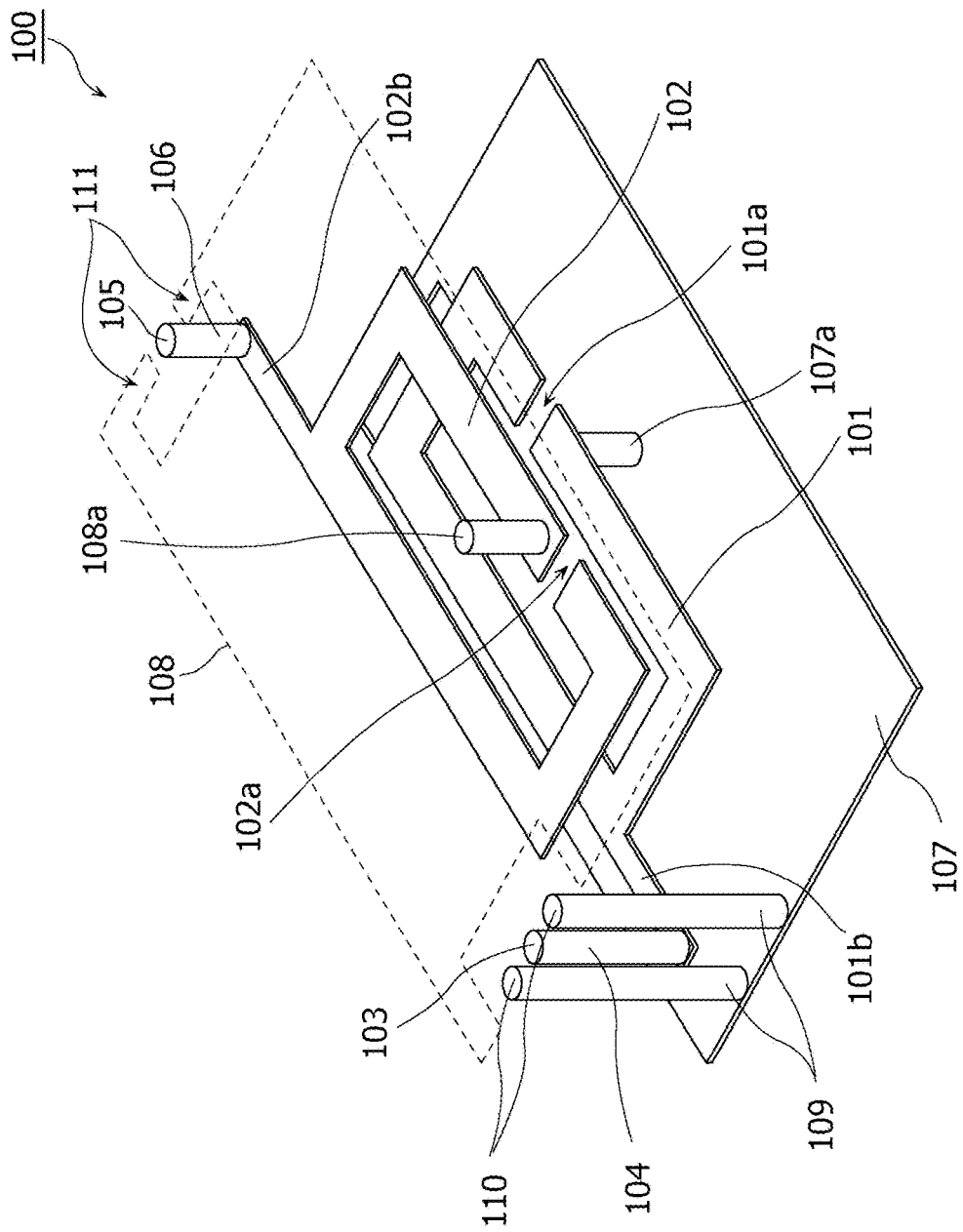
FIG. 2B is a first perspective view illustrating the wiring structure of the electromagnetic resonance coupler according to the first embodiment.

Next, a description will be given of the configuration of the electromagnetic resonance coupler 100. FIG. 2A is an exploded perspective view of the electromagnetic resonance coupler 100. FIGS. 2B and 2C are perspective views illustrating the wiring structure of the electromagnetic resonance coupler 100.

As illustrated in FIG. 2A, the electromagnetic resonance coupler 100 has a stacked structure in which three dielectric layers (i.e., a substrate) constituted by dielectric layers 112, 113, and 114 are stacked.

The first resonator 101 and a linear first wiring line 101b electrically connected to the first resonator 101 are provided on an upper surface of the dielectric layer 112. A first ground shield 107 is provided on substantially the entire lower surface of the dielectric layer 112.

The dielectric layer 113 is located, with a lower surface of the dielectric layer 113 overlaying the upper surface of the dielectric layer 112. Although, in FIG. 2A, the second resonator 102 and a linear second wiring line 102b, which is electrically connected to the second resonator 102, are provided on an upper surface of the dielectric layer 113, the second resonator 102 and the second wiring line 102b are, in practice, provided on a lower surface of the dielectric layer 114.

The dielectric layer 114 is located, with a lower surface of the dielectric layer 114 overlaying the upper surface of the dielectric layer 113. An input terminal 103, an output terminal 105, a second ground shield 108 (denoted by a dashed line in FIG. 2B), and two sending-side ground terminals 110 are provided on an upper surface of the dielectric layer 114. The second ground shield 108 includes two receiving-side ground terminals 111.

The input terminal 103 is located between the two sending-side ground terminals 110. Each of the input terminal 103 and the two sending-side ground terminals 110 is one example of a first terminal. The input terminal 103 and the two sending-side ground terminals 110 constitute a ground-signal-ground (G-S-G) pad. The input terminal 103 and the two sending-side ground terminals 110 are used to electrically connect the transmission circuit 201 to the first resonator 101.

The output terminal 105 is located between the two receiving-side ground terminals 111. Each of the output terminal 105 and the two receiving-side ground terminals 111 is one example of a second terminal. The output terminal 105 and the two receiving-side ground terminals 111 constitute a ground-signal-ground (G-S-G) pad. The output terminal 105 and the two receiving-side ground terminals 111 are used to electrically connect the receiving circuit 202 to the second resonator 102.

Thus, the first resonator 101, the second resonator 102, the first ground shield 107, and the second ground shield 108 are located in planes that are different from each other.

The electromagnetic resonance coupler 100 also has vias that penetrate at least one of the dielectric layers 112, 113, and 114. The vias included in the electromagnetic resonance coupler 100 will be described below with reference to FIGS. 2A to 2C.

A first via 104 has a conductive via structure that penetrates the dielectric layers 113 and 114 at a first end portion of the electromagnetic resonance coupler 100. The first via 104 provides electrical connection between the first wiring line 101b and the input terminal 103. The first via 104 is located between two third vias 109.

A second via 106 has a conductive via structure that penetrates the dielectric layer 114 at a second end portion of the electromagnetic resonance coupler 100. The second via 106 provides electrical connection between the second wiring line 102b and the output terminal 105.

The third vias 109 each have a conductive via structure that penetrates the dielectric layers 112, 113, and 114 at the first end portion of the electromagnetic resonance coupler 100. The third vias 109 provide electrical connection between the first ground shield 107 and the sending-side ground terminals 110. The electromagnetic resonance coupler 100 has two third vias 109. The first via 104 is located between the two third vias 109.

A fourth via 107a has a conductive via structure that penetrates the dielectric layer 112. The fourth via 107a provides electrical connection between an end portion of the first resonator 101 and the first ground shield 107.

A fifth via 108a has a conductive via structure that penetrates the dielectric layer 114. The fifth via 108a provides electrical connection between an end portion of the second resonator 102 and the second ground shield 108.

Next, the first resonator 101 and the second resonator 102 will be described with reference to FIG. 3 in addition to FIGS. 2A to 2C. FIG. 3 is a plan view of the second resonator 102. Since the first resonator 101 and the second resonator 102 are symmetrical in shape, the plan view of the first resonator 101 is omitted.

The first resonator 101 is an annular transmission line (i.e., a wiring line) having a portion that is partly opened by an opening portion 101a. Similarly, the second resonator 102 is an annular transmission line (i.e., a wiring line) that is partly opened by an opening portion 102a.

That is, the first resonator 101 has a closed shape, except for the opening portion 101a. The second resonator 102 has a closed shape, except for the opening portion 102a. Although the outer shape of each of the first resonator 101 and the second resonator 102 has a rectangular loop shape, the outer shape may have a circular loop shape or an elliptical loop shape. Each of the first resonator 101 and the second resonator 102 may have a race-track shape, or the outer shape thereof may have a polygonal loop shape. Also, the loop shape in the first embodiment partly includes a meandering loop shape.

The dielectric layer 113 is located between the first resonator 101 and the second resonator 102. That is, the first resonator 101 and the second resonator 102 are located a certain distance apart from each other and are electrically insulated from each other. The first resonator 101 and the second resonator 102 face each other in a thickness direction, with the dielectric layer 113 being interposed therebetween.

In this case, in plan view (i.e., when viewed from a stacking direction), the outer shape of the first resonator 101 and the outer shape of the second resonator 102 generally match each other. The "outer shape" as used herein refers to the peripheral outer shape of the second resonator 102, as indicated by a long dashed double-short dashed line in FIG. 3. The same applies to the outer shape of the first resonator 101.

Also, the expression "generally matching each other" means substantially matching each other to a degree that the electromagnetic resonance coupler 100 or the signal transmission device 10 is operable. The expression "generally matching each other" means, for example, substantial matching including assembly variations and resonator-structure size variations that occur in a manufacturing process. Also, the expression "outer shapes generally matching each other" includes, for example, a case in which the wiring-line of the first resonator 101 and the wiring-line width of the second resonator 102 (i.e., the length indicated by W in FIG. 3) differ from each other to cause outer shape displacement.

That is, in the first embodiment, the "outer shapes generally matching each other" does not necessarily mean "completely matching each other", and even when the positions of the outer shapes of the resonators are displaced to some degree, the electromagnetic resonance coupler 100 is operable.

As illustrated in FIG. 2C, in plan view, the first resonator 101 and the second resonator 102 are line symmetric with respect to plane A. Plane A bisects the electromagnetic resonance coupler 100.

For example, the position of the opening portion 101a of the first resonator 101 and the position of the opening portion 102a of the second resonator 102 are set at positions that are symmetric with respect to plane A. In the electromagnetic resonance coupler 100, it is important that the position of the opening portion 101a and the position of the opening portion 102a be substantially symmetric with respect to plane A in order to improve the resonance characteristics. Other constituent elements do not necessarily have to be located symmetrical with respect to plane A. For example, the position of the first wiring line 101b (or the input terminal 103) and the position of the second wiring line 102b (or the output terminal 105) do not necessarily have to be symmetric with respect to each other.

The first resonator 101, the second resonator 102, the first wiring line 101b, the second wiring line 102b, the first ground shield 107, and the second ground shield 108, which are described above, are formed of, for example, copper (e.g., copper films) and also may be formed of other metal, such as gold. In addition, the input terminal 103, the output terminal 105, the sending-side ground terminals 110, the first via 104, the second via 106, the third vias 109, the fourth via 107a, and the fifth via 108a are formed of, for example, copper and may also be formed of other metal, such as gold.

[Details of Configuration of Electromagnetic Resonance Coupler]

Next, a description will be given of details of the configuration of the electromagnetic resonance coupler 100. The first resonator 101 has the feature that one end portion that constitutes the opening portion 101a is connected to ground. Specifically, one end portion of the first resonator 101 is electrically connected to the first ground shield 107 through the fourth via 107a.

Similarly, in the second resonator 102, one end portion that constitutes the opening portion 102a is connected to ground. Specifically, one end portion of the second resonator 102 is electrically connected to the second ground shield 108 through the fifth via 108a.

Figure 4A:
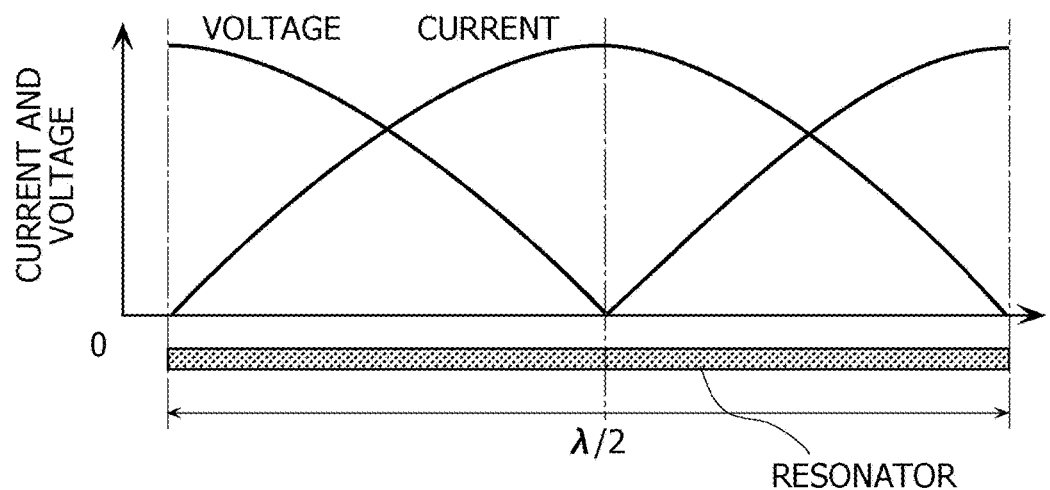
FIG. 4A is a graph schematically, when a signal is input to a resonator in which the wiring-line length is one-half of the wavelength of a signal to be transmitted, a position on the resonator versus a voltage and a current at the position.
Figure 4B:
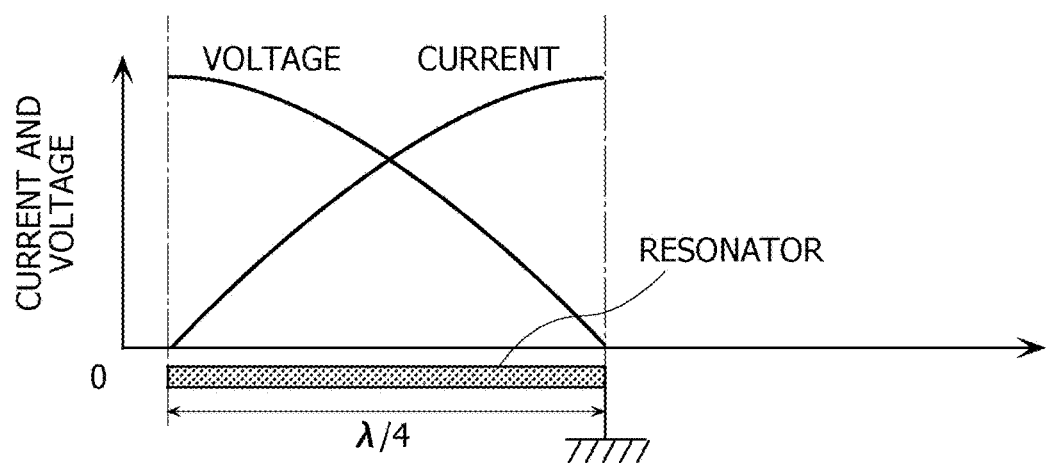
FIG. 4B is a graph schematically illustrating, when a signal is input to each resonator included in the electromagnetic resonance coupler according to the first embodiment, a position on the resonator and a voltage and a current at the position.

A description will be given of advantages that are obtained by the structure in which one end portion of each resonator is connected to ground in the manner described above. FIGS. 4A and 4B are graphs schematically illustrating, when a signal is input to each resonator, the position of the resonator versus a voltage and a current at the position. FIGS. 4A and 4B are schematically depicted assuming that the annular resonator has a straight-line shape.

Specifically, FIG. 4A is a graph schematically illustrating, when a signal is input to a resonator in which the wiring-line length is one-half of the wavelength of a signal to be transmitted, a position on the resonator versus a voltage and a current at the position. With the wiring-line length being set in such a manner, each resonator causes signal resonance. As illustrated in FIG. 3, the wiring-line length of the second resonator 102 refers to the length of the center line of the wiring line of the second resonator 102 from one end 102c that constitutes the opening portion 102a to another end 102d that constitutes the opening portion 102a. That is, the wiring-line length of the second resonator 102 is given by 2×L1+2×L2−"distance of opening portion 102a"−4×W.

In this case, a voltage at the center position of the resonator illustrated in FIG. 4A is 0, and current and voltage changes corresponding to respective positions are symmetric with respect to the center position. Accordingly, by paying attention to this point, the prevent inventors have conceived a configuration in which one end portion of the resonator is connected to ground, as illustrated in FIG. 4B. This makes it possible to reduce the wiring-line length of the resonator to one-fourth of the wavelength of a signal to be transmitted.

That is, although the wiring-line length of each resonator in the electromagnetic resonance coupler 100 is reduced to one-half of the wiring-line length of the resonator in FIG. 4A, it is possible to cause resonance that is equivalent to that in the resonator in FIG. 4A. That is, the electromagnetic resonance coupler 100 is more miniaturized than the electromagnetic resonance coupler having the resonator in FIG. 4A and having the same operating frequency (i.e., the frequency of a signal to be transmitted). In other words, as long as the wiring-line length of the resonator is the same, the electromagnetic resonance coupler 100 can considerably reduce the operating frequency, compared with the case in FIG. 4A.

The miniaturization of the electromagnetic resonance coupler 100, which has a larger size than the transmission circuit 201 and the receiving circuit 202, contributes significantly to miniaturization of the signal transmission device 10. The signal transmission device 10 may employ an electromagnetic resonance coupler having resonators in which the wiring-line length is one-half of the operating wavelength (i.e., one-half of the wavelength of a signal to be transmitted). However, when the electromagnetic resonance coupler 100 having the resonators in which the wiring-line length is one-fourth of the operating wavelength is used in the signal transmission device 10, further miniaturization is realized.

Other wiring structures of the electromagnetic resonance coupler 100 are appropriately defined according to a design rule or the like.

For example, as illustrated in FIG. 3, a straight line that equally bisects a longitudinal width L2 of the outer shape of the second resonator 102 is represented by B-B', and the longitudinal length from the center of the opening portion 102a to the straight line B-B' is defined by a length L3. In this case, it is desirable that the length L3 be smaller than or equal to four times of the length of a wiring-line width W of the second resonator 102.

Also, it is desirable that the outer shape of the second resonator 102 be a rectangular shape having transverse and longitudinal directions, rather than a shape, such as a square.

Thus, in the second resonator 102, it is desirable that the width L2 be larger than the width L1.

The wiring-line width W of the second resonator 102 does not necessarily have to be constant. The second resonator 102 may have a meandering shape, or the wiring-line width W may partly differ in the second resonator 102.

The position at which the second wiring line 102b is connected to the second resonator 102 is not limited to the position illustrated in FIG. 3, and the second wiring line 102b may be connected to an arbitrary position.

Since a high-frequency signal is sent/received in the electromagnetic resonance coupler 100, it is required that influences that high-frequency noise that leaks from the electromagnetic resonance coupler 100 has on other elements be reduced as much as possible.

The electromagnetic resonance coupler 100 has the first ground shield 107 and the second ground shield 108 as measures against leakage of the high-frequency noise. The first ground shield 107 and the second ground shield 108 are located so as to sandwich the dielectric layer 112, the first resonator 101, the dielectric layer 113, the second resonator 102, and the dielectric layer 114 in the stacking direction. The first ground shield 107 and the second ground shield 108 reduce leakage of high-frequency noise.

[Manufacturing Method for Electromagnetic Resonance Coupler]

Next, a description will be given of a manufacturing method for the electromagnetic resonance coupler 100. The electromagnetic resonance coupler 100 can be manufactured at low cost by using a manufacturing technique for the so-called printed circuit boards (i.e., dielectric substrates).

For example, the first ground shield 107 is obtained by patterning a metal film formed on the lower surface of the dielectric layer 112 (i.e., a dielectric substrate) into an arbitrary shape through etching. The first resonator 101 and the first wiring line 101b are obtained by patterning a metal film formed on the upper surface of the dielectric layer 112 into an arbitrary shape through etching.

The second resonator 102 and the second wiring line 102b are obtained by patterning a metal film formed on the lower surface of the dielectric layer 114 (i.e., a dielectric substrate) into an arbitrary shape through etching. The second resonator 102 may be obtained by patterning a metal film formed on the upper surface of the dielectric layer 113 (the dielectric substrate) into an arbitrary shape through etching.

The input terminal 103, the output terminal 105, the sending-side ground terminals 110, and the second ground shield 108 are obtained by patterning a metal film formed on the upper surface of the dielectric layer 114 into an arbitrary shape through etching.

The metal film is, for example, a copper film having a thickness of 0.5 oz (18 µm). Each of the dielectric layers 112, 113, and 114 is formed using a polyphenylene ether resin (PPE resin) filled with a high-dielectric-constant inorganic filler and has a thickness of 300 µm. The PPE resin has a relative permittivity of 10 and has an insulation electrical field breakdown strength of 20 kV/mm.

The dielectric layer 112 and the dielectric layer 114 in which the wiring pattern is formed as described above are bonded together by pressing, with the dielectric layer 113 being interposed therebetween. This provides a bonded substrate having a thickness that is slightly smaller than 1 mm.

Next, through-holes are formed in the bonded substrate by drilling, and metal plating (e.g., copper plating) is applied to the inner surfaces of the through-holes. This forms the first via 104, the second via 106, the third vias 109, the fourth via 107a, and the fifth via 108a.

The electromagnetic resonance coupler 100, which is fabricated using a manufacturing method as described above, can perform power and signal transmission at low loss. High-frequency signals in a wide variety of frequency bands, such as a microwave band or a millimeter wave band, are used to send/receive power and signals. The frequency band of the high-frequency signals is, specifically, for example, a frequency band of 2.4 to 5.8 GHz.

[Internal Structure of Signal Transmission Device According to First Comparative Example]

Figure 5A:
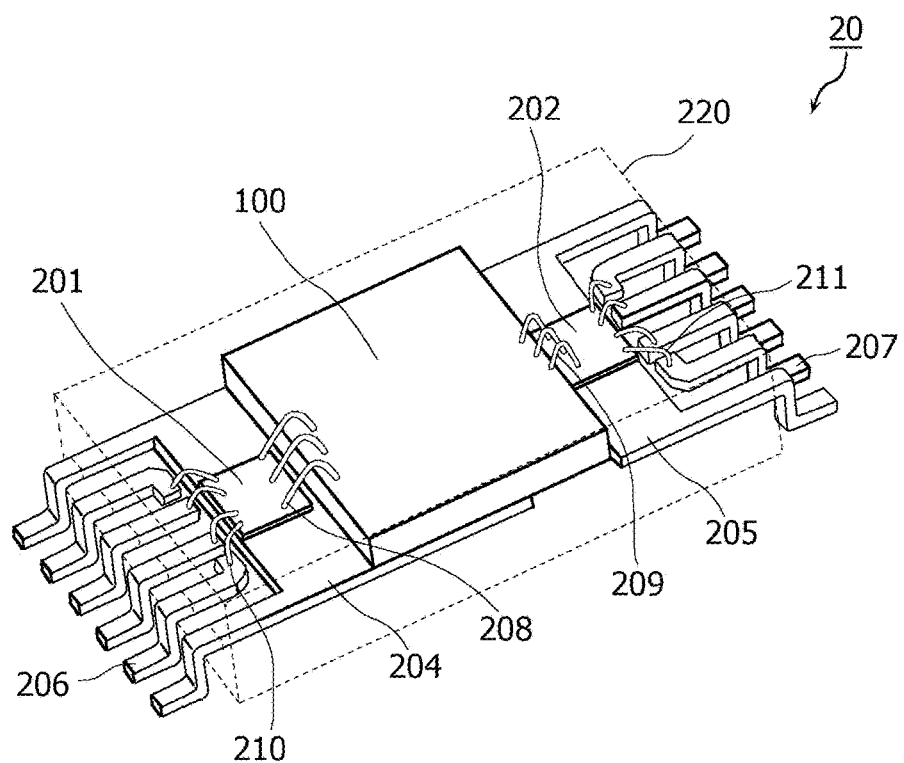
FIG. 5A is a perspective view illustrating the internal structure of a signal transmission device according to a first comparative example.
Figure 5B:
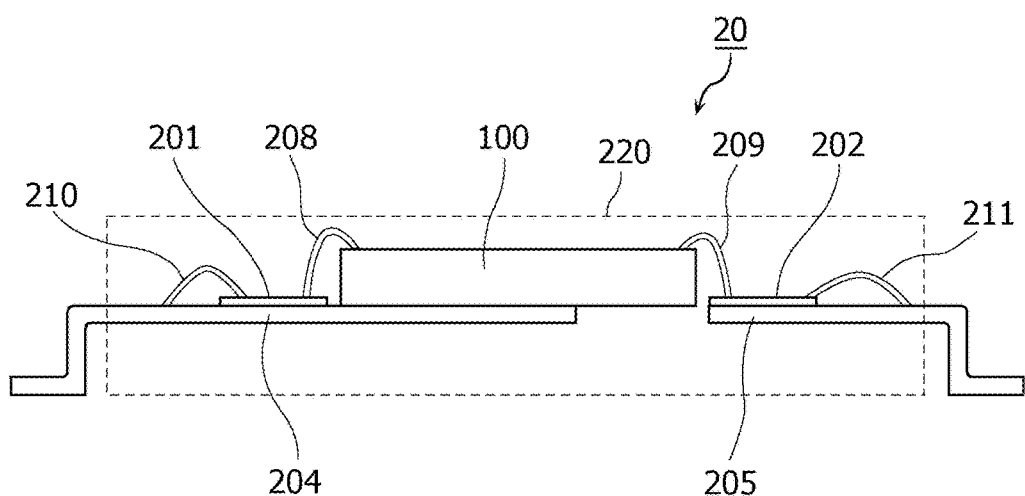
FIG. 5B is a side view illustrating the internal structure of the signal transmission device according to the first comparative example.

Next, a description will be given of the internal structure of a signal transmission device according to a first comparative example into which the electromagnetic resonance coupler 100, the transmission circuit 201, and the receiving circuit 202 are integrated. FIG. 5A is a perspective view illustrating the internal structure of the signal transmission device according to the first comparative example. FIG. 5B is a side view illustrating the internal structure of the signal transmission device according to the first comparative example. In FIGS. 5A and 5B, a sealant 220 (i.e., a package) is indicated by a dashed line.

A signal transmission device 20 (illustrated in FIGS. 5A and 5B) according to the first comparative example includes the transmission circuit 201, the receiving circuit 202, the electromagnetic resonance coupler 100, a first lead frame 204, and a second lead frame 205. The transmission circuit 201, the receiving circuit 202, and the electromagnetic resonance coupler 100 are located on an upper surface of the first lead frame 204 or an upper surface of the second lead frame 205 and are sealed with the sealant 220. The sealant 220 is, for example, a molding resin. Thus, the outer shape of the signal transmission device 20 is defined by the sealant 220.

The transmission circuit 201 is die-bonded to the upper surface of the first lead frame 204 by using a die-attach material. The receiving circuit 202 is die-bonded to the upper surface of the second lead frame 205 by using the die-attach material. Also, the electromagnetic resonance coupler 100 is die-bonded to the upper surface of the first lead frame 204 by using the die-attach material. The die-attach material is, for example, a silver paste. The die-attach material, however, may be another material or may be selected as appropriate.

In this case, the electromagnetic resonance coupler 100 is die-bonded in a state in which the first ground shield 107 faces the first lead frame 204 and the second lead frame 205. Also, it is desirable that the die-attach material used for the electromagnetic resonance coupler 100 be an insulating adhesive material so that the first lead frame 204 and the second lead frame 205 are not electrically connected via the first ground shield 107. The die-attach material used for the electromagnetic resonance coupler 100 may be an insulating adhesive material.

The transmission circuit 201 has electrodes, which are connected to the input terminal 103 and the sending-side ground terminals 110 of the electromagnetic resonance coupler 100 through metal wires 208. The electrodes of the transmission circuit 201 are connected to external terminals 206 through metal wires 210. The external terminals 206 are metal members that are exposed from the sealant 220 in order to mount the signal transmission device 20 on an arbitrary circuit board and are formed as part of the first lead frame 204. For example, the power source 16 and the signal source 17 are electrically connected to the external terminals 206.

Similarly, the receiving circuit 202 have electrodes, which are connected to the output terminal 105 and the receiving-side ground terminals 111 of the electromagnetic resonance coupler 100 through metal wires 209. The electrodes of the receiving circuit 202 are connected to external terminals 207 through metal wires 211. The external terminals 207 are metal members that are exposed from the signal transmission device 20 in order to mount the second lead frame 205 on an arbitrary circuit board and are formed as part of the sealant 220. A signals output from the receiving circuit 202 is extracted from the external terminals 207.

The first lead frame 204 and the second lead frame 205 are not connected to each other and are isolated from each other. In the signal transmission device 20, the two isolated frames, that is, the first lead frame 204 and the second lead frame 205, realize an electrical insulation between the transmission circuit 201 and the receiving circuit 202.

[Problems with Signal Transmission Device According to First Comparative Example]

Next, a description will be given of problems with the signal transmission device 20.

[1] First, the signal transmission device 20 has a problem in that it is difficult to miniaturize it. In the signal transmission device 20, the transmission circuit 201, the electromagnetic resonance coupler 100, and the receiving circuit 202 are aligned in the same plane (on the upper surface of the first lead frame 204 or the upper surface of the second lead frame 205). Thus, there is a limit in performing miniaturization by reducing the width from an end at the external terminals 206 side to an end at the external terminals 207 side.

The signal transmission device 20 also has a problem in that it is difficult to perform wire bonding. In the wire bonding, in general, a first end portion of a metal wire is bonded to a high place, and then a second end portion of the metal wire is bonded to a low place. Hereinafter, bonding of the first end portion is referred to as "first bonding", and bonding of the second end portion is referred to as "second bonding".

In the second bonding, heat and load during the bonding are increased, compared with the first bonding. In terms of failure reduction and reliability improvement, the first bonding is generally performed on the electrodes of the transmission circuit 201 or the electrodes of the receiving circuit 202. The second bonding is performed on the terminals of the electromagnetic resonance coupler 100, the first lead frame 204, or the second lead frame 205.

In this case, the thickness of each of the transmission circuit 201 and the receiving circuit 202 is, for example, 150 µm, and the thickness of the electromagnetic resonance coupler 100 is about 1 mm. That is, the thickness of each of the transmission circuit 201 and the receiving circuit 202 is smaller than the thickness of the electromagnetic resonance coupler 100. Thus, the height of the position on which the first bonding is performed is lower than the height of the position on which the second bonding is performed.

When the heights are reversed in such a manner, a method called reverse bonding is used. In the reverse bonding, first, metal balls are formed for the electrodes of the transmission circuit 201 and the electrodes of the receiving circuit 202. Thereafter, the first bonding is performed on the terminals of the electromagnetic resonance coupler 100, and the second bonding is performed on the electrodes of the transmission circuit 201 or the electrodes of the receiving circuit 202.

Such reverse bonding is a more complicated process than typical bonding and thus increases the production takt time. Thus, the height difference between the transmitting and receiving circuits 201 and 202 and the electromagnetic resonance coupler 100 leads to an increase in the production takt time and causes an increase in the mass production cost of the signal transmission device 20.

[2] In addition, in the signal transmission device 20, the lengths of the metal wires 208 and 209 are likely to be increased by the height difference between the transmitting and receiving circuits 201 and 202 and the electromagnetic resonance coupler 100. In the signal transmission device 20 that processes a high-frequency signal, when the lengths of the metal wires 208 and 209 are large, the metal wires 208 and 209 are likely to serve as parasitic inductances. The parasitic inductance can cause an impedance mismatch and an output reduction.

When the lengths of the metal wires 208 and 209 are large, they are easily moved by the sealant 220. When the lengths of the metal wires 208 and 209 are large, disconnection of the metal wires 208 and 209 and a failure, such as short-circuiting, of the metal wires are likely to occur, and such a failure results in a decrease in the yield and the reliability.

[3] The signal transmission device 20 further has a problem in suppressing high-frequency noise. As described above, the first ground shield 107 and the second ground shield 108 in the electromagnetic resonance coupler 100 have an advantage in that leakage of high-frequency noise from the electromagnetic resonance coupler 100 in the stacking direction is reduced. However, the advantage that the first ground shield 107 and the second ground shield 108 have in suppressing high-frequency noise that leaks in the width direction is thought to be insufficient. When high-frequency noise leaks from the electromagnetic resonance coupler 100 in the width direction, there is a concern that the leakage causes adverse effects on the transmission circuit 201 and the receiving circuit 202 aligned in the signal transmission device 20.

Although it is desirable that a ground shield be formed around the first resonator 101 and the second resonator 102 as a means for suppressing high-frequency noise in the width direction, the formation of the ground shield leads to an increase in the fabrication cost of the first resonator 101 and the second resonator 102.

[Internal Structure of Signal Transmission Device According to First Embodiment]

As described above, the signal transmission device 20 has problems in terms of miniaturization, mass production cost, high-frequency noise, and so on.

Figure 6A:
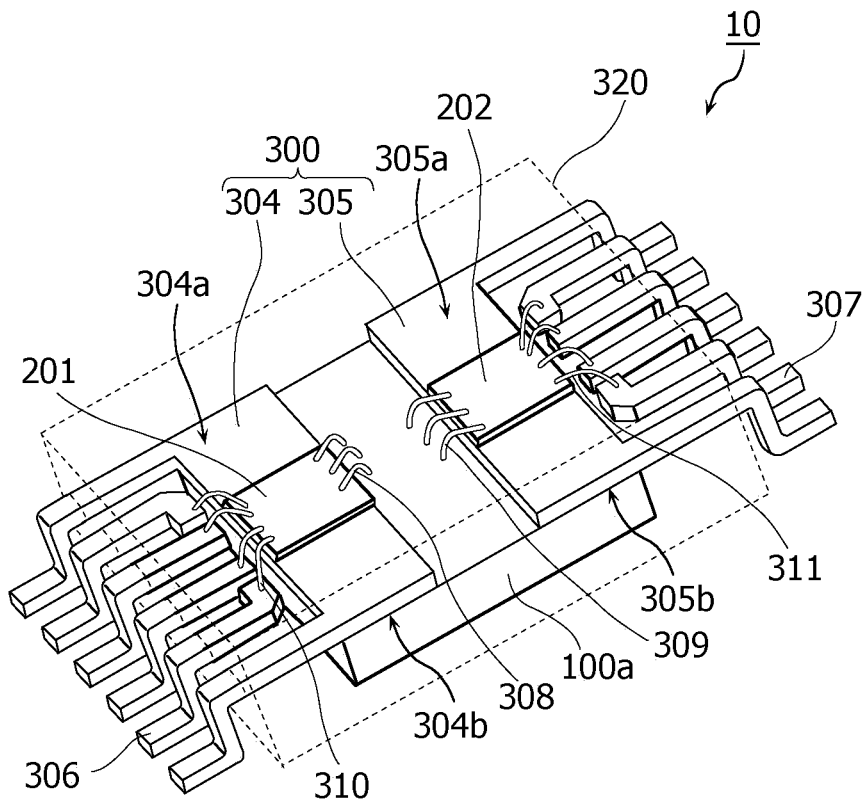
FIG. 6A is a perspective view illustrating the internal structure of the signal transmission device according to the first embodiment.
Figure 6B:
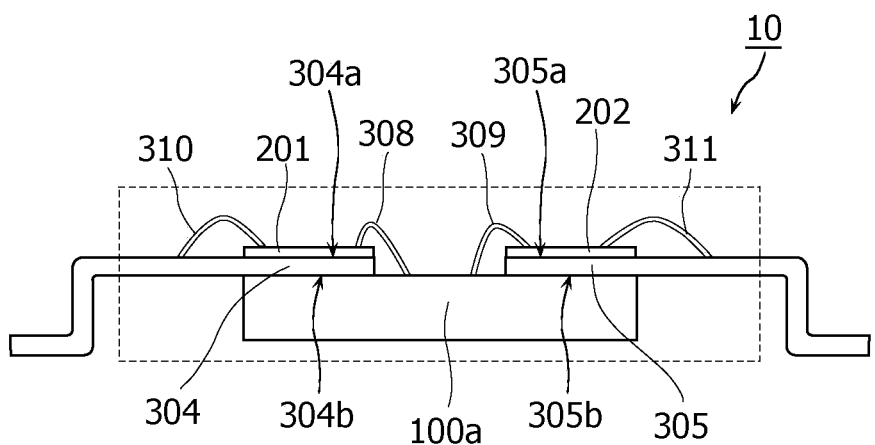
FIG. 6B is a side view illustrating the internal structure of the signal transmission device according to the first embodiment.

The following description will be given of the structure of the signal transmission device 10 for overcoming such problems. FIG. 6A is a perspective view illustrating the internal structure of the signal transmission device 10. FIG. 6B is a side view illustrating the internal structure of the signal transmission device 10. In FIGS. 6A and 6B, a sealant 320 (i.e., a package) is indicated by a dashed line.

As illustrated in FIGS. 6A and 6B, the signal transmission device 10 includes a lead frame portion 300, the transmission circuit 201, the receiving circuit 202, an electromagnetic resonance coupler 100a, and the sealant 320. The electromagnetic resonance coupler 100a has a configuration that is substantially the same as that of the electromagnetic resonance coupler 100, except for the arrangement of terminals. The structure of the electromagnetic resonance coupler 100a is described later.

The lead frame portion 300 has a first major surface (a first major surface 304a and a first major surface 305a) and a second major surface (a second major surface 304b and a second major surface 305b) opposite to the first major surface. In other words, the second major surface is a major surface at the side opposite to the first major surface. In the first embodiment, an upper surface of the lead frame portion 300 is defined as the first major surface, and a lower surface of the lead frame portion 300 is defined as the second major surface. When the signal transmission device 10 is mounted on a circuit board, the lower surface is located closer to the circuit board than the upper surface.

The lead frame portion 300 is mainly constituted by a first lead frame 304 and a second lead frame 305, which is isolated from the first lead frame 304. The lead frame portion 300 also includes a plurality of external terminals 306 and a plurality of external terminals 307. The first lead frame 304 and the second lead frame 305 are structurally separated from each other. End portions (e.g., the external terminals 306 or the external terminals 307) of the lead frame portion 300 are bent toward the second major surface (i.e., downward) in a stepped form.

Also, the end portions of the lead frame portion 300 are exposed from the sealant 320 to outside. In the embodiment described below, portions of the first lead frame 304 and the second lead frame 305, the portions being exposed from the sealant 320, may also be referred to as "external terminals".

The transmission circuit 201 is located on the first major surface 304a of the first lead frame 304. The receiving circuit 202 is located on the first major surface 305a of the second lead frame 305. That is, the transmission circuit 201 and the receiving circuit 202 are located in the same plane.

In contrast, the electromagnetic resonance coupler 100a, which transmits a transmission signal, sent by the transmission circuit 201, to the receiving circuit 202, is located across between the second major surface 304b of the first lead frame 304 and the second major surface 305b of the second lead frame 305. That is, the electromagnetic resonance coupler 100a is located on a plane that is different from the plane in which the transmission circuit 201 and the receiving circuit 202 are located. When viewed from the stacking direction, the lead frame portion 300 is located between the electromagnetic resonance coupler 100a and the sending and receiving circuits 201 and 202.

The sealant 320 seals the transmission circuit 201, the receiving circuit 202, and the electromagnetic resonance coupler 100a, which are located on the lead frame portion 300. The sealant 320 is, specifically, a molding resin.

The following description will be given of a more detailed structure of the signal transmission device 10.

The transmission circuit 201 is die-bonded to the first major surface 304a of the first lead frame 304 by using a die-attach material. The receiving circuit 202 is die-bonded to the first major surface 305a of the second lead frame 305 by using the die-attach material. Also, the electromagnetic resonance coupler 100a is die-bonded to each of the second major surface 304b of the first lead frame 304 and the second major surface 305b of the second lead frame 305 by using the die-attach material. The die-attach material is, for example, a silver paste. The die-attach material, however, may be another material or may be selected as appropriate.

The electromagnetic resonance coupler 100a is die-bonded in a state in which the surface on which the input terminal 103, the sending-side ground terminals 110, the output terminal 105, and the receiving-side ground terminals 111 are provided faces the lead frame portion 300. In this case, it is desirable that the die-attach material used for the electromagnetic resonance coupler 100a be an insulating adhesive material so that the input terminal 103, the sending-side ground terminals 110, the output terminal 105, and the receiving-side ground terminals 111 are not electrically connected via the first lead frame 304 or the second lead frame 305.

The electrodes of the transmission circuit 201 are connected to the input terminal 103 and the sending-side ground terminals 110 of the electromagnetic resonance coupler 100a through metal wires 308. Also, the electrodes of the transmission circuit 201 are connected to the external terminals 306 through metal wires 310. The external terminals 306 are metal members that are exposed from the sealant 320 in order to mount the signal transmission device 10 on an arbitrary circuit board and are formed as part of the first lead frame 304. For example, the power source 16 and the signal source 17 are electrically connected to the external terminals 306.

Similarly, the electrodes of the receiving circuit 202 are connected to the output terminal 105 and the receiving-side ground terminals 111 of the electromagnetic resonance coupler 100a through metal wires 309. Also, the electrodes of the receiving circuit 202 are connected to the external terminals 307 through metal wires 311. The external terminals 307 are metal members that are exposed from the sealant 320 in order to mount the signal transmission device 10 on an arbitrary circuit board and are formed as part of the second lead frame 305. A signal output from the receiving circuit 202 is extracted from the external terminals 307.

[Advantages Obtained by Signal Transmission Device According to First Embodiment]

Next, a description will be given of advantages obtained by the signal transmission device 10.

[1] The signal transmission device 10 can be easily miniaturized. Also, the freedom of structure design improves.

In the signal transmission device 10, since the transmission circuit 201 and the receiving circuit 202 are located on the first major surface of the lead frame portion 300, and the electromagnetic resonance coupler 100a is located on the second major surface of the lead frame portion 300, the size in the width direction is reduced. In the signal transmission device 10, specifically, the package size of the sealant 320 is reduced by 30% or more, compared with the signal transmission device 20.

In addition, in the signal transmission device 10, since the electromagnetic resonance coupler 100a, the transmission circuit 201, and the receiving circuit 202 are not located in the same plane, the position and the size of the transmission circuit 201 and the position and the size of the receiving circuit 202 are less likely to be problematic in the structure design. That is, the freedom of the structure design improves.

Since the sending side and the receiving side are electrically insulated from each other in the signal transmission device 10, the signal transmission device 10 requires an isolation voltage according to an intended use. The isolation voltage is mainly defined by a closest distance between the first lead frame 304 and the second lead frame 305 and a distance between the first resonator 101 and the second resonator 102 in the electromagnetic resonance coupler 100a.

In the signal transmission device 10, the arrangements and the shapes of the first lead frame 304 and the second lead frame 305 can be arbitrarily designed as long as requirements for the isolation voltage are satisfied. The same also applies to the shape and the arrangement of the transmission circuit 201 and the shape and the arrangement of the receiving circuit 202.

The electromagnetic resonance coupler 100a also plays a role of integrally holding the first lead frame 304 and the second lead frame 305. As described above, the signal transmission device 10 has a basic structure in which the lead frame portion 300 is divided into at least two members in order to realize electrical insulation between the sending side and the receiving side. There is a possibility that, in the manufacturing process of the signal transmission device 10, the lead frame portion 300, which is divided into two members, becomes instable during die bonding and wire bonding of the transmission circuit 201 and the receiving circuit 202. That is, the structure in which the lead frame portion 300 is divided into two members can cause a reduction in the yield and an increase in defects during mass production.

In this case, in the manufacture of the signal transmission device 10, when the electromagnetic resonance coupler 100a is first die-bonded across the first lead frame 304 and the second lead frame 305, the two members that constitute the lead frame portion 300 are combined into one portion, and the positional relationship between the two members is fixed. Thus, according to such a manufacturing method, the work efficiency improves, and the yield improves.

In this case, the insulation between the first lead frame 304 and the second lead frame 305 is also maintained. For example, an insulating adhesive material is used for the die-attach material for the electromagnetic resonance coupler 100a so that the first lead frame 304 and the second lead frame 305 are not electrically connected to each other via the second ground shield 108. Also, the second ground shield 108 may be covered by an insulating film (or an insulating layer).

[2] The signal transmission device 10 has an advantage of making it easier to perform wire bonding than the signal transmission device 20. As described above, in the signal transmission device 20, since the electromagnetic resonance coupler 100 is located at a higher position than the transmission circuit 201 and the receiving circuit 202, the reverse bonding is necessary. In general, the reverse bonding increases the production takt time, which leads to an increase in the mass production cost.

In contrast, in the signal transmission device 10, the electromagnetic resonance coupler 100a is located across between the second major surface 304b of the first lead frame 304 and the second major surface 305b of the second lead frame 305. Hence, when the second major surface 304b and the second major surface 305b are directed downward, the electromagnetic resonance coupler 100a is located below the transmission circuit 201 and the receiving circuit 202, the reverse bonding is not necessary.

Also, the lengths of the metal wires in the signal transmission device 10 are reduced, compared with the lengths of the metal wires in the signal transmission device 20. In the signal transmission device 20, the metal wires 208 and 209 need to have lengths that are larger than the difference between the height of the electromagnetic resonance coupler 100 and the height of the sending and receiving circuits 201 and 202. Since the thickness of the electromagnetic resonance coupler 100 is about 1 mm, the length of the metal wires 208 and the length of the metal wires 209 in the signal transmission device 20 are also about 1 mm.

When the electromagnetic resonance coupler 100a included in the signal transmission device 10 is viewed from the first major surface of the lead frame portion 300, the input terminal 103, the sending-side ground terminals 110, the output terminal 105, and the receiving-side ground terminals 111 are located between the first lead frame 304 and the second lead frame 305. That is, the input terminal 103, the sending-side ground terminals 110, the output terminal 105, and the receiving-side ground terminals 111 are exposed from portions between the first lead frame 304 and the second lead frame 305.

Accordingly, the length of the metal wires 308 and the length of the metal wires 309 may be about a total length of the thickness (0.15 mm or less) of the sending and receiving circuits 201 and 202 and the thickness of the lead frame portion 300. That is, the lengths of the metal wires 308 and 309 may be smaller than the thickness of the electromagnetic resonance coupler 100a. The lengths of the metal wires 308 and 309 are, for example, 0.45 mm and are reduced to about one-half of the lengths of the metal wires 208 and 209.

The thickness of the lead frame portion 300 is about 0.3 mm. Also, the thickness of the lead frame portion 300 may be changed as appropriate, and may be, for example, 0.2 mm or more or 1 mm or less. It is, however, desirable that the thickness be about 0.3 mm.

[3] The signal transmission device 10 can reduce influences that high-frequency noise has on the transmission circuit 201 and the receiving circuit 202, compared with the signal transmission device 20. As described above, in the signal transmission device 20, the transmission circuit 201, the receiving circuit 202, and the electromagnetic resonance coupler 100 are located in the same plane. Thus, the transmission circuit 201 and the receiving circuit 202 are susceptible to the influences of high-frequency noise that leaks from the electromagnetic resonance coupler 100, and there is a possibility that the transmission circuit 201 and the receiving circuit 202 malfunction.

The sending and receiving circuits 201 and 202, the lead frame portion 300, and the electromagnetic resonance coupler 100a are stacked in the signal transmission device 10. That is, the sending and receiving circuits 201 and 202, the lead frame portion 300, and the electromagnetic resonance coupler 100a are aligned in the stacking direction.

Similarly to the electromagnetic resonance coupler 100, since the electromagnetic resonance coupler 100a has the first ground shield 107 and the second ground shield 108, it is thought that leakage of high-frequency noise from the electromagnetic resonance coupler 100a in the stacking direction is reduced compared with leakage in the width direction.

Also, in the signal transmission device 10, the lead frame portion 300 are located between the transmitting and receiving circuits 201 and 202 and the electromagnetic resonance coupler 100a. The lead frame portion 300 is fabricated with highly conductive metal, such as copper. Hence, the lead frame portion 300 itself serves as a ground shield, thereby suppressing leakage of high-frequency noise from the electromagnetic resonance coupler 100a in the stacking direction. That is, this structure suppresses malfunction of the transmission circuit 201 and the receiving circuit 202, the malfunction being caused by the high-frequency noise.

As described above, the signal transmission device 10 can be easily miniaturized. It can also be said that the signal transmission device 10 facilitates an improvement in transmission characteristics and an improvement in mass production.

When components are located on two opposite surfaces of the lead frame portion 300, the die bonding needs to be performed once on each of the two opposite surfaces, thus requiring the die bonding twice in total.

In this case, the transmission circuit 201 and the receiving circuit 202 are formed of, for example, Si-, GaN-, or GaAs-based semiconductor, and the electromagnetic resonance coupler 100a is mainly formed of a resin material, as described above. When such components formed of different materials are die-bonded to the lead frame portion 300, die-attach materials that are suitable for the respective materials are used in general. This is because, in terms of aging due to heat, a linear expansion coefficient, and reliability, optimum die-attach materials need to be selected according to the materials of components to be die-bonded.

Thus, even when components are located on only one of the two surfaces of the lead frame portion 300, the die-attach materials are changed, and the die bonding is performed twice. Accordingly, the die bonding that is performed on the two opposite surfaces of the lead frame portion 300 does not lead to an increase in the number of times the die bonding is performed.

Even if it is assumed that the number of times the die bonding is performed increases, the advantage of reducing the influences of high-frequency noise, the advantage being obtained by the lead frame portion 300 being interposed between the sending and receiving circuits 201 and 202 and the electromagnetic resonance coupler 100a, should be given priority. It is important that influences of high-frequency noise be reduced in a device that processes a high-frequency signal in a microwave band or millimeter wave band, as in the signal transmission device 10, and such a technical idea is not found in other general semiconductor devices (or semiconductor packages).

[Supplementary 1: Structure of Electromagnetic Resonance Coupler]

Figure 7A:
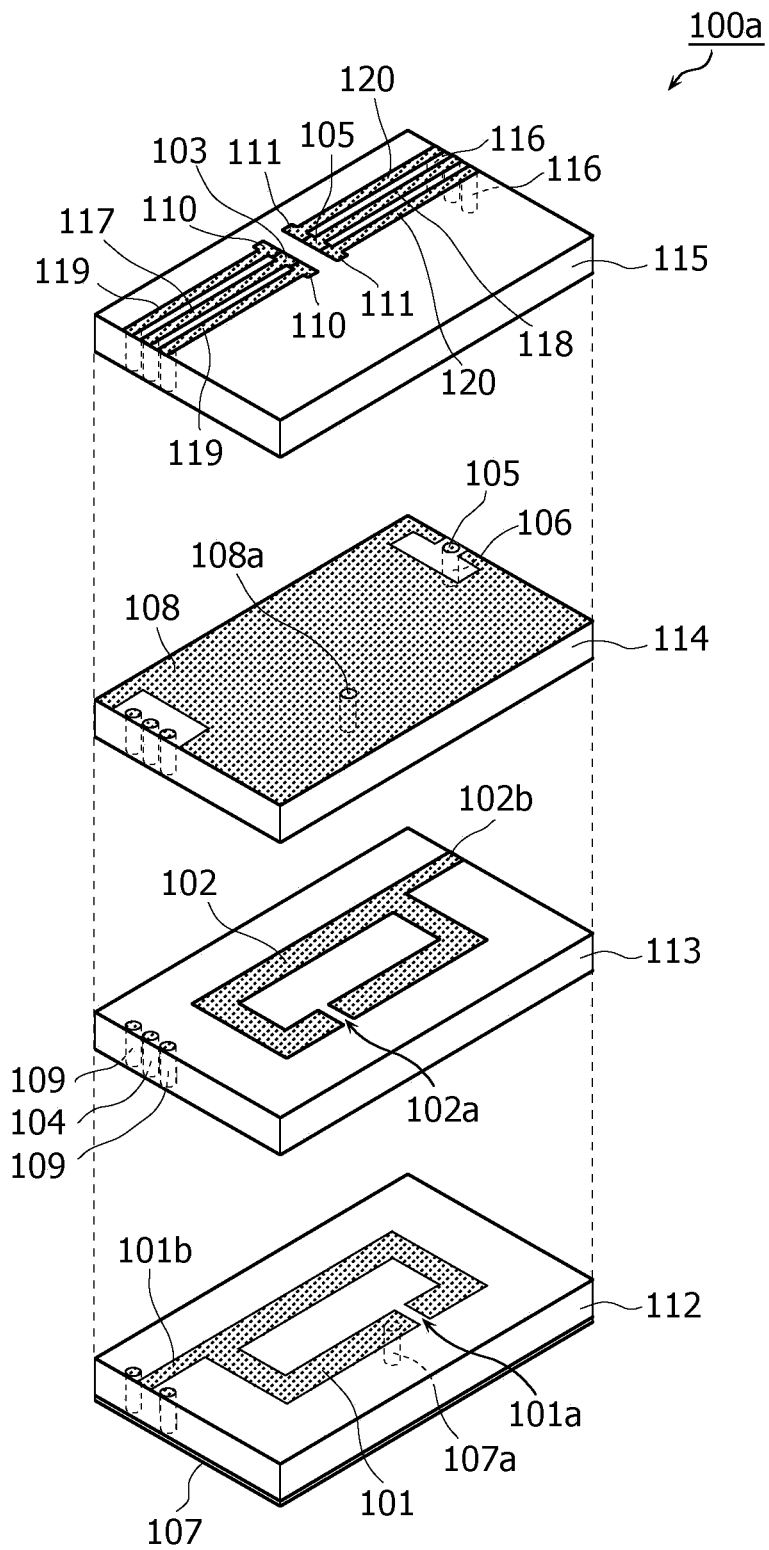
FIG. 7A is an exploded perspective view of another electromagnetic resonance coupler according to the first embodiment.
Figure 7B:
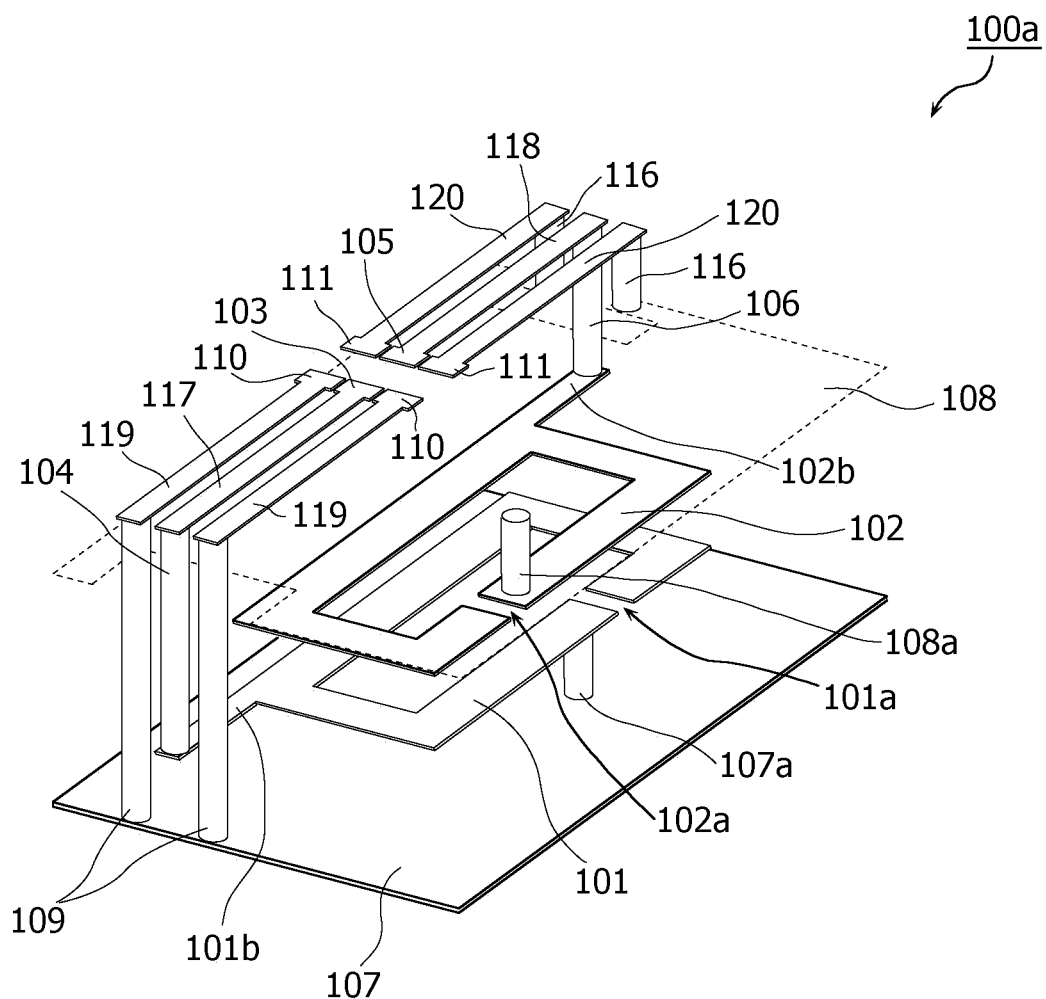
FIG. 7B is a first perspective view illustrating the wiring structure of the other electromagnetic resonance coupler according to the first embodiment.
Figure 7C:
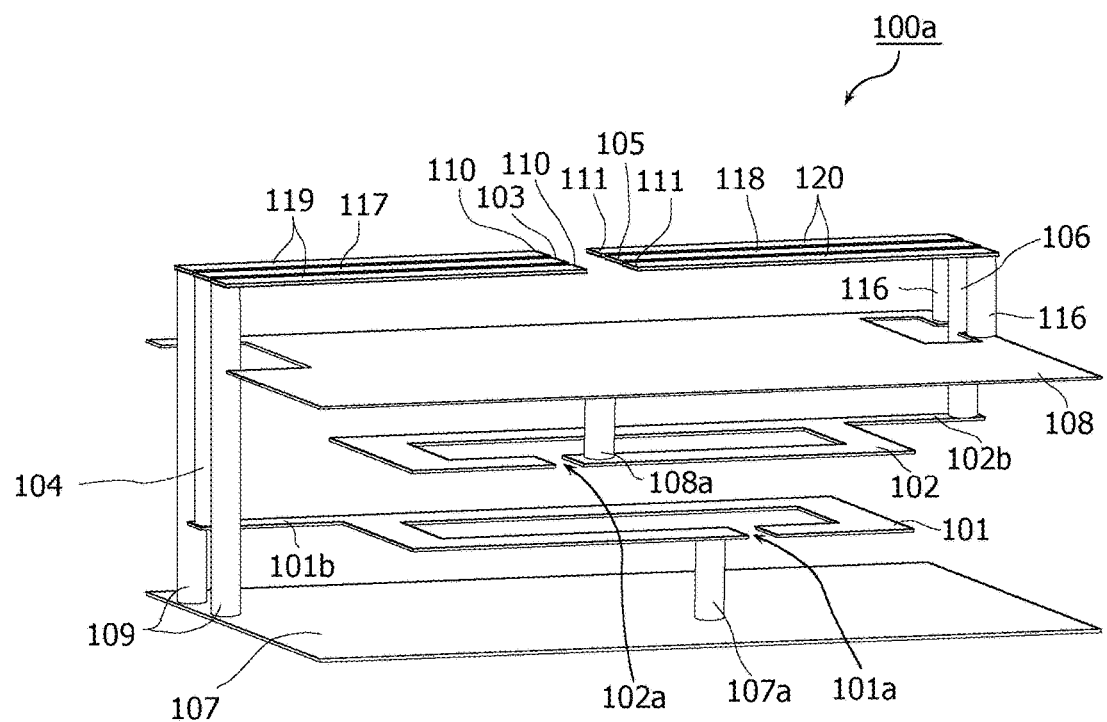
FIG. 7C is a second perspective view illustrating the wiring structure of the other electromagnetic resonance coupler according to the first embodiment.

A supplementary description will now be given of the structure of the electromagnetic resonance coupler 100a. FIG. 7A is an exploded perspective view of the electromagnetic resonance coupler 100a. FIGS. 7B and 7C are perspective views illustrating a wiring structure of the electromagnetic resonance coupler 100a. The structure of the electromagnetic resonance coupler 100a is similar to the structure of the electromagnetic resonance coupler 100, and differences therebetween will be mainly described below.

The electromagnetic resonance coupler 100a has a dielectric layer 115 on the upper surface of the dielectric layer 114 (i.e., an upper surface of the second ground shield 108).

The dielectric layer 115 is located, with a lower surface of the dielectric layer 115 overlaying the upper surface of the dielectric layer 114 (i.e., the upper surface of the second ground shield 108). The input terminal 103, the output terminal 105, the two sending-side ground terminals 110, and the two receiving-side ground terminals 111 are provided on an upper surface of the dielectric layer 115.

The first via 104 has a conductive via structure that penetrates the dielectric layer 113, the dielectric layer 114, and the dielectric layer 115 at a first end portion of the electromagnetic resonance coupler 100a. The first via 104 provides electrical connection between the first wiring line 101b and a third wiring line 117 (and the input terminal 103). The first via 104 is located between the two third vias 109.

The third wiring line 117 is a linear wiring line that extends from a first end portion of the dielectric layer 115 to the center portion thereof on the upper surface of thereof. One end portion of the third wiring line 117 is connected to the first via 104, and another end portion of the third wiring line 117 is connected to the input terminal 103. The third wiring line 117 allows the input terminal 103 to be located at the center portion of the dielectric layer 115.

The second via 106 has a conductive via structure that penetrates the dielectric layer 114 at a second end portion of the electromagnetic resonance coupler 100a. The second via 106 provides electrical connection between the second wiring line 102b and a fourth wiring line 118 (and the output terminal 105).

The fourth wiring line 118 is a linear wiring line that extends from a second end portion of the dielectric layer 115 to the center portion on the upper surface of the dielectric layer 115. One end portion of the fourth wiring line 118 is connected to the output terminal 105, and another end portion of the fourth wiring line 118 is connected to the second via 106. The fourth wiring line 118 allows the output terminal 105 to be located at the center portion of the dielectric layer 115.

The third vias 109 each have a conductive via structure that penetrates the dielectric layers 112, 113, 114, and 115 at the first end portion of the electromagnetic resonance coupler 100a. The third vias 109 provide electrical connection between the first ground shield 107 and fifth wiring lines 119 (and the sending-side ground terminals 110). The electromagnetic resonance coupler 100a has two third vias 109. The first via 104 is located between the two third vias 109.

The fifth wiring lines 119 are linear wiring lines that extend from the first end portion of the dielectric layer 115 to the center portion thereof on the upper surface thereof. First end portions of the fifth wiring lines 119 are connected to the respective third vias 109, and second end portions of the fifth wiring lines 119 are connected to the respective sending-side ground terminals 110. The fifth wiring lines 119 allow the sending-side ground terminals 110 to be located at the center portion of the dielectric layer 115. The electromagnetic resonance coupler 100a has two fifth wiring lines 119 in accordance with the number of sending-side ground terminals 110.

Sixth vias 116 each have a conductive via structure that penetrates the dielectric layer 115 at the second end portion of the electromagnetic resonance coupler 100a. The sixth vias 116 provide electrical connection between the second ground shield 108 and sixth wiring lines 120 (and the receiving-side ground terminals 111). The electromagnetic resonance coupler 100a has two sixth vias 116. The second via 106 is located between the two sixth vias 116.

Each of the sixth wiring lines 120 is a linear wiring line that extends from the second end portion of the dielectric layer 115 to the center portion thereof on the upper surface thereof. First end portions of the sixth wiring lines 120 are connected to the respective receiving-side ground terminals 111, and second end portions of the sixth wiring lines 120 are connected to the respective sixth vias 116. The sixth wiring lines 120 allow the receiving-side ground terminals 111 to be located at the center portion of the dielectric layer 115. The electromagnetic resonance coupler 100a has two sixth wiring lines 120 in accordance with the number of receiving-side ground terminals 111.

As described above, in the electromagnetic resonance coupler 100a, the input terminal 103 and the two sending-side ground terminals 110 are located at the center portion of the upper surface of the dielectric layer 115. Thus, the input terminal 103 and the two sending-side ground terminals 110 are located between the first lead frame 304 and the second lead frame 305.

The input terminal 103 is located between the two sending-side ground terminals 110, and the input terminal 103 and the two sending-side ground terminals 110 constitute a ground-signal-ground (G-S-G) pad. It is desirable that the electromagnetic resonance coupler 100a and the lead frame portion 300 be die-bonded together using an insulating die-attach material so that the input terminal 103 and the sending-side ground terminals 110 are not short-circuited.

Also, in the electromagnetic resonance coupler 100a, the output terminal 105 and the two receiving-side ground terminals 111 are located at the center portion of the upper surface of the dielectric layer 115. Thus, the output terminal 105 and the two receiving-side ground terminals 111 are located between the first lead frame 304 and the second lead frame 305.

The output terminal 105 is located between the two receiving-side ground terminals 111, and the output terminal 105 and the two receiving-side ground terminals 111 constitute a ground-signal-ground (G-S-G) pad. It is desirable that the electromagnetic resonance coupler 100a and the lead frame portion 300 be die-bonded together using an insulating die-attach material so that the output terminal 105 and the receiving-side ground terminals 111 are not short-circuited.

[Supplementary 2: Manufacturing Method for Signal Transmission Device]

Figure 8:
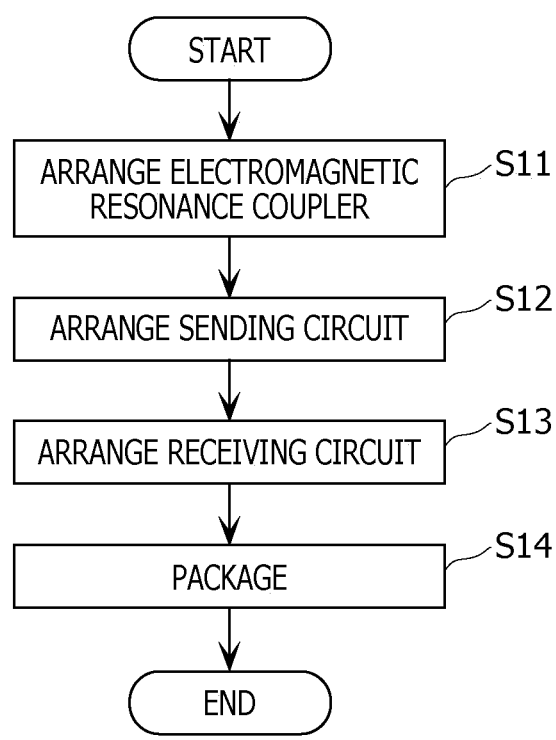
FIG. 8 is a flowchart of a manufacturing method for the signal transmission device according to the first embodiment.

A manufacturing method for the signal transmission device 10 will be described below with reference to a flowchart. FIG. 8 is a flowchart of a manufacturing method for the signal transmission device according to the first embodiment.

First, the electromagnetic resonance coupler 100a is located (i.e., mounted) across the second major surface 304b of the first lead frame 304 and the second major surface 305b of the second lead frame 305 (S11). Thus, the two members, that is, the first lead frame 304 and the second lead frame 305, that constitute the lead frame portion 300 are combined into one portion to thereby fix the positional relationship between the first lead frame 304 and the second lead frame 305.

Next, the transmission circuit 201 is located (i.e., mounted) on the first major surface 304a of the first lead frame 304 (S12). Also, the receiving circuit 202 is located (i.e., mounted) on the first major surface 305a of the second lead frame 305 (S13). The order of step S12 and step S13 may be reversed. Although steps S12 and S13 may be performed earlier than step S11, it is desirable that steps S12 and S13 be performed later than step S11, since the positional relationship between the first lead frame 304 and the second lead frame 305 is fixed in step S11, as described above.

Thereafter, the electromagnetic resonance coupler 100a, the transmission circuit 201, and the receiving circuit 202 are sealed (i.e., packaged) with the sealant 320 (S14).

Second Embodiment

[Problems with Signal Transmission Device According to First Embodiment]

Since the electromagnetic resonance coupler 100a has a four-layer structure, it has an increased thickness compared with the electromagnetic resonance coupler 100. Specifically, the thickness of the electromagnetic resonance coupler 100a is about 1.3 mm, which is 0.3 mm larger than that of the electromagnetic resonance coupler 100.

In the signal transmission device 10 that employs the electromagnetic resonance coupler 100a having such an increased thickness, the thickness of the electromagnetic resonance coupler 100a may cause an increase in the heat resistance and deterioration of the heat-release characteristic.

As described above, the transmission circuit 201 is an analog circuit in many cases, and has a larger amount of steady current than that in a typical digital circuit, thus increasing the amount of heat to be generated. The receiving circuit 202 also has a similar problem in heat generation, although it is not as severe as in the transmission circuit 201.

In the signal transmission device 10, heat generated in the transmission circuit 201 is released to a circuit board, mounted on the signal transmission device 10, through the first lead frame 304 and the external terminals 306. The heat generated in the receiving circuit 202 is released to the circuit board through the second lead frame 305 and the external terminals 307.

In this case, although the external terminals 306 and the external terminals 307 are bent in a stepped form in accordance with the thickness of the electromagnetic resonance coupler 100a, it is desirable that the external terminals 306 and the external terminals 307 be as short as possible in order to reduce the heat resistance and enhance the heat-release characteristic.

Accordingly, a signal transmission device having an enhanced heat-release characteristic through reduction of the lengths of the external terminals will be described in a second embodiment.

[Internal Structure of Signal Transmission Device According to Second Embodiment]

Figure 9A:
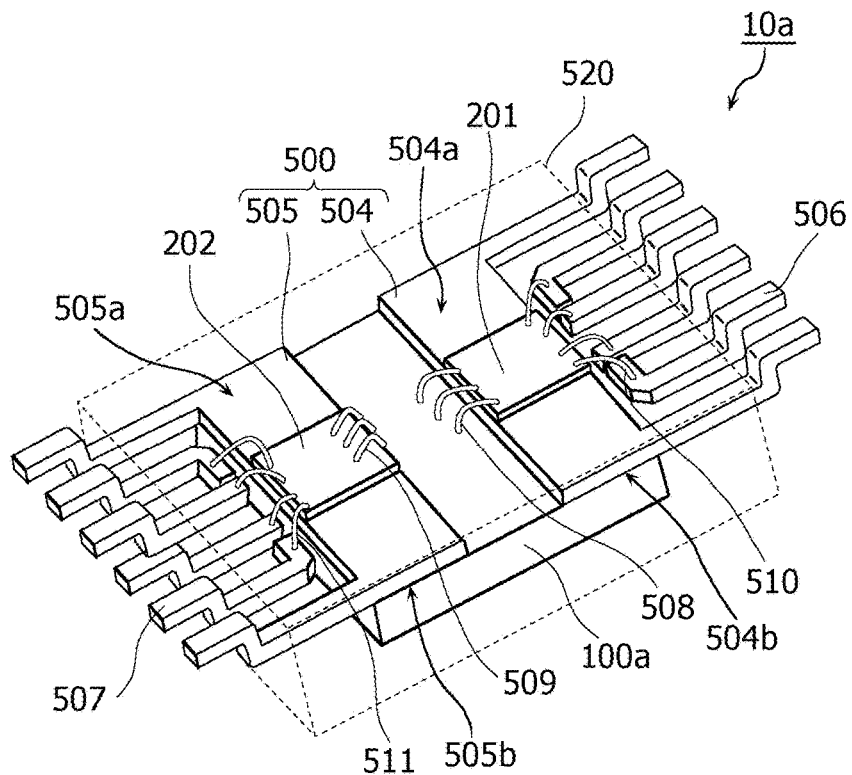
FIG. 9A is a perspective view illustrating the internal structure of a signal transmission device according to a second embodiment.
Figure 9B:
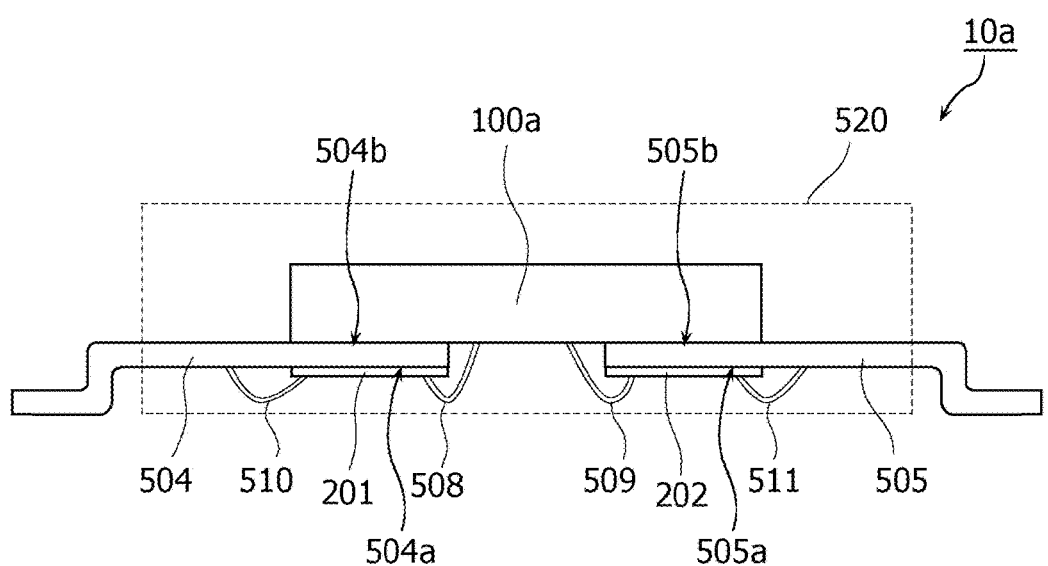
FIG. 9B is a side view illustrating the internal structure of the signal transmission device according to the second embodiment.

FIG. 9A is a perspective view illustrating the internal structure of a signal transmission device according to the second embodiment. FIG. 9B is a side view illustrating the internal structure of the signal transmission device according to the second embodiment. In FIGS. 9A and 9B, a sealant 520 (i.e., a package) is indicated by a dashed line. In the second embodiment described below, differences from the first embodiment are mainly described, and descriptions of the items described above in the first embodiment may be omitted.

As illustrated in FIGS. 9A and 9B, a signal transmission device 10a includes a lead frame portion 500, the transmission circuit 201, the receiving circuit 202, the electromagnetic resonance coupler 100a, and the sealant 520.

The lead frame portion 500 has a first major surface (i.e., a first major surface 504a and a first major surface 505a) and a second major surface (i.e., a second major surface 504b and a second major surface 505b) opposite to the first major surface. In other words, the second major surface is a major surface at the side opposite to the first major surface. In the second embodiment, a lower surface of the lead frame portion 500 is defined as the first major surface, and an upper surface of the lead frame portion 500 is defined as the second major surface. When the signal transmission device 10a is mounted on a circuit board, the lower surface is located closer to the circuit board than the upper surface.

The lead frame portion 500 is mainly constituted by a first lead frame 504 and a second lead frame 505, which is isolated from the first lead frame 504. The lead frame portion 500 also includes a plurality of external terminals 506 and a plurality of external terminals 507. The first lead frame 504 and the second lead frame 505 are structurally separated from each other. End portions (e.g., the external terminals 506 or the external terminals 507) of the lead frame portion 500 are bent toward the first major surface (i.e., downward) in a stepped form.

The transmission circuit 201 is located on the first major surface 504a of the first lead frame 504. The receiving circuit 202 is located on the first major surface 505a of the second lead frame 505. That is, the transmission circuit 201 and the receiving circuit 202 are located in the same plane.

In contrast, the electromagnetic resonance coupler 100a is located across between the second major surface 504b of the first lead frame 504 and the second major surface 505b of the second lead frame 505. That is, the electromagnetic resonance coupler 100a is located in a plane different from the plane in which the transmission circuit 201 and the receiving circuit 202 are located. In the stacking direction, the lead frame portion 300 is located between the electromagnetic resonance coupler 100a and the sending and receiving circuits 201 and 202.

The following description will be given of a more detailed structure of the signal transmission device 10a.

The transmission circuit 201 is die-bonded to the first major surface 504a of the first lead frame 504 by using a die-attach material. The receiving circuit 202 is die-bonded to the first major surface 505a of the second lead frame 505 by using the die-attach material. Also, the electromagnetic resonance coupler 100a is die-bonded to each of the second major surface 504b of the first lead frame 504 and the second major surface 505b of the second lead frame 505 by using the die-attach material. The die-attach material is, for example, a silver paste. The die-attach material, however, may be another material or may be selected as appropriate.

In this case, the electromagnetic resonance coupler 100a is die-bonded in a state in which the surface on which the input terminal 103, the sending-side ground terminals 110, the output terminal 105, and the receiving-side ground terminals 111 are provided faces the lead frame portion 300. In this case, it is desirable that the die-attach material used for the electromagnetic resonance coupler 100a be an insulating adhesive material so that the input terminal 103, the sending-side ground terminals 110, the output terminal 105, and the receiving-side ground terminals 111 are not electrically connected via the first lead frame 304 or the second lead frame 305.

The electrodes of the transmission circuit 201 are connected to the input terminal 103 and the sending-side ground terminals 110 of the electromagnetic resonance coupler 100a through metal wires 508. Also, the electrodes of the transmission circuit 201 are connected to the external terminals 506 through metal wires 510. The external terminals 506 are metal members that are exposed from the sealant 520 in order to mount the signal transmission device 10 on an arbitrary circuit board and are formed as part of the first lead frame 504. For example, the power source 16 and the signal source 17 are electrically connected to the external terminals 506.

Similarly, the electrodes of the receiving circuit 202 are connected to the output terminal 105 and the receiving-side ground terminals 111 of the electromagnetic resonance coupler 100a through metal wires 509. The receiving circuit 202 is connected to the external terminals 507 through metal wires 511. The external terminals 507 are metal members that are exposed from the sealant 520 in order to mount the signal transmission device 10 on an arbitrary circuit board and are formed as part of the second lead frame 505. A signal output from the receiving circuit 202 is extracted from the external terminals 507.

[Advantages Obtained by Signal Transmission Device According to Second Embodiment]

Next, a description will be given of advantages obtained by the signal transmission device 10a. In the signal transmission device 10a, the transmission circuit 201 and the receiving circuit 202, not the electromagnetic resonance coupler 100a, are located on the lower surface of the lead frame portion 500.

As described above, the thickness of each of the transmission circuit 201 and the receiving circuit 202 is smaller than the thickness of the electromagnetic resonance coupler 100a. Thus, the amount of bending of the external terminals 506 and the amount of bending of the external terminals 507 are small. That is, the lengths of the external terminals 506 and 507 in the signal transmission device 10a are smaller than those in the signal transmission device 10, and the heat resistance is also smaller. The heat resistance of the lead frame portion 500 is about 25% smaller than that of the lead frame portion 300 in the signal transmission device 10a.

For example, the thickness of each of the transmission circuit 201 and the receiving circuit 202 is about 0.15 mm. The height of the bent metal wires is about 0.2 mm. Thus, it is sufficient that the total of the height of the bent external terminals 506 and the height of the bent external terminals 507 be about 0.35 mm.

As described above, in the signal transmission device 10a, since the length of the external terminals 306 and the length of the external terminals 307 can be reduced, the heat-release to the circuit board via the lead frame portion 500 improves.

Also, in the signal transmission device 10a, the transmission circuit 201 and the receiving circuit 202, which are heat sources, are located close to the circuit board, compared with the signal transmission device 10. Accordingly, when the sealant 520 is made to contact the circuit board, the heat-release from the transmission circuit 201 and the receiving circuit 202 to the circuit board via the sealant 520 also improves. In the signal transmission device 10a, only the sealant 520 is located between the sending and receiving circuits 201 and 202 and the circuit board, unlike the signal transmission device 10. This suppresses an increase in the heat resistance, the increase being caused by other components interposed between the sending and receiving circuits 201 and 202 and the circuit board. In particular, when a die-attach material is provided between the sending and receiving circuits 201 and 202 and the circuit board, there is a concern that the die-attach material serves as a heat resistance to deteriorate the heat-release characteristic.

Third Embodiment

[Internal Structure of Signal Transmission Device According to Third Embodiment]

A heatsink may be provided adjacent to the transmission circuit 201 in order further enhance the heat-release characteristic. A signal transmission device having a heatsink will be described in a third embodiment.

Figure 10A:
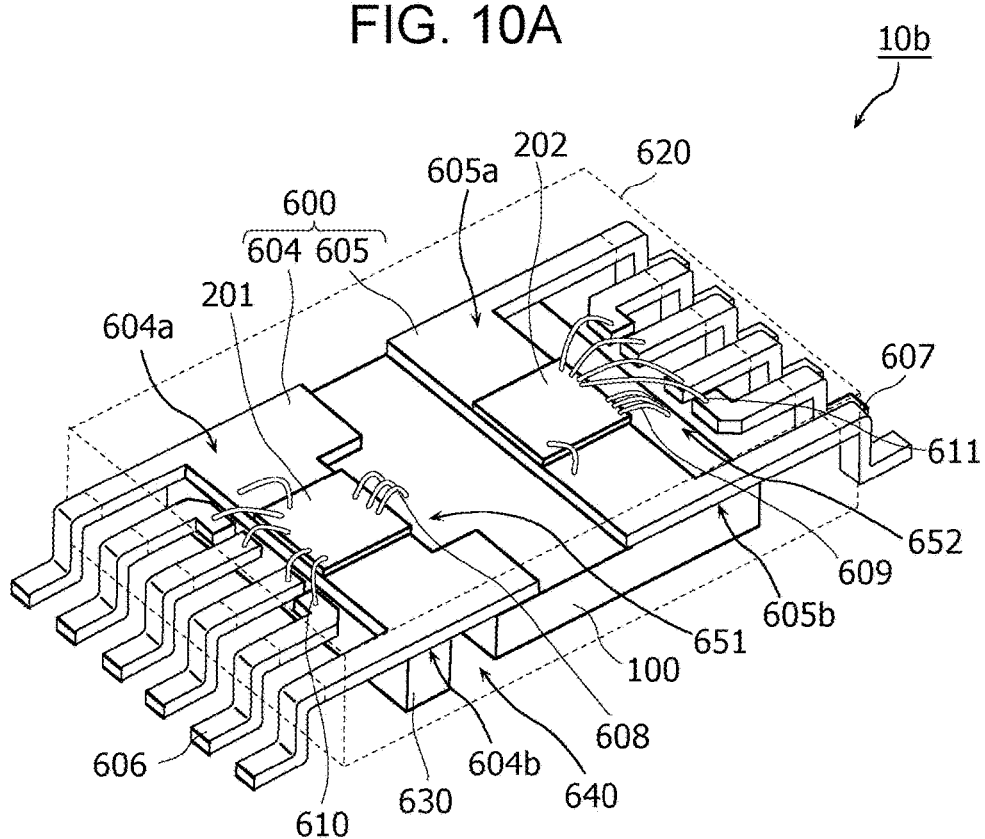
FIG. 10A is a perspective view illustrating the internal structure of a signal transmission device according to a third embodiment.
Figure 10B:
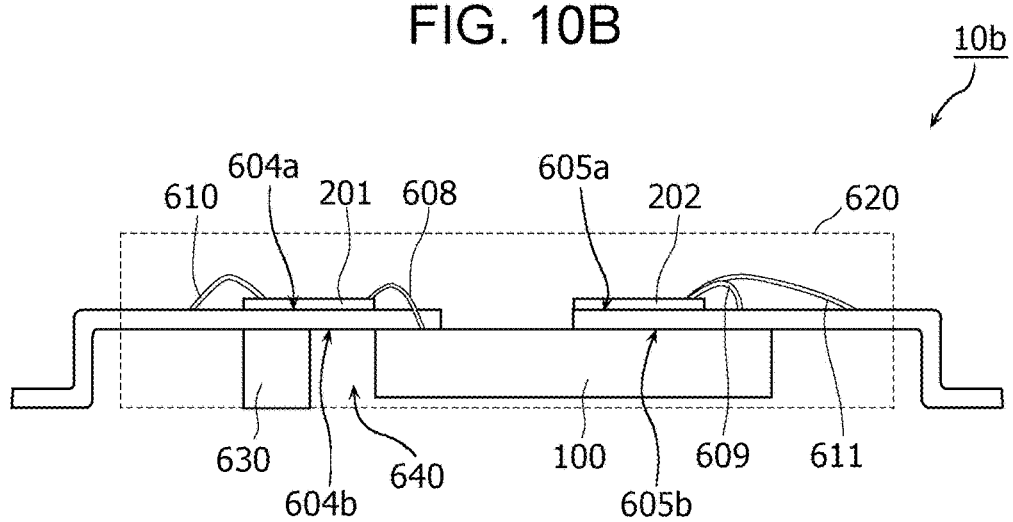
FIG. 10B is a side view illustrating the internal structure of the signal transmission device according to the third embodiment.

FIG. 10A is a perspective view illustrating the internal structure of a signal transmission device according to the third embodiment. FIG. 10B is a side view illustrating the internal structure of the signal transmission device according to the third embodiment. In FIGS. 10A and 10B, a sealant 620 (or a package) is indicated by a dashed line. In the third embodiment described below, differences from the first embodiment are mainly described, and descriptions of the items described above in the first and second embodiments may be omitted.

As illustrated in FIGS. 10A and 10B, a signal transmission device 10b includes a lead frame portion 600, the transmission circuit 201, the receiving circuit 202, the electromagnetic resonance coupler 100, and the sealant 620.

The lead frame portion 600 has a first major surface (i.e., a first major surface 604a and a first major surface 605a) and a second major surface (i.e., a second major surface 604b and a second major surface 605b) opposite to the first major surface. In other words, the second major surface is a major surface at the side opposite to the first major surface. In the third embodiment, an upper surface of the lead frame portion 600 is defined as the first major surface, and a lower surface of the lead frame portion 600 is defined as the second major surface. When the signal transmission device 10b is mounted on a circuit board, the lower surface is located closer to the circuit board than the upper surface.

The lead frame portion 600 is mainly constituted by a first lead frame 604 and a second lead frame 605, which is isolated from the first lead frame 604. The lead frame portion 600 also includes a plurality of external terminals 606 and a plurality of external terminals 607. The first lead frame 604 and the second lead frame 605 are structurally separated from each other. End portions (e.g., the external terminals 606 or the external terminals 607) of the lead frame portion 600 are bent toward the second major surface (i.e., downward) in a stepped form.

The transmission circuit 201 is located on the first major surface 604a of the first lead frame 604. The receiving circuit 202 is located on the first major surface 605a of the second lead frame 605. That is, the transmission circuit 201 and the receiving circuit 202 are located in the same plane.

In contrast, the electromagnetic resonance coupler 100 is located across between the second major surface 604b of the first lead frame 604 and the second major surface 605b of the second lead frame 605. That is, the electromagnetic resonance coupler 100 is located in a plane different from the plane in which the transmission circuit 201 and the receiving circuit 202 are located. In the stacking direction, the lead frame portion 600 is located between the electromagnetic resonance coupler 100 and the sending and receiving circuits 201 and 202.

The following description will be given of a more detailed structure of the signal transmission device 10b.

The transmission circuit 201 is die-bonded to the first major surface 604a of the first lead frame 604 by using a die-attach material. Also, the receiving circuit 202 is die-bonded to the first major surface 605a of the second lead frame 605 by using the die-attach material. In addition, the electromagnetic resonance coupler 100 is die-bonded to each of the second major surface 604b of the first lead frame 604 and the second major surface 605b of the second lead frame 605 by using the die-attach material. The die-attach material is, for example, a silver paste. The die-attach material, however, may be another material or may be selected as appropriate.

In this case, the electromagnetic resonance coupler 100 is die-bonded in a state in which the second ground shield 108 faces the lead frame portion 600. In this case, it is desirable that the die-attach material used in the electromagnetic resonance coupler 100 be an insulating adhesive material so that the first lead frame 604 and the second lead frame 605 are not electrically connected via the second ground shield 108.

Electrodes of the transmission circuit 201 are connected to the input terminal 103 and the sending-side ground terminals 110 of the electromagnetic resonance coupler 100 through metal wires 608. Also, the transmission circuit 201 is connected to the external terminals 606 through metal wires 610. The external terminals 606 are metal members that are exposed from the sealant 620 in order to mount the signal transmission device 10b on an arbitrary circuit board and are formed as part of the first lead frame 604. For example, the power source 16 and the signal source 17 are electrically connected to the external terminals 606.

Similarly, the electrodes of the receiving circuit 202 are connected to the output terminal 105 and the receiving-side ground terminals 111 of the electromagnetic resonance coupler 100 through metal wires 609. Also, the receiving circuit 202 is connected to the external terminals 607 through metal wires 611. The external terminals 607 are metal members that are exposed from the sealant 620 in order to mount the signal transmission device 10 on an arbitrary circuit board and are formed as part of the second lead frame 605. A signal output from the receiving circuit 202 is extracted from the external terminals 607.

The signal transmission device 10b has the electromagnetic resonance coupler 100 having the terminals at its end portions, and the electromagnetic resonance coupler 100 is appropriately electrically connected with the transmission circuit 201 and the receiving circuit 202.

Figure 11A:
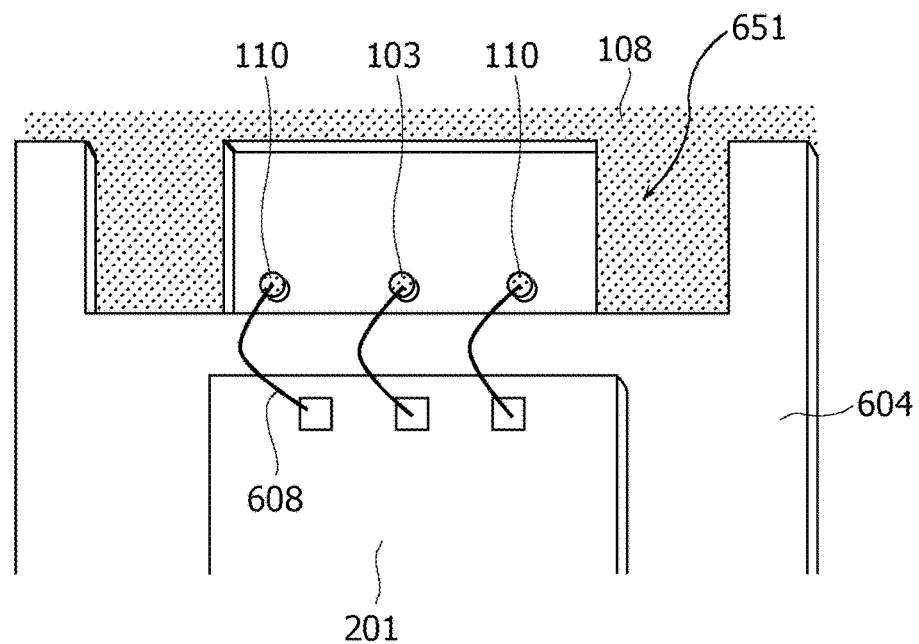
FIG. 11A is an enlarged view of a portion in the vicinity of a notch provided in a first lead frame.

For example, when a notch 651 is provided in the first lead frame 604, the input terminal 103 and the sending-side ground terminals 110 of the electromagnetic resonance coupler 100 can be wire-bonded without directly contacting the first lead frame 604. FIG. 11A is an enlarged view of a portion in the vicinity of the notch 651 provided in the first lead frame 604.

Figure 11B:
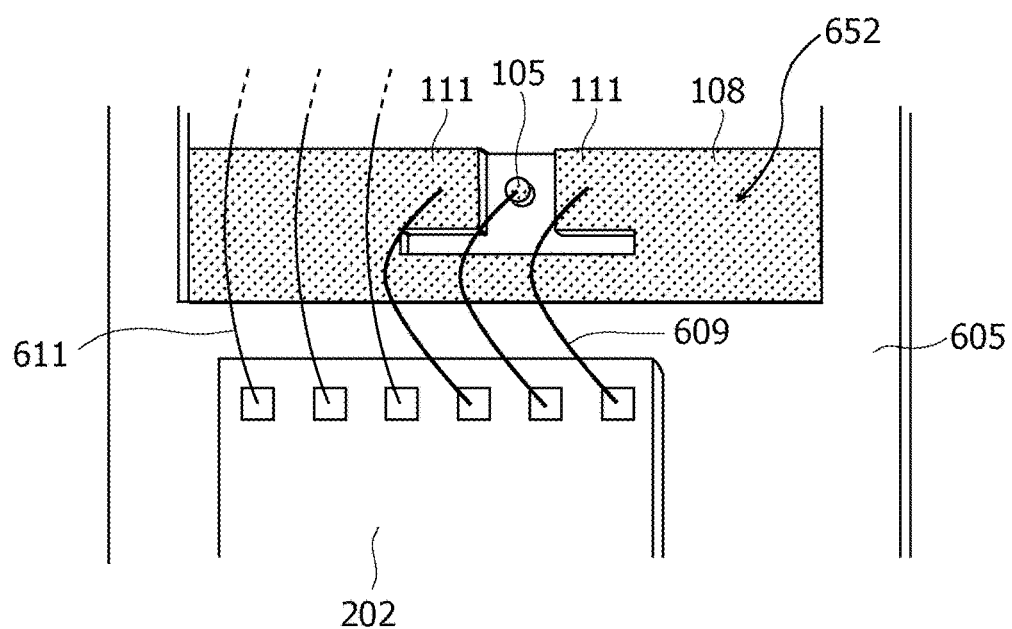
FIG. 11B is an enlarged view in the vicinity of a gap provided in a second lead frame.

Also, when a gap 652 is provided in the second lead frame 605, the output terminal 105 and the receiving-side ground terminals 111 of the electromagnetic resonance coupler 100 can be wire-bonded without directly contacting the second lead frame 605. FIG. 11B is an enlarged view of a portion in the vicinity of the gap 652 provided in the second lead frame 605.

As described above, in the present disclosure, the arrangement of the terminals of the electromagnetic resonance coupler and the shapes and so on of the lead frame portions are not particularly limiting.

If the second ground shield 108 in the electromagnetic resonance coupler 100 contacts each of the first lead frame 604 and the second lead frame 605, ground for the transmission circuit 201 and ground for the receiving circuit 202 become the same, which is not desirable. Accordingly, it is desirable that an insulating adhesive material be used as the die-attach material for the electromagnetic resonance coupler 100. This can ensure the insulation between the first lead frame 604 and the second lead frame 605.

Also, there are cases in which a sufficient isolation voltage cannot be ensured depending on the insulating adhesive material. In such cases, the electromagnetic resonance coupler 100 may further have an insulating layer (or a dielectric layer) that covers the second ground shield 108, as in the electromagnetic resonance coupler 100a.

The signal transmission device 10b has a feature that the second major surface 604b of the first lead frame 604 has a heatsink 630. The heatsink 630 is located below the transmission circuit 201. Thus, when viewed in a direction orthogonal to the first major surface 604a, the heatsink 630 and the transmission circuit 201 overlap each other.

Also, the heatsink 630 is partly exposed from the sealant 620. Specifically, the heatsink 630 is exposed from a lower surface of the sealant 620 and can directly contact the circuit board. The heatsink 630 is formed of, for example, copper or may be formed of other metal. Also, the heatsink 630 may be a unit independent from the first lead frame 604 or may be integrally formed with the first lead frame 604.

[Advantages Obtained by Signal Transmission Device According to Third Embodiment]

When the signal transmission device 10b is mounted on a circuit board, most of heat generated in the transmission circuit 201 is released to the circuit board via the heatsink 630. That is, the heatsink 630 can significantly reduce the heat resistance.

However, there are cases in which it is difficult to miniaturize the signal transmission device 10b having the heatsink 630. In such cases, it is desirable that an optimum structure be appropriately selected in order to achieve both the miniaturization and an improvement in the heat-release characteristic.

In the signal transmission device 10b, the heatsink 630 and the electromagnetic resonance coupler 100 are located with a gap 640 therebetween. This facilitates that the filling with the sealant 620 without a gap when the electromagnetic resonance coupler 100 is sealed with the sealant 620. Any gap that is generated during the sealing can cause a failure or cause a reduction in yield. However, when the filled with the sealant 620 is performed without a gap, the rate of occurrence of failures in the signal transmission device 10b decreases.

Figure 12:
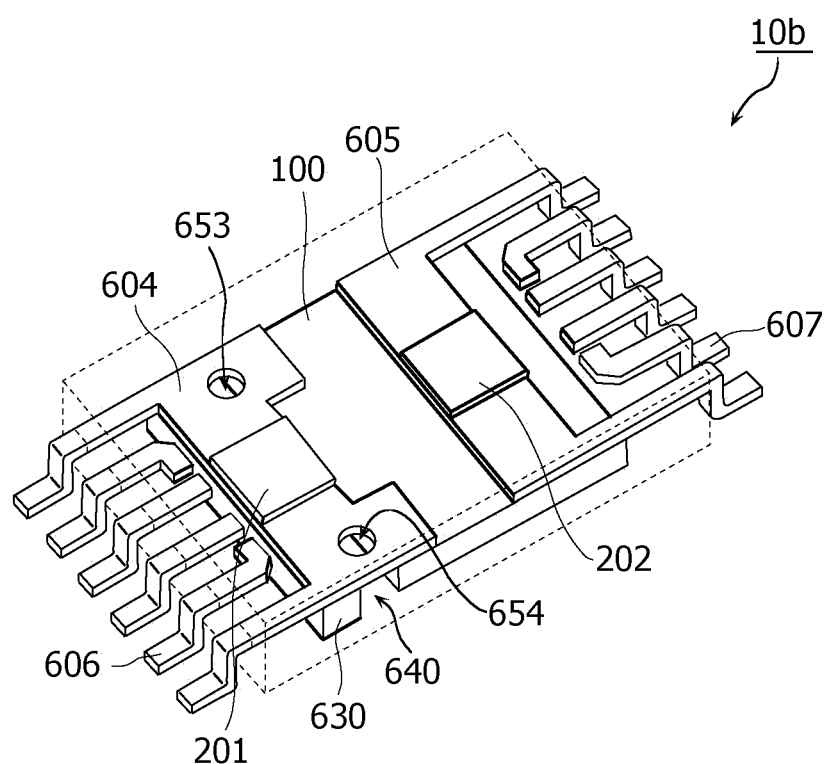
FIG. 12 is a perspective view illustrating the internal structure of the signal transmission device having the first lead frame in which openings are provided.

Also, in order to increase the filling rate of the sealant 620, the first lead frame 604 may be provided with openings 653 and 654 that communicate with the gap 640 between the electromagnetic resonance coupler 100 and the heatsink 630. FIG. 12 is a perspective view illustrating the internal structure of the signal transmission device 10b having the first lead frame 604 in which the openings 653 and 654 are provided. Since such openings serve as air vent holes during filling of the sealant 620, the gap 640 can be sufficiently filled with the sealant 620.

The second lead frame 605 may also be provided with similar openings. That is, at least one of the first lead frame 604 and the second lead frame 605 is provided with the openings that communicate with the gap between the electromagnetic resonance coupler 100 and the heatsink 630. The number of openings is at least one and may be two or more. The arrangement of the opening(s) is not particularly limiting.

Also, when it is desirable to further improve the heat-release characteristic, it is desirable that the structure of the lead frame portion 600 be adjusted.

For example, the external terminals located at four corners of the lead frame portion 600 are external terminals (e.g., ground terminals) that mainly assume a role of heat release, and the number of such external terminals may be increased. When the number of such external terminals for heat release increases, the heat-release characteristic improves.

However, the spacing of the external terminals is predetermined. The arrangement spacing of the external terminals is, for example, 1.27 mm (the width of the external terminals is 0.5 mm and the spacing between the external terminals is 0.77 mm). Thus, when the number of external terminals for heat release increases, the number of external terminals increases correspondingly, and thus the size of the signal transmission device 10b may increase.

Accordingly, the width of only the external terminals for heat release may be increased relative to the width of the other external terminals, or the other external terminals may also be replaced with external terminals for heat release.

A scheme for improving the heat-release characteristic is not limited to a scheme as described above. For example, the upper surface of the sealant 620 may be provided with a heat-dissipation fin.

Fourth Embodiment

Figure 13:
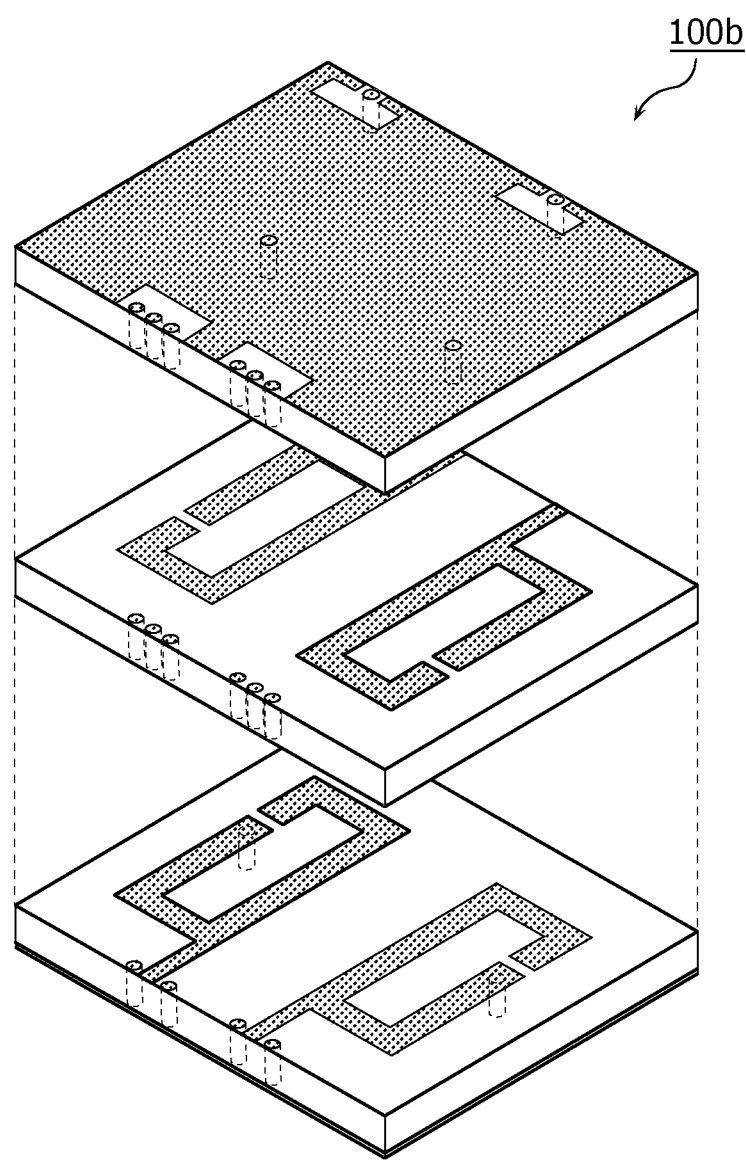
FIG. 13 is an exploded perspective view of an electromagnetic resonance coupler including two pairs each consisting of a first resonator and a second resonator.

Although, in the first to third embodiments described above, the signal transmission device includes one pair of the first resonator and the second resonator, the signal transmission device may include two or more pairs each consisting of the first resonator and the second resonator. More specifically, the signal transmission device may include a plurality of electromagnetic resonance couplers, each having a pair of a first resonator and a second resonator, or may include one electromagnetic resonance coupler having two or more pairs each consisting of the first resonators and the second resonator. FIG. 13 is an exploded perspective view of an electromagnetic resonance coupler including two pairs each consisting of the first resonator and the second resonator.

For example, a motor drive circuit requires a circuit for a high-side isolator and a circuit for a low-side isolator during drive of a power switch. That is, the motor drive circuit requires two pairs each consisting of the first resonator and the second resonator.

Accordingly, when the electromagnetic resonance coupler 100b illustrated in FIG. 13 is incorporated into one signal transmission device, one electromagnetic resonance coupler isolator circuit can control the high-side power switch and the low-side power switch.

Figure 14:
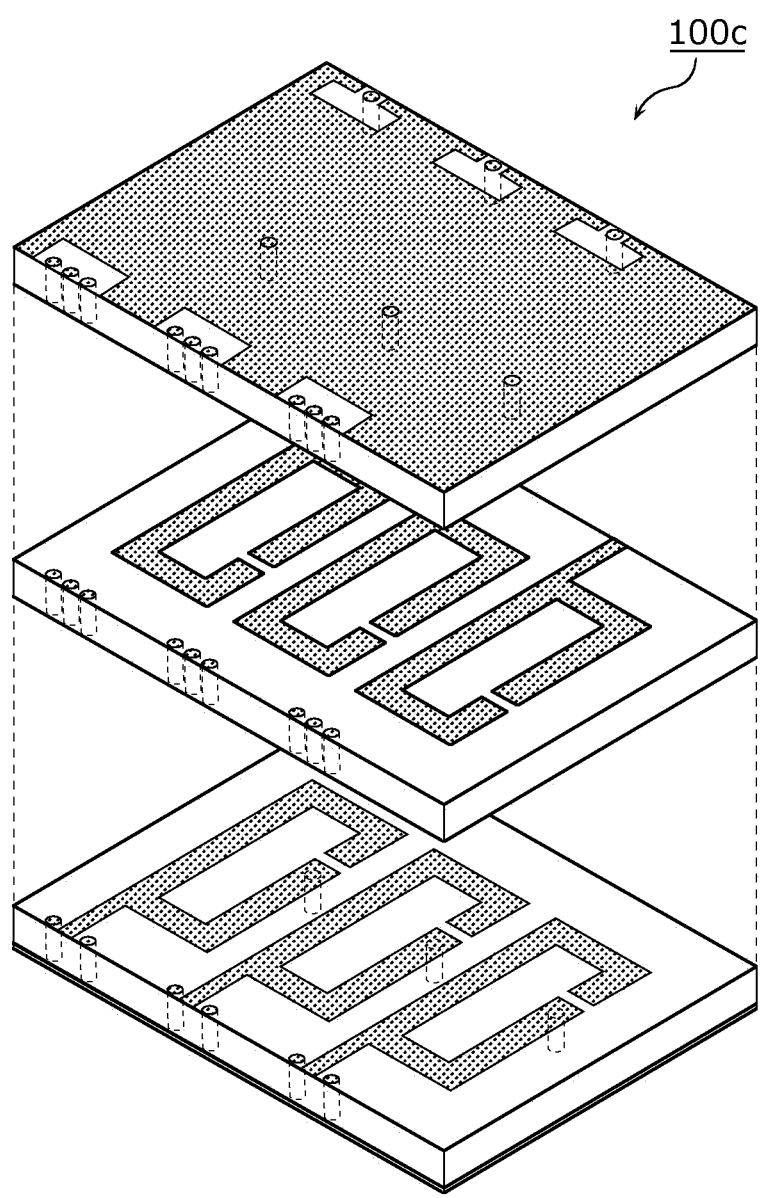
FIG. 14 is an exploded perspective view of an electromagnetic resonance coupler including three pairs each consisting of the first resonator and the second resonator.

In the motor drive circuit described above, there are cases in which, in addition to a switch control signal, power or another control signal is further transmitted. In such cases, the signal transmission device may include one electromagnetic resonance coupler having three or more pairs each consisting of the first resonator and the second resonator. FIG. 14 is an exploded perspective view of an electromagnetic resonance coupler 100c having three pairs each consisting of the first resonator and the second resonator.

Fifth Embodiment

A result of heat release simulation (i.e., heat conduction analysis) of the signal transmission device 10, the signal transmission device 10a, and the signal transmission device 10b will be described below as a fifth embodiment. The heat release simulation is also performed on a signal transmission device according to a second comparative example in addition to the above-described three types of signal transmission device.

[Internal Structure of Signal Transmission Device According to Second Comparative Example]

Figure 15A:
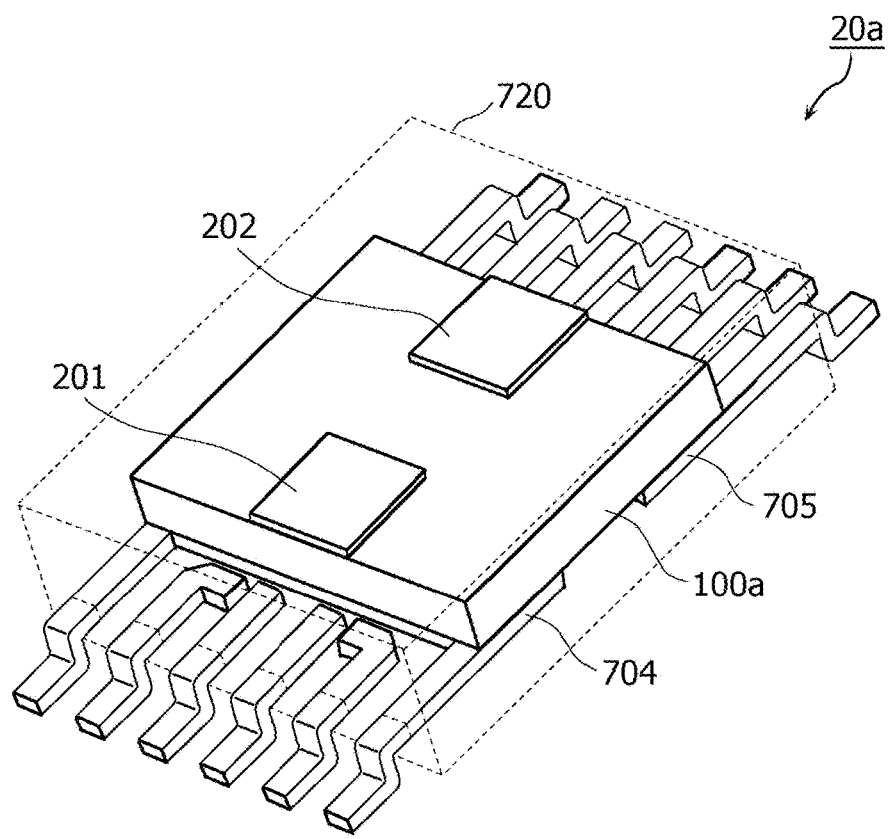
FIG. 15A is a perspective view illustrating the internal structure of a signal transmission device according to a second comparative example.
Figure 15B:
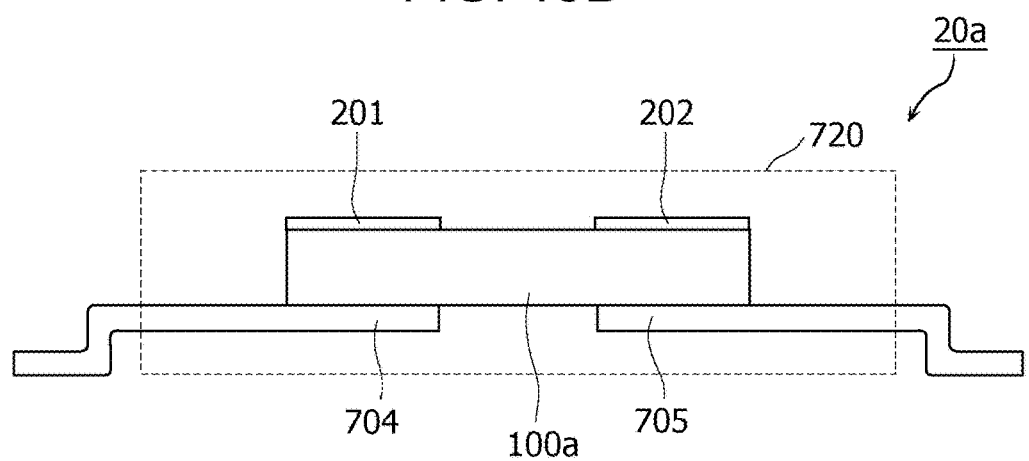
FIG. 15B is a side view illustrating the internal structure of the signal transmission device according to the second comparative example.

First, a description will be given of the internal structure of a signal transmission device according to the second comparative example. FIG. 15A is a perspective view illustrating the internal structure of the signal transmission device according to the second comparative example. FIG. 15B is a side view illustrating the internal structure of the signal transmission device according to the second comparative example.

As illustrated in FIGS. 15A and 15B, a signal transmission device 20a according to the second comparative example includes a first lead frame 704, a second lead frame 705, the transmission circuit 201, the receiving circuit 202, the electromagnetic resonance coupler 100a, and a sealant 720.

The electromagnetic resonance coupler 100a is located across between an upper surface of the first lead frame 704 and an upper surface of the second lead frame 705. The transmission circuit 201 and the receiving circuit 202 are located on an upper surface of the electromagnetic resonance coupler 100a. That is, the electromagnetic resonance coupler 100a is located between the sending and receiving circuits 201 and 202 and the first and second lead frames 704 and 705. In FIGS. 15A and 15B, metal wires and so on are not illustrated.

[Conditions for Heat Release Simulation]

Next, a description will be given of conditions for the heat release simulation. In the heat release simulation, the ambient temperature is 20° C. In addition, in the heat release simulation, the temperature of the transmission circuit 201 and the temperature of the receiving circuit 202 are calculated assuming that 1 W power is supplied to the transmission circuit 201, and 0.3 W power is supplied to the receiving circuit 202. In the simulation, each of the transmission circuit 201 and the receiving circuit 202 is a square that is 2 mm on each side, and each of the transmission circuit 201 and the receiving circuit 202 has a thickness of 0.15 mm.

The size of the electromagnetic resonance coupler 100 and the size of the electromagnetic resonance coupler 100a are each 6.85×6.00 mm, and the thickness of the electromagnetic resonance coupler 100 and the thickness of the electromagnetic resonance coupler 100a are each 1.00 mm. All signal transmission devices have the same number of external terminals, that is, a total of 12 external terminals, with six external terminals for each side.

Analysis conditions for each signal transmission device in the heat release simulation will be described below with reference to Tables 1 and 2. Table 1 illustrates material parameters used in the analysis, and Table 2 illustrates the dimensions of the signal transmission device 10 according to the first embodiment, the signal transmission device 10a according to the second embodiment, the signal transmission device 10b according to the third embodiment, and the signal transmission device 20a according to the second comparative example in the heat release simulation.

TABLE 1

Material Parameters Used in Analysis

| Product Name | Material | Density [kg/m³] | Specific Heat [J/kgK] | Heat Conductivity [W/mK] |
|---|---|---|---|---|
| Transmission Circuit and Receiving Circuit (Chip) | Silicon | 2330 | 705 | 150 |
| Lead Frame Portion | Copper | 8960 | 384 | 401 |
| Electromagnetic Resonance Coupler | 4 PCB layers | 2145 | 1136 | 0.25 (Inside Surface) 16.5 (Outside Surface) |
| Sealant | Resin | 1000 | 1000 | 0.88 |

TABLE 2

Dimensions of Each Signal Transmission Device

| | Size of Sealant [mm²] | Thickness of Sealant [mm] | Distance from Lead Frame Lower Surface to Sealant Lower Surface [mm] |
|---|---|---|---|
| Embodiment 1 | 7.85 × 9.70 | 2.65 | 1.2 |
| Embodiment 2 | 7.85 × 9.70 | 2.65 | 0.6 |
| Embodiment 3 | 7.85 × 11.70 | 2.65 | 1.2 |
| Comparative Example 2 | 7.85 × 9.70 | 2.65 | 0.6 |

[Analysis Conditions for Signal Transmission Device According to First Embodiment]

A boundary condition for the signal transmission device 10 illustrated in FIGS. 6A and 6B is that the temperature of the lower surfaces of the external terminals and the lower surface of the sealant 320 is 20° C. The metal wires are disregarded, and only the heat-release characteristic is considered. The size of the sealant 320 is 7.85×9.70 mm², and the thickness of the sealant 320 is 2.65 mm. The distance from the lower surface of the first lead frame 304 and the lower surface of the second lead frame 305 to the lower surface of the sealant 320 is 1.2 mm.

[Analysis Conditions for Signal Transmission Device According to Second Embodiment]

A boundary conditions for the signal transmission device 10a illustrated in FIGS. 9A and 9B is that the temperature of the lower surfaces of the external terminals and the lower surface of the sealant 520 is 20° C. The metal wires are disregarded, and only the heat-release characteristic is considered. The size of the sealant 520 is 7.85×9.70 mm², and the thickness of the sealant 520 is 2.65 mm. The distance from the lower surface of the first lead frame 504 and the lower surface of the second lead frame 505 to the lower surface of the sealant 520 is 0.6 mm.

[Analysis Conditions for Signal Transmission Device According to Third Embodiment]

A boundary condition for the signal transmission device 10b illustrated in FIGS. 10A and 10B is that the temperature of the lower surfaces of the external terminals and the lower surface of the sealant 620 is 20° C. The metal wires are disregarded, and only the heat-release characteristic is considered. The size of the sealant 620 is 7.85×11.70 mm², and the thickness of the sealant 620 is 2.65 mm. The size of the sealant 620 is made larger than the sealants 320 and 520, considering the heatsink 630 and the gap 640. The distance from the lower surface of the first lead frame 604 and the lower surface of the second lead frame 605 to the lower surface of the sealant 620 is 1.2 mm.

[Analysis Conditions for Signal Transmission Device According to Second Comparative Example]

A boundary condition for the signal transmission device 20a illustrated in FIGS. 15A and 15B is that the temperature of the lower surface of the external terminals and the lower surface of the sealant 720 is 20° C. The metal wires are disregarded, and only the heat-release characteristic is considered. The size of the sealant 720 is 7.85×9.70 mm², and the thickness of the sealant 720 is 2.65 mm. The distance from the lower surface of the first lead frame 704 and the lower surface of the second lead frame 705 to the lower surface of the sealant 720 is 0.6 mm.

In the signal transmission device 20a, it is assumed that a contact thermal resistance exists between the transmitting and receiving circuits 201 and 202 and the electromagnetic resonance coupler 100a.

[Result of Heat Release Simulation]

Next, a result of the heat release simulation will be described with reference to Table 3. Table 3 illustrates a result of the heat release simulation. Specifically, Table 3 illustrates the temperature of the transmission circuit 201 in the heat release simulation and the temperature of the receiving circuit 202 in the heat release simulation.

TABLE 3

Result of Heat release simulation

| | Temperature of Transmission Circuit | Temperature of Receiving Circuit |
|---|---|---|
| Embodiment 1 | 39.9° C. | 26.9° C. |
| Embodiment 2 | 34.9° C. | 24.9° C. |
| Embodiment 3 | 21.2° C. | 27.3° C. |
| Comparative Example 2 | 55.9° C. | 31.8° C. |

It is thought that the signal transmission device 20a according to the second comparative example can be miniaturized to a degree equivalent to that of the signal transmission device 10 and the signal transmission device 10a. However, the heat-release characteristic of the signal transmission device 20a is the worst. A cause for the poor heat-release characteristic is thought to be that the electromagnetic resonance coupler 100a, which has a higher heat resistance than those of the first lead frame 704 and the second lead frame 705, is interposed between the sending and receiving circuits 201 and 202 and the first and second lead frames 704 and 705.

Also, the signal transmission device 20a has two interfaces between the sending and receiving circuits 201 and 202 and the first and second lead frames 704 and 705. The two interfaces are constituted by an interface between the transmitting and receiving circuits 201 and 202 and the electromagnetic resonance coupler 100a and an interface between the electromagnetic resonance coupler 100a and the first and second lead frames 704 and 705. Thus, there is a concern that the contact thermal resistance becomes larger than those of the signal transmission device 10, the signal transmission device 10a, and the signal transmission device 10b, each having only an interface as described above.

Although the signal transmission device 20a can be miniaturized, as described above, there is a possibility that the heat-release characteristic deteriorates. In other words, the signal transmission device 10, the signal transmission device 10a, and the signal transmission device 10b have a heat-release characteristic that is superior to the signal transmission device 20a. This is thought to be because both the sending and receiving circuits 201 and 202 and the electromagnetic resonance coupler directly contact the lead frame portion having a low heat resistance.

It is also thought that the signal transmission devices 10 and 10a can be miniaturized to a degree equivalent to the miniaturization in the second comparative example. That is, it can be said that the signal transmission devices 10 and 10a can realize both the miniaturization and an improvement in the heat-release characteristic.

Also, when the signal transmission device 10 according to the first embodiment is compared with the signal transmission device 10a according to the second embodiment, the signal transmission device 10a has a superior heat-release characteristic. It is thought that the heat resistance of the signal transmission device 10a is reduced by about 25% compared with the signal transmission device 10. This is thought to be due to the small lengths of the external terminals and due to the small distance between the sending and receiving circuits 201 and 202 and the lower surface of the sealant 520.

As described above, the signal transmission device 10a can be miniaturized to a degree equivalent to that of the signal transmission device 10 and also has a heat-release characteristic that is superior to the signal transmission device 10.

The signal transmission device 10b is useful in order to obtain a far superior heat-release characteristic. Although there is a concern that the size of the signal transmission device 10b increases, it has room for further miniaturization, for example, through arrangement of the heatsink 630.

Sixth Embodiment

[Issue in Enhancing Heat-Release Characteristic]

As described above, the signal transmission device 10b is miniaturized and is improved in the heat-release characteristic, compared with the signal transmission device 20 according to the first comparative example. As illustrated in the heat release simulation result in Table 3, the signal transmission device 10b has, specifically, the heatsink 630 to thereby significantly reduce the heat resistance. However, the structure of the signal transmission device 10b has an issue in mass production cost.

The heatsink 630 having a convex shape needs to be formed in the lead frame portion 600 in order to realize the structure of the signal transmission device 10b. That is, the lead frame portion 600 in the signal transmission device 10b has a three-dimensional shape, not a two-dimensional shape.

In general, the lead frame portion 600 is fabricated using a mold with which a large number of lead frame portions 600 can be fabricated at a time. This reduces the mass production cost. When the structure of the lead frame portion 600 becomes complicated, there is a possibility that special work is needed on the mold or the number of molds increases. Also, there is a concern that the yield (or the rate of defects) of the lead frame portion 600 deteriorates, and it is thought that the mass production cost is likely to increase.

On the other hand, the signal transmission device 10a, which does not have the heatsink 630, is superior in terms of mass production, since the signal transmission device 10a includes the lead frame portion 500 that has a two-dimensional shape and that does not have a convex shape like the heatsink 630. Also, in the signal transmission device 10a, the transmission circuit 201 and the receiving circuit 202 are located on a lower surface of the lead frame portion 500. Thus, when the signal transmission device 10a is mounted on a circuit board, heat generated in the transmission circuit 201 and the receiving circuit 202 is mainly released from two paths, that is, a path that goes through the sealant 520 and a path that goes through the lead frame portion 500, to the circuit board.

Hence, in the signal transmission device 10a, a relatively small heat resistance is realized. The signal transmission device 10a, however, has disadvantages in heat release, compared with the signal transmission device 20 according to the first comparative example. In particular, one disadvantage is thought to be that the advantage of the heat diffusion by the lead frame portion 500 is small.

In the signal transmission device 10a, the transmission circuit 201 serves as a main heat-generating body. This is because circuits, such as an oscillator, a mixer, and an amplifier circuit, that consume a large amount of current are incorporated into the transmission circuit 201. Hence, the first lead frame 504 on which the transmission circuit 201 is located plays a large role in order to improve the heat-release characteristic of the signal transmission device 10a.

In this case, the size (area) of the first lead frame 204 included in the signal transmission device 20 is larger than the size of the first lead frame 504 included in the signal transmission device 10a, as illustrated in FIGS. 5A, 5B, 9A, and 9B. More specifically, the size of the first lead frame 504 is one-third or less of the size of the first lead frame 204.

In the signal transmission device 20, heat generated in the transmission circuit 201 diffuses throughout the first lead frame 204 and is released via the entire sealant 220 that is in contact with the first lead frame 204. This heat diffusion reduces the heat resistance of the entire sealant 220.

Not only the first lead frame 204, but also the sealant 220, the metal wires 208, the metal wire 210, and so on are connected to the transmission circuit 201. Thus, the heat release is also performed via these members. However, heat generated in the transmission circuit 201 is mostly released (diffused) via the first lead frame 204. This is because the first lead frame 204 has a low heat resistance since it is formed of highly heat-conductive material, such as copper, and is large in size.

On the other hand, the area of the first lead frame 504 is one-third or less of the area of the first lead frame 204 and is thus small. Thus, heat generated in the transmission circuit 201 in the signal transmission device 10a does not spread through the entire sealant 520 and remains in the vicinity of the transmission circuit 201.

In the signal transmission device 10a, it is desirable that a heat diffusion structure that is thermally connected to the first lead frame 204 be provided in the signal transmission device 10a in order to further enhance the heat-release characteristic.

However, when such a heat diffusion structure is added, the number of assembly processes increases in the manufacturing process of the signal transmission device 10a, and thus the mass production cost increases.

[Structure of Electromagnetic Resonance Coupler According to Sixth Embodiment]

Figure 16:
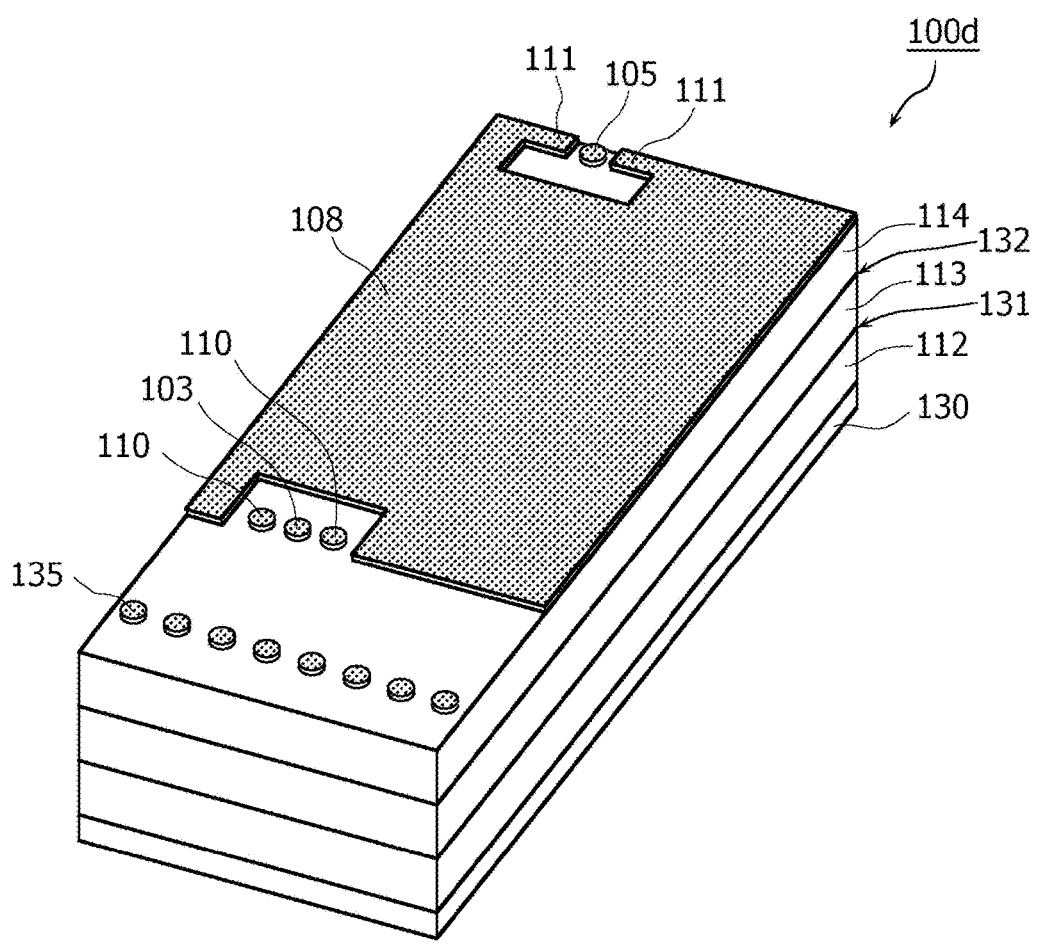
FIG. 16 is an external perspective view of an electromagnetic resonance coupler according to a sixth embodiment.
Figure 17A:
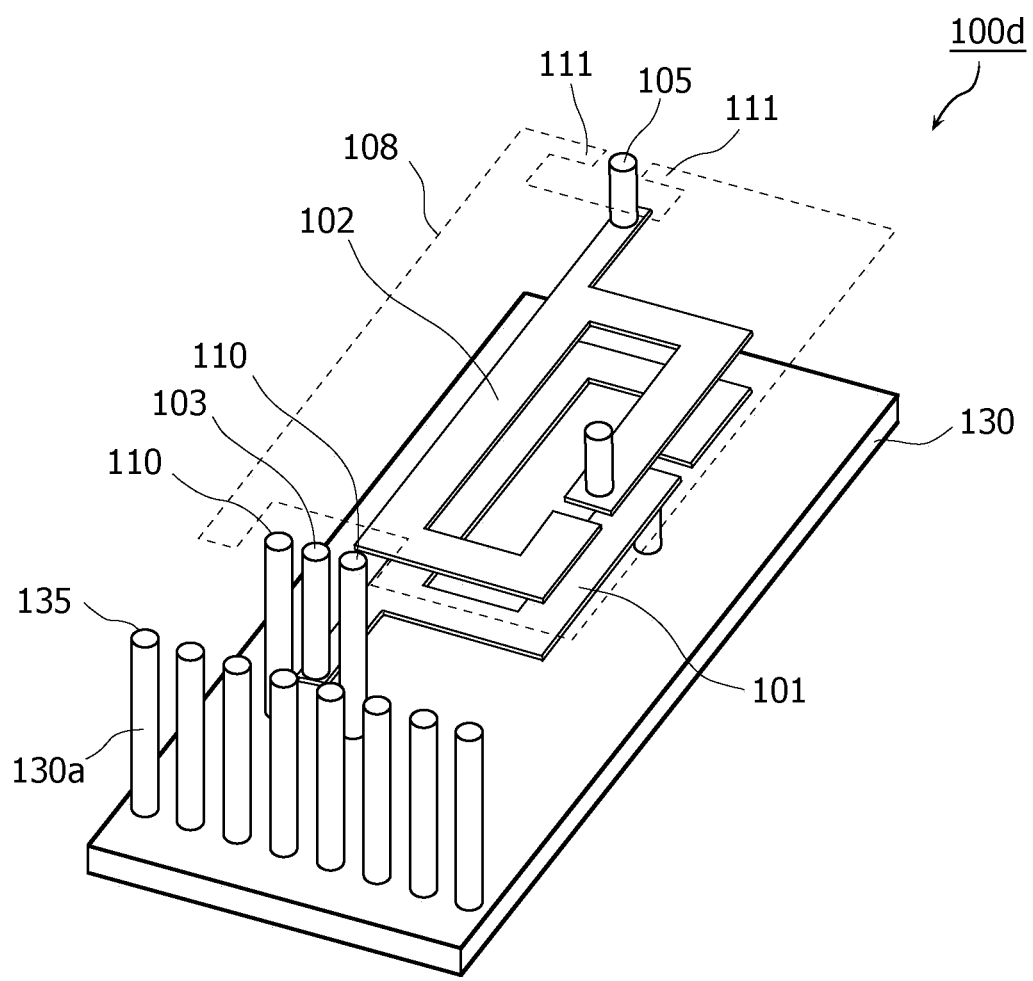
FIG. 17A is a first perspective view of a wiring structure and a heat diffusion structure of the electromagnetic resonance coupler according to the sixth embodiment.
Figure 17C:
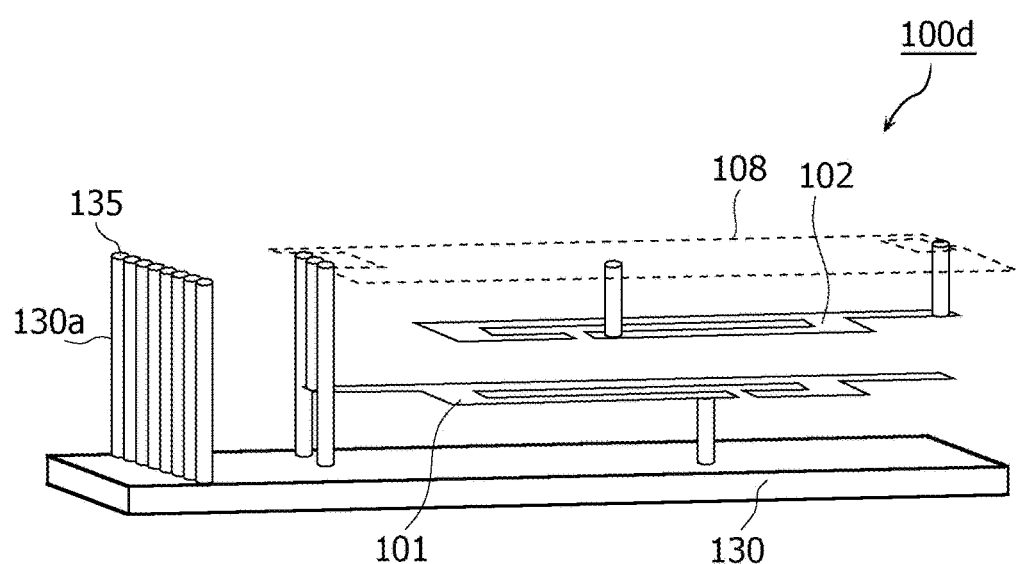
FIG. 17C is a third perspective view illustrating the wiring structure and the heat diffusion structure of the electromagnetic resonance coupler according to the sixth embodiment.

Accordingly, in the signal transmission device 10a, use of an electromagnetic resonance coupler having a structure for diffusing heat generated in the transmission circuit 201, instead of the electromagnetic resonance coupler 100, is conceivable to suppress an increase in the number of assembly processes and to enhance the heat-release characteristic. The following description will be given of the structure of such an electromagnetic resonance coupler. FIG. 16 is an external perspective view of an electromagnetic resonance coupler according to a sixth embodiment. FIGS. 17A to 17C are perspective views illustrating a wiring structure and a heat diffusion structure of the electromagnetic resonance coupler according to the sixth embodiment. Differences from the electromagnetic resonance coupler 100 will be mainly described below.

As illustrated in FIG. 16, an electromagnetic resonance coupler 100d has a structure in which three dielectric layers constituted by the dielectric layers 112, 113, and 114 are stacked, as in the electromagnetic resonance coupler 100. A first metal layer 131 in which the first resonator 101 is formed is located between the dielectric layers 112 and 113. A second metal layer 132 in which the second resonator 102 is formed is located between the dielectric layers 113 and 114. The second ground shield 108 (indicated by a dashed line in FIGS. 17A to 17C) is provided on the upper surface of the dielectric layer 114. The second ground shield 108 is a metal film (a metal layer) that has the same potential as that of ground for the receiving circuit 202.

As illustrated in FIGS. 16 and 17A to 17C, the electromagnetic resonance coupler 100d has a heat diffusion layer 130 on the lower surface of the dielectric layer 112.

The heat diffusion layer 130 is thermally connected to the first lead frame 504 when the electromagnetic resonance coupler 100d is mounted on the first lead frame 504. Thus, heat generated in the transmission circuit 201 is released to the heat diffusion layer 130, which is included in the electromagnetic resonance coupler 100d, via the first lead frame 504. Although the heat diffusion layer 130 is formed of, for example, copper, it may be formed of other metal.

The signal transmission device 10b, which includes the electromagnetic resonance coupler 100d instead of the electromagnetic resonance coupler 100, suppresses an increase in the mass production cost and has an enhanced heat-release characteristic. In addition, the signal transmission device 10b, which includes the electromagnetic resonance coupler 100d, can be easily miniaturized.

The heat diffusion layer 130 also functions as a ground shield. That is, the electromagnetic resonance coupler 100d has the heat diffusion layer 130 as a ground shield for the electromagnetic resonance coupler 100d. More specifically, the electromagnetic resonance coupler 100d has the heat diffusion layer 130 as a first ground shield that has the same potential as that of ground for the transmission circuit 201.

It is desirable that the thickness of the heat diffusion layer 130 be larger than any of the thickness of the first metal layer 131, the thickness of the second metal layer 132, and the thickness of the second ground shield 108. For example, when each of the thickness of the first metal layer 131, the thickness of the second metal layer 132, and the thickness of the second ground shield 108 is 18 μm (0.5 oz), for example, the thickness of the heat diffusion layer 130 is, desirably, 36 μm (1 oz) or more, and is more desirably, 105 μm (3 oz) or more. That is, the thickness of the heat diffusion layer 130 may be, specifically, five times or more of that of the other metal films (i.e., the metal layers).

When the thickness of the heat diffusion layer 130 is increased in such a manner, the heat diffusion can be improved, and the heat resistance characteristic can be reduced.

Heat transportation terminals 135 are provided on the upper surface of the electromagnetic resonance coupler 100d. Each of the heat transportation terminals 135 is one example of a second terminal and is directly connected to the first lead frame 504 in order to provide thermal connection between the heat diffusion layer 130 and the first lead frame 504. Each heat transportation terminals 135 is a terminal that is different from any of the input terminal 103, the sending-side ground terminals 110, the output terminal 105, and the receiving-side ground terminals 111. Each of the input terminal 103 and the sending-side ground terminals 110 is one example of a first terminal and serves to provide electrical connection between the electromagnetic resonance coupler 100d and the transmission circuit 201. The heat transportation terminals 135 are connected to the heat diffusion layer 130 via seventh vias 130a.

The seventh vias 130a each have a conductive via structure that penetrates the dielectric layers 112, 113, and 114 at one end portion of the electromagnetic resonance coupler 100d. The seventh vias 130a provide connection between the heat diffusion layer 130 and the heat transportation terminals 135. In other words, the heat diffusion layer 130 is thermally connected to the first lead frame 504 via the heat transportation terminals 135 and the seventh vias 130a.

Although it is sufficient that the electromagnetic resonance coupler 100d includes at least one pair of the heat transportation terminal 135 and the seventh via 130a for one heat diffusion layer 130, the electromagnetic resonance coupler 100d may include a plurality of pairs thereof. When the electromagnetic resonance coupler 100d includes a plurality of pairs each consisting of the heat transportation terminal 135 and the seventh via 130a for one heat diffusion layer 130, heat generated in the transmission circuit 201 is efficiently diffused to the heat diffusion layer 130 via the first lead frame 504.

The second ground shield 108 is located on the upper surface of the dielectric layer 114, avoiding the heat transportation terminals 135. This makes it possible to suppress electrical contact between the heat transportation terminals 135 and the second ground shield 108.

The arrangement of the heat transportation terminals 135 (and the seventh vias 130a) in the electromagnetic resonance coupler 100d is one example. The heat transportation terminals 135 may be arbitrarily located in a range in which they do not contact the input terminal 103 and the second ground shield 108.

Figure 19A:
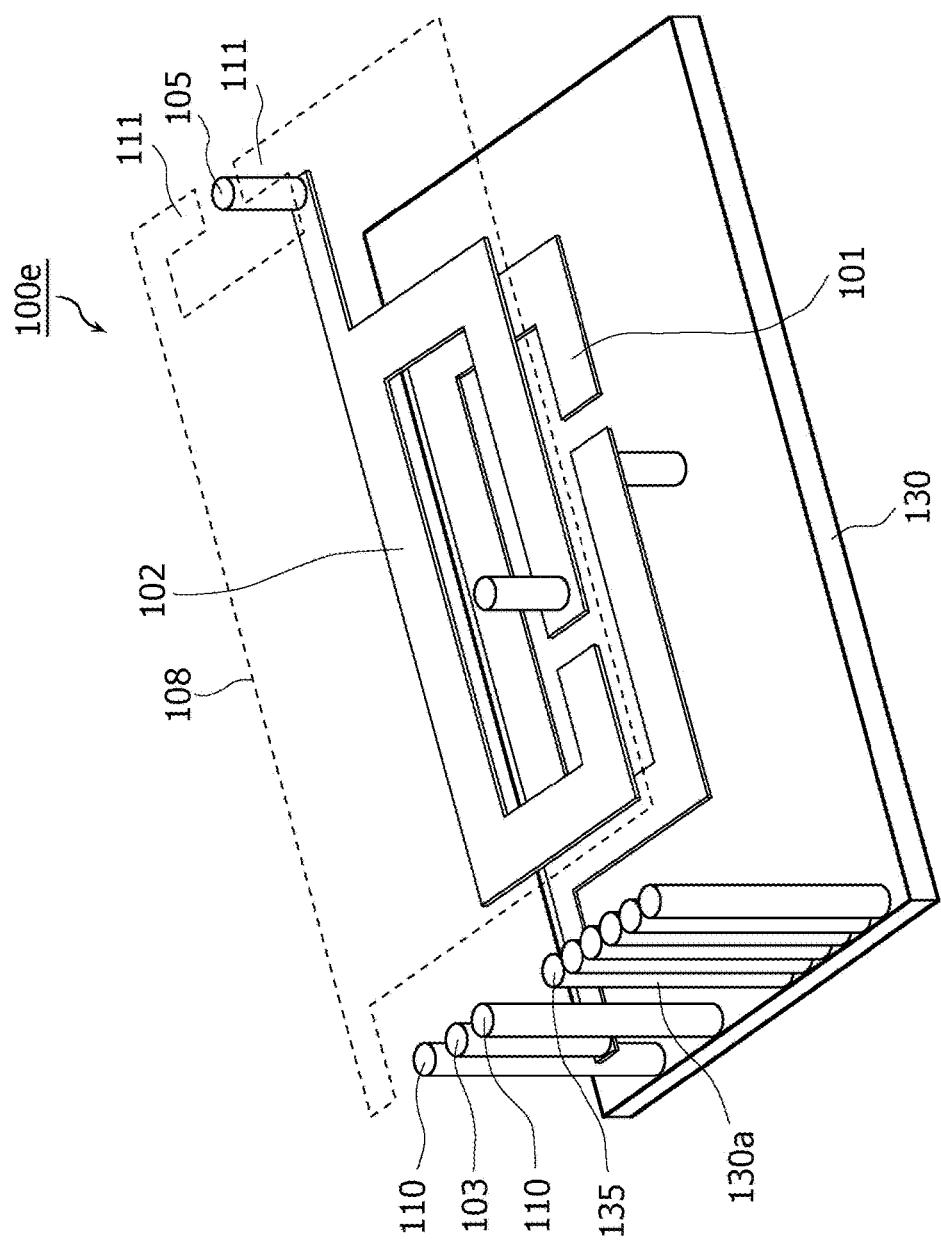
FIG. 19A is a perspective view illustrating the wiring structure and the heat diffusion structure of the electromagnetic resonance coupler having the heat transportation terminals aligned with the input terminal and the sending-side ground terminals.

In the electromagnetic resonance coupler 100d, since the heat transportation terminals 135 are located outside the input terminal 103 in the longitudinal direction, the longitudinal width of the electromagnetic resonance coupler 100*d* increases. Accordingly, for example, the heat transportation terminals 135 may be aligned in the traverse direction with the input terminal 103 and the sending-side ground terminals 110. FIG. 18 is an external perspective view of an electromagnetic resonance coupler having the heat transportation terminals 135 aligned with the input terminal 103 and the sending-side ground terminals 110. FIG. 19A is a view illustrating the wiring structure and the heat diffusion structure of the electromagnetic resonance coupler having the heat transportation terminals 135 aligned with the input terminal 103 and the sending-side ground terminals 110. FIG. 19B is a top view of the wiring structure and the heat diffusion structure of the electromagnetic resonance coupler having the heat transportation terminals 135 aligned with the input terminal 103 and the sending-side ground terminals 110. In FIGS. 19A and 19B, the second ground shield 108 is indicated by a dashed line.

An electromagnetic resonance coupler 100*e* illustrated in FIGS. 18, 19A, and 19B includes the heat transportation terminals 135, the seventh vias 130*a*, and the heat diffusion layer 130. The longitudinal width of the electromagnetic resonance coupler 100*e* is similar to that of the electromagnetic resonance coupler 100 and is smaller than the electromagnetic resonance coupler 100*d*.

[Manufacturing Method for Electromagnetic Resonance Coupler According to Sixth Embodiment]

Next, a description will be given of a manufacturing method for the electromagnetic resonance coupler 100*d*. The electromagnetic resonance coupler 100*e* is also fabricated by a similar manufacturing method. Differences from the manufacturing method for the electromagnetic resonance coupler 100 will be mainly described below.

The heat diffusion layer 130 is obtained by forming a metal film that is thicker than a typical film (i.e., the first ground shield 107) on the lower surface of the dielectric layer 112.

The dielectric layer 112 on which the heat diffusion layer 130 is formed and the dielectric layer 114 are bonded by pressing, with the dielectric layer 113 being interposed therebetween. This provides a bonded substrate having a thickness that is slightly larger than 1 mm.

Next, through-holes are formed in the bonded substrate by drilling, and the inner surfaces of the through-holes are subjected to metal plating (e.g., copper plating). This forms the first via 104, the second via 106, the third vias 109, the fourth via 107*a*, the fifth via 108*a*, and the seventh vias 130*a*.

Metal may be embedded in the through-hole of each seventh via 130*a*. The through-hole of each seventh via 130*a* may be filled with, for example, a conductive paste. Also, the through-hole of each seventh via 130*a* may be filled with highly heat-conductive metal, such as copper. When the through-hole of each seventh via 130*a* is filled with metal in such a manner, heat can be efficiently transmitted from the first lead frame 504 to the heat diffusion layer 130.

[Configuration of Signal Transmission Device According to Sixth Embodiment]

Figure 20A:
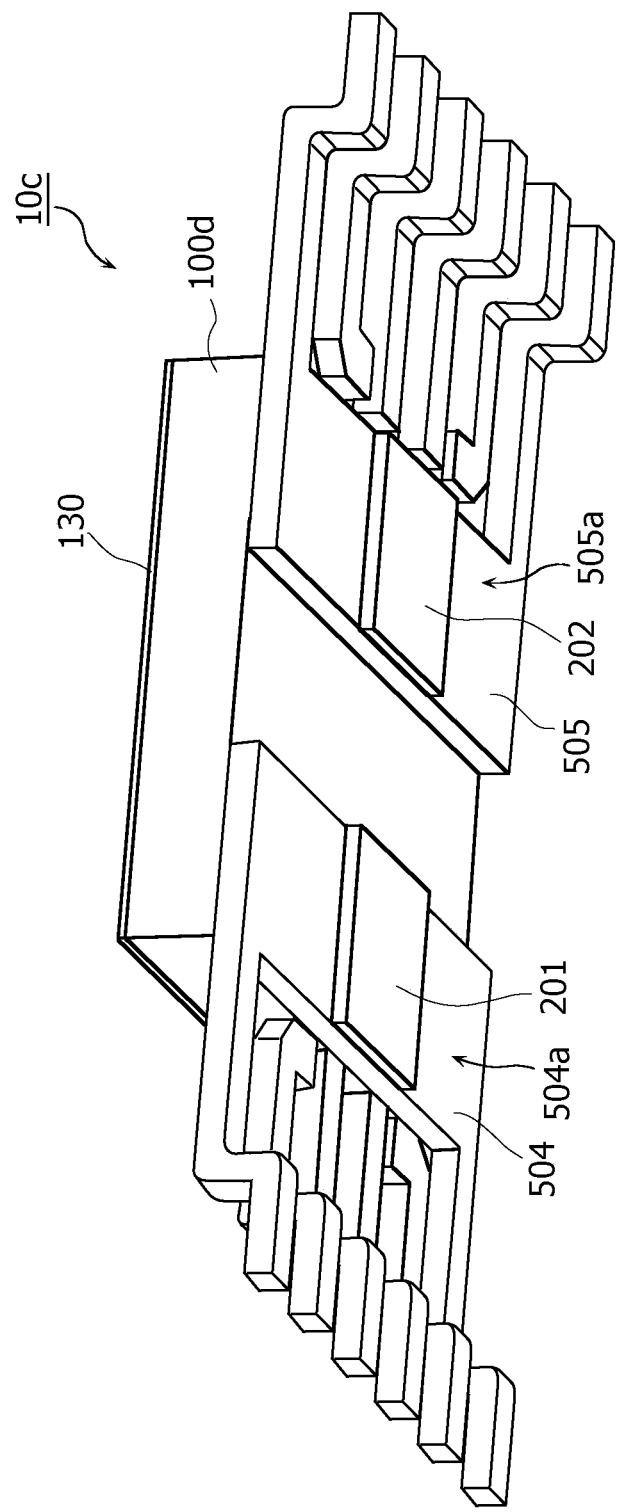
FIG. 20A is a first external perspective view the signal transmission device according to the sixth embodiment.
Figure 20B:
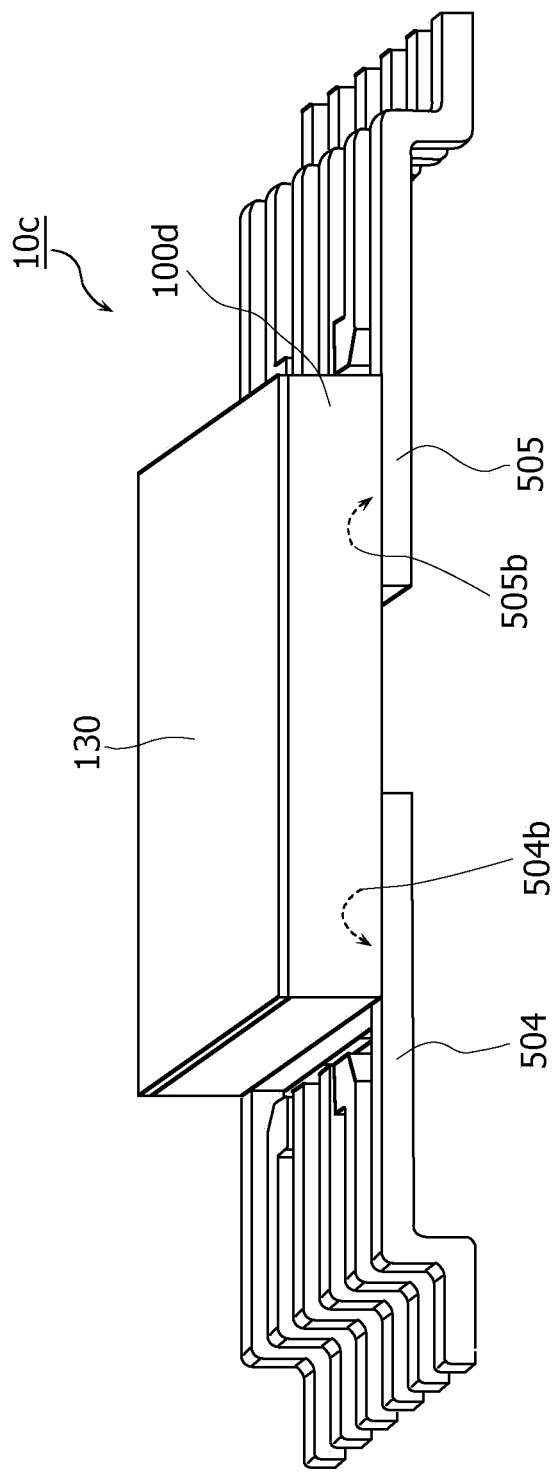
FIG. 20B is a second external perspective view of the signal transmission device according to the sixth embodiment.

A description will be given of the configuration of a signal transmission device including the electromagnetic resonance coupler 100*d* fabricated as described above. FIGS. 20A and 20B are external perspective views of a signal transmission device including the electromagnetic resonance coupler 100*d*. A signal transmission device including the electromagnetic resonance coupler 100*e* also has a similar configuration, and a description of the signal transmission device is not given hereinafter.

As illustrated in FIGS. 20A and 20B, a signal transmission device 10*c* has a configuration in which the electromagnetic resonance coupler 100*a* in the signal transmission device 10*a* according to the second embodiment is replaced with the electromagnetic resonance coupler 100*d*. In order to realize electrical connection using metal wires, it is desirable that, in practice, the electromagnetic resonance coupler 100*d* have the dielectric layer 115, and the input terminal 103 and so on be located at the center portion, as in the electromagnetic resonance coupler 100*a*.

The signal transmission device 10*c* includes, specifically, the first lead frame 504, the second lead frame 505, the transmission circuit 201, the receiving circuit 202, and the electromagnetic resonance coupler 100*d*. Although not illustrated in FIGS. 20A and 20B, the signal transmission device 10*c* includes a sealant. The transmission circuit 201 is die-bonded to the first major surface 504*a* of the first lead frame 504 by using a die-attach material, and the receiving circuit 202 is die-bonded to the first major surface 505*a* of the second lead frame 505 by using the die-attach material.

The electromagnetic resonance coupler 100*d*, specifically, its surface (i.e., the upper surface) on which the heat transportation terminals 135 are provided, is die-bonded to each of the second major surface 504*b* of the first lead frame 504 and the second major surface 505*b* of the second lead frame 505 by using the die-attach material. The die-attach material located between the first lead frame 504 and the electromagnetic resonance coupler 100*d* is applied so as to cover the heat transportation terminals 135. This makes it possible to promote heat transmission from the first lead frame 504 to the heat diffusion layer 130.

It is desirable that the die-attach material be formed of a low heat-resistive material (i.e., a high heat-conductive material). The die-attach material is, for example, a silver paste. Use of a low heat-resistive material as the die-attach material makes it possible to promote heat transmission from the first lead frame 504 to the heat diffusion layer 130.

Although, in the sixth embodiment described above, the heat diffusion layer 130 is located on the lower surface of the electromagnetic resonance coupler 100*d*, the heat diffusion layer 130 may be located on the upper surface of the electromagnetic resonance coupler 100*d*. In such a case, the heat diffusion layer 130 also functions as the second ground shield 108. Since the heat diffusion layer 130 is directly thermally connected to the second lead frame 505, the seventh vias 130*a* and the heat transportation terminals 135 are not necessary.

Also, when the position of the first resonator 101 and the position of the second resonator 102 are interchanged, the heat diffusion layer 130, which functions as the first ground shield, can be located on the upper surface of the electromagnetic resonance coupler 100*d*. In such a case, the heat diffusion layer 130 can be directly connected to the first lead frame 504, and thus the seventh vias 130*a* and the heat transportation terminals 135 are not necessary.

The signal transmission device 10*c* including the electromagnetic resonance coupler 100*d* as described above can transmit power and signals at low loss and has an improved heat-release characteristic. High-frequency signals in a wide variety of frequency bands, such as a microwave band or a millimeter wave band, are used to send/receive power and signals. The frequency band of the high-frequency signals is, specifically, for example, a frequency band of 2.4 GHz to 5.8 GHz.

[Advantages of Sixth Embodiment, Etc.]

As described above, the electromagnetic resonance coupler 100d further includes the heat diffusion layer 130 that is thermally connected to the first lead frame 504.

Such a heat diffusion layer 130 can diffuse heat generated in the transmission circuit 201 and transmitted via the first lead frame 504. That is, the heat diffusion layer 130 can enhance the heat-release characteristic of the signal transmission device 10c.

Also, the electromagnetic resonance coupler 100d may further have the input terminal 103, which provides electrical connection between the electromagnetic resonance coupler 100d and the transmission circuit 201, and the heat transportation terminals 135, which is different from the input terminal 103 and is directly connected to the first lead frame 504 to provide thermal connection between the heat diffusion layer 130 and the first lead frame 504. The input terminal 103 is one example of a first terminal, and each heat transportation terminal 135 is one example of a second terminal.

With this configuration, the heat diffusion layer 130 is thermally connected to the first lead frame 504 via the heat transportation terminals 135 dedicated to heat release.

The electromagnetic resonance coupler 100d may have the heat diffusion layer 130 as a ground shield for the electromagnetic resonance coupler 100d.

This allows the electromagnetic resonance coupler 100d to use the heat diffusion layer 130 as a ground shield.

Also, the electromagnetic resonance coupler 100d may have the heat diffusion layer 130 as a first ground shield that has the same potential as that of ground for the transmission circuit 201. The electromagnetic resonance coupler 100d may further have the first metal layer 131 in which the first resonator 101 electrically connected to the transmission circuit 201 is formed, the second metal layer 132 in which the second resonator 102 electrically connected to the receiving circuit 202 is formed, and the second ground shield 108 that has the same potential as that of ground for the receiving circuit 202. The thickness of the heat diffusion layer 130 may be larger than any of the thickness of the first metal layer 131, the thickness of the second metal layer 132, and the thickness of the second ground shield 108.

The thickness of the heat diffusion layer 130 may be substantially equal to the thickness of the second ground shield 108. This is because, when the thickness of the metal layer in the heat diffusion layer 130 is increased in a plating process, the thickness of the second ground shield 108 formed on the obverse side also increases.

This can improve the heat diffusion characteristic of the heat diffusion layer 130 over the heat diffusion of the other metal layers in the electromagnetic resonance coupler 100d.

Seventh Embodiment

A result of heat release simulation of the signal transmission device 10c will be described below as a seventh embodiment. The heat release simulation is performed on the signal transmission device 20 according to the first comparative example and the signal transmission device 10a according to the second embodiment.

[Conditions for Heat Release Simulation]

Conditions that are equivalent to those in the fifth embodiment, except for points other than those described below, are used to perform this heat release simulation.

The temperature of the transmission circuit 201 and the temperature of the receiving circuit 202 are calculated, assuming that 1 W power is supplied to only the transmission circuit 201, and no power is supplied to the receiving circuit 202. That is, the temperature of the transmission circuit 201 and the temperature of the transmission circuit 201 are calculated, assuming that only the receiving circuit 202 generates heat.

In the heat release simulation of the signal transmission device 10c, the size of the electromagnetic resonance coupler 100d is 6.85×6.00 mm, and the thickness thereof is 1.00 mm. The calculation is also performed, assuming that the size of the heat diffusion layer 130 is 6.85×6.00 mm, and the thickness thereof is 0.10 mm. For convenience of the calculation, the cross-sectional shape of each of the seventh vias 130a is a cuboid of 7.85×0.3 mm. FIGS. 21A and 21B are views each illustrating the shapes of the heat diffusion layer 130 and the seventh vias 130a in the simulation (an external perspective view of the signal transmission device 10c in the simulation).

Figure 22A:
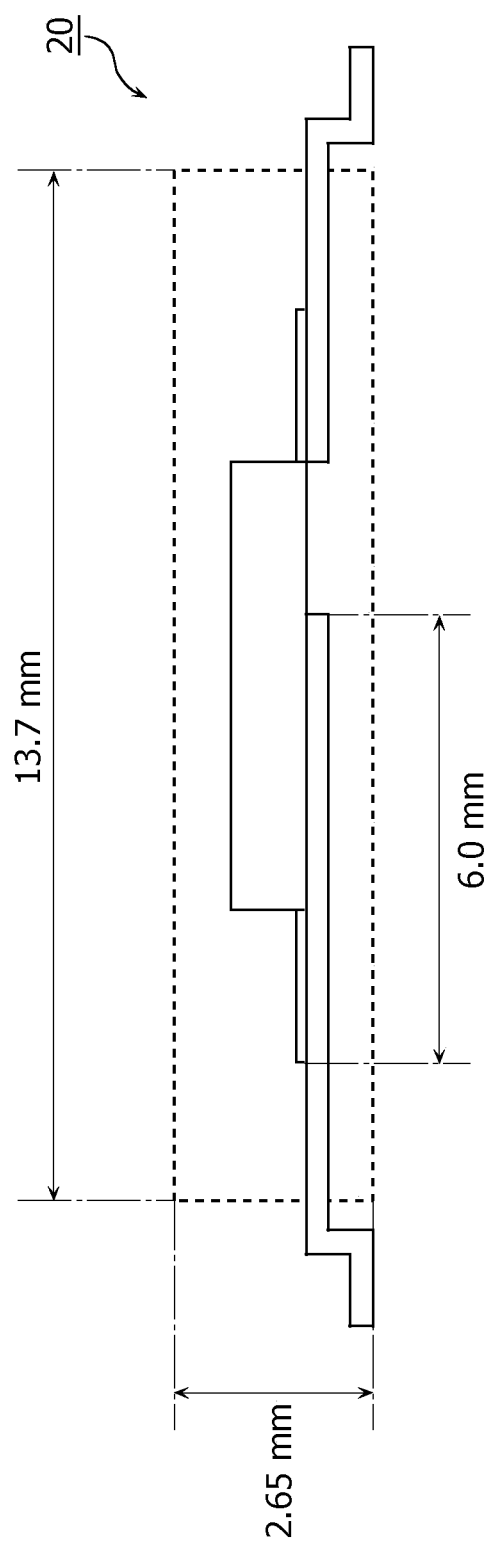
FIG. 22A is a side view illustrating the dimensions of the signal transmission device according to the first comparative example in the simulation.
Figure 22B:
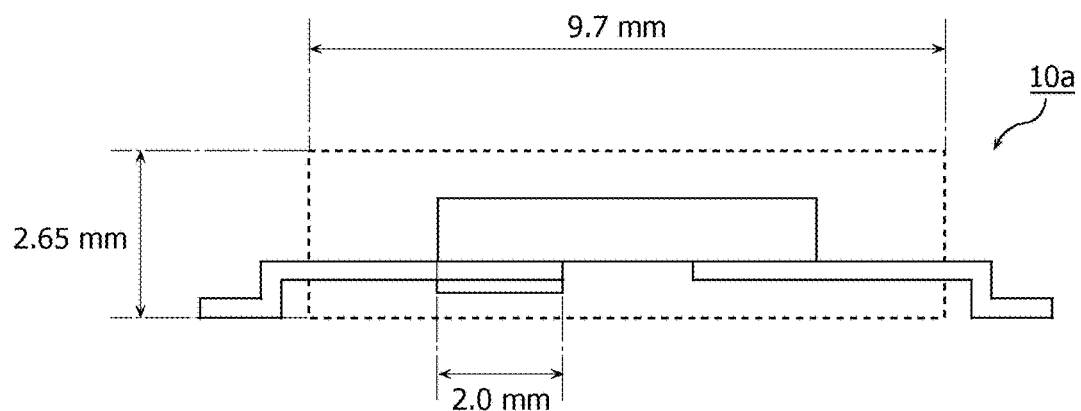
FIG. 22B is a side view illustrating the dimensions of the signal transmission device according to the second embodiment in the simulation.
Figure 22C:
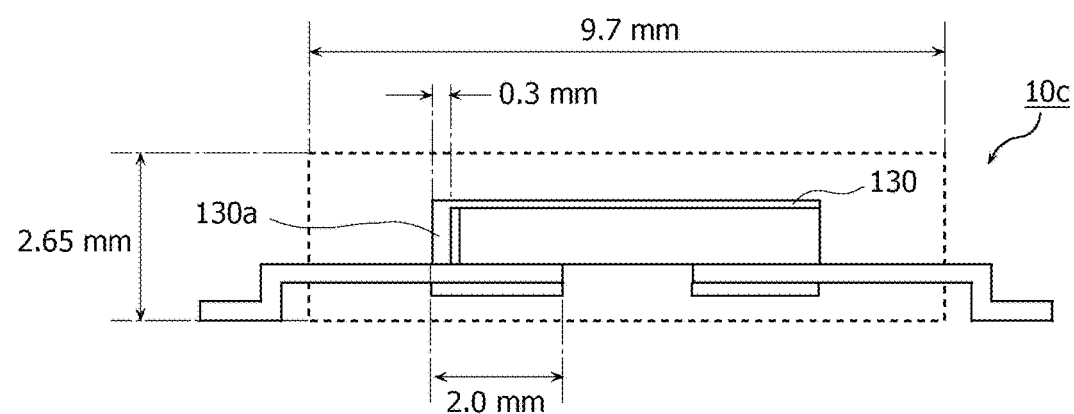
FIG. 22C is a side view illustrating the dimensions of the signal transmission device according to the sixth embodiment in the simulation.

Dimensions of each signal transmission device in the simulation will be described with reference to FIGS. 22A to 22C and Table 4. FIG. 22A is a side view illustrating the dimensions of the signal transmission device 20 according to the first comparative example in the simulation. FIG. 22B is a side view illustrating the dimensions of the signal transmission device 10a according to the second embodiment in the simulation. FIG. 22C is a side view illustrating the dimensions of the signal transmission device 10c according to the sixth embodiment in the simulation. Table 4 illustrates the dimensions of the signal transmission device 20 according to the first comparative example, the signal transmission device 10a according to the second embodiment, and the signal transmission device 10c according to the sixth embodiment. In FIGS. 22A to 22C, a sealant is indicated by a dashed line. The area of the first lead frame in Table 4 is an area excluding the area of the terminal portions of the first lead frame.

TABLE 4

Dimensions of Each Signal Transmission Device

|  | Size of Sealant [mm²] | Area of First Lead Frame [mm²] | Thickness of Sealant [mm] |
|---|---|---|---|
| Comparative Example 1 | 7.85 × 13.7 (≈108) | 7.85 × 6.00 | 2.65 |
| Embodiment 2 | 7.85 × 9.7 (≈76) | 7.85 × 2.00 | 2.65 |
| Embodiment 6 | 7.85 × 9.7 (≈76) | 7.85 × 2.00 | 2.65 |

[Result of Heat Release Simulation]

Figure 23A:
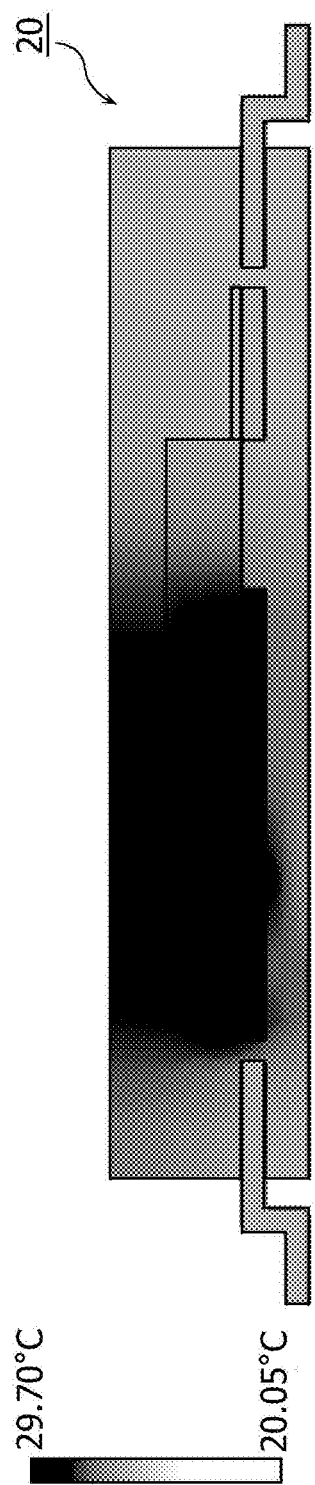
FIG. 23A is a sectional view illustrating temperature distribution of the signal transmission device according to the first comparative example.
Figure 23B:
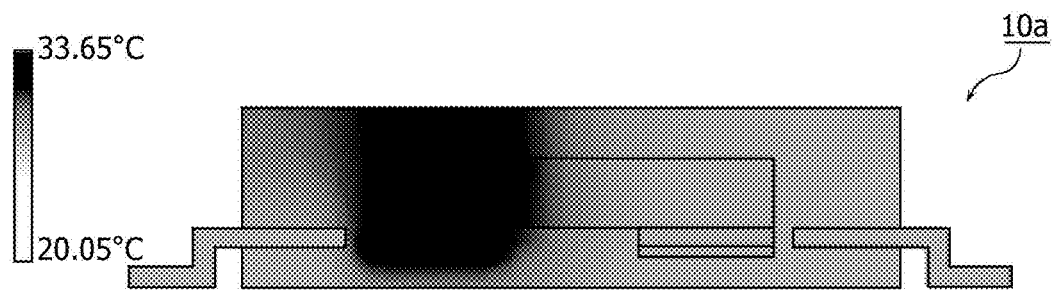
FIG. 23B is a sectional view illustrating temperature distribution of the signal transmission device according to the second embodiment.
Figure 23C:
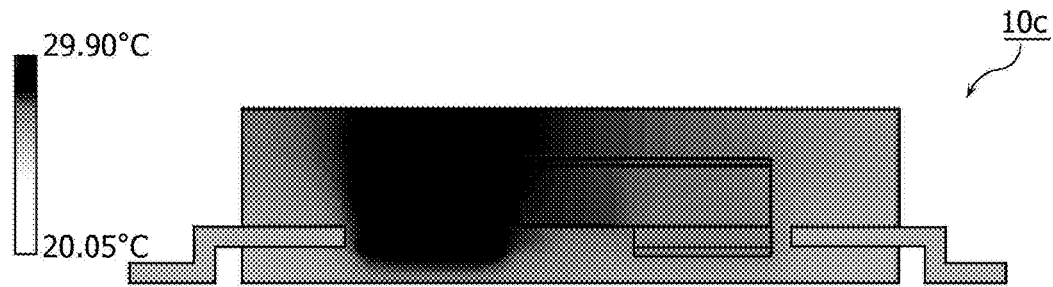
FIG. 23C is a sectional view illustrating temperature distribution of the signal transmission device according to the sixth embodiment.

A result of the heat release simulation (i.e., temperature distribution after the heat release simulation) will be described with reference to FIGS. 23A to 23C and Table 5. FIG. 23A is a sectional view illustrating temperature distribution of the signal transmission device 20 according to the first comparative example. FIG. 23B is a sectional view illustrating temperature distribution of the signal transmission device 10a according to the second embodiment. FIG. 23C is a sectional view illustrating temperature distribution of the signal transmission device 10c according to the sixth embodiment. Table 5 illustrates a result of the heat release simulation. Specifically, Table 5 illustrates average temperatures of the transmission circuit 201 in the heat release simulation and average temperatures of the receiving circuit 202 in the heat release simulation. In FIGS. 23A to 23C, the darker (i.e., black) color indicates a higher temperature.

TABLE 5

Dimensions of Each Signal Transmission Device

|  | Temperature of Transmission circuit | Temperature of Receiving Circuit |
|---|---|---|
| Comparative Example 1 | 29.7° C. | 20.3° C. |
| Embodiment 2 | 33.6° C. | 20.8° C. |
| Embodiment 6 | 29.9° C. | 23.6° C. |

The first lead frame 204 in the signal transmission device 20 according to the first comparative example has a longitudinal width of 6.0 mm, which is large, and thus has a large area. Hence, heat generated in the transmission circuit 201 spreads to the first lead frame 204 and diffuses to substantially the entire sealant 220, as illustrated in FIG. 23A. That is, the heat resistance is reduced.

The size of the sealant 520 in the signal transmission device 10a according to the second embodiment is smaller than that in the signal transmission device 20. According to Table 4, the area of the sealant 520 is reduced by about 30% compared with the area of the sealant 220.

Also, the longitudinal width of the first lead frame 504 is 2.0 mm, which is one-third of the longitudinal width of the first lead frame 204 included in the signal transmission device 20 according to the first comparative example.

As illustrated in FIG. 23B, heat generated in the transmission circuit 201 mostly does not diffuse and remains in the vicinity of the transmission circuit 201. A heat resistance that indicates the temperature of the signal transmission device 10a when 1 W power is supplied thereto is 13.6° C./W at the transmission circuit 201. This heat resistance is about 40% higher than that in the signal transmission device 20 according to the first comparative example.

The area of the sealant and the size of the electromagnetic resonance coupler 100d in the signal transmission device 10c according to the sixth embodiment do not differ from those in the signal transmission device 10a according to the second embodiment. However, as illustrated in FIG. 23C, heat generated in the transmission circuit 201 spreads to the entire sealant through the heat diffusion layer 130.

Also, as illustrated in Table 5, the temperature of the receiving circuit 202 included in the signal transmission device 10c according to the sixth embodiment increases by about 3° C., compared with the temperature of the receiving circuit 202 included in the signal transmission device 20 according to the first comparative example and the temperature of the signal transmission device 10a according to the second embodiment. This is thought to be due to a result of a temperature increase in the entire sealant which is caused by the heat diffusion layer 130. That is, in the signal transmission device 10c according to the sixth embodiment, the heat diffusion layer 130 improves the temperature distribution.

Also, the thermal resistance value of the signal transmission device 10c according to the sixth embodiment is 9.9° C./W at the transmission circuit 201, and this value is approximately equal to that of the signal transmission device 20 according to the first comparative example in which the sealant 220 has a larger size. The thermal resistance value at the transmission circuit 201 in the signal transmission device 10c according to the sixth embodiment is reduced by about 40% compared with the signal transmission device 10a according to the second embodiment.

As described above, in the signal transmission device 10c according to the sixth embodiment, since the electromagnetic resonance coupler 100d has the heat diffusion layer 130, it is possible to improve the heat-release characteristic while suppressing an increase in the package size and an increase in the number of manufacturing processes.

Brief Summary

The signal transmission device according to the present disclosure has been described above in accordance with the first to seventh embodiments. The present disclosure, however, is not limited to the embodiments or modifications thereof. A mode obtained by making various modifications conceived by those skilled in the art to the embodiments or modifications thereof or a mode constituted by combining the constituent elements in different embodiments or modifications thereof are also encompassed by the scope of the present disclosure, as long as such modes do not depart from the spirit and scope of the present disclosure.

The signal transmission device according to the present disclosure can be easily miniaturized and can be used as an isolator or an insulation-type power transmission device.

What is claimed is:

1. A signal transmission device comprising:
a first lead frame having a first major surface and a second major surface opposite to the first major surface;
a second lead frame having a third major surface and a fourth major surface and isolated from the first lead frame, the fourth major surface located opposite to the third major surface;
a transmission circuit that sends a transmission signal, the transmission circuit located on the first major surface of the first lead frame;
a receiving circuit located on the third major surface of the second lead frame; and
an electromagnetic resonance coupler located across between the second major surface of the first lead frame and the fourth major surface of the second lead frame to transmit the transmission signal, sent by the transmission circuit, to the receiving circuit in a contactless manner.

2. The signal transmission device according to claim 1, wherein an end portion of the first lead frame is bent toward the first major surface side, and an end portion of the second lead frame is bent toward the third major surface side.

3. The signal transmission device according to claim 1, wherein an end portion of the first lead frame is bent toward the second major surface side, and an end portion of the second lead frame is bent toward the fourth major surface side.

4. The signal transmission device according to claim 1, wherein the electromagnetic resonance coupler includes
a first terminal electrically connected to the transmission circuit, and
a second terminal electrically connected to the receiving circuit; and
wherein, when the electromagnetic resonance coupler is viewed from a direction perpendicular to the first major surface, the first terminal and the second terminal are located between the first lead frame and the second lead frame.

5. The signal transmission device according to claim 1, further comprising:
a sealant that seals the transmission circuit, the receiving circuit, and the electromagnetic resonance coupler; and a heatsink that is provided on the second major surface of the first lead frame and is partly exposed from the sealant, wherein, when viewed from a direction perpendicular to the first major surface, the heatsink and the transmission circuit at least partly overlap each other.

6. The signal transmission device according to claim 5, wherein a gap is provided between the electromagnetic resonance coupler and the heatsink, and the first lead frame has an opening that communicates with the gap between the electromagnetic resonance coupler and the heatsink.

7. The signal transmission device according to claim 1, wherein the electromagnetic resonance coupler includes
a first resonator that is electrically connected to the transmission circuit, and
a second resonator that faces the first resonator and is electrically connected to the receiving circuit; and
wherein the transmission circuit sends a signal, obtained by modulating a high-frequency wave with an input signal, to the first resonator as the transmission signal,
the first resonator transmits the transmission signal, sent by the transmission circuit, to the second resonator in the contactless manner,
the second resonator sends the transmission signal, transmitted by the first resonator in the contactless manner, to the receiving circuit, and
the receiving circuit receives the transmission signal sent by the second resonator and demodulates the received transmission signal to generate an output signal corresponding to the input signal.

8. The signal transmission device according to claim 7, wherein each of a wiring-line length of the first resonator and a wiring-line length of the second resonator is one-fourth of a wavelength of the high-frequency wave.

9. The signal transmission device according to claim 1, wherein the electromagnetic resonance coupler further includes a heat diffusion layer thermally connected to the first lead frame.

10. The signal transmission device according to claim 9, wherein the electromagnetic resonance coupler further includes
a first terminal that provides electrical connection between the electromagnetic resonance coupler and the transmission circuit, and
a second terminal that provides thermal connection between the heat diffusion layer and the first lead frame, and
wherein the second terminal is directly connected to the first lead frame, and is different from the first terminal.

11. The signal transmission device according to claim 9, wherein the heat diffusion layer comprises a ground shield for the electromagnetic resonance coupler.

12. The signal transmission device according to claim 9, wherein the heat diffusion layer is a first ground shield for the electromagnetic resonance coupler, the first ground shield having the same potential as that of ground for the transmission circuit;
wherein the electromagnetic resonance coupler further includes
a first metal layer that includes a first resonator electrically connected to the transmission circuit,
a second metal layer that includes a second resonator electrically connected to the receiving circuit, and
a second ground shield that has the same potential as that of ground for the receiving circuit; and
wherein a thickness of the heat diffusion layer is larger than any of a thickness of the first metal layer, a thickness of the second metal layer, and a thickness of the second ground shield.

13. The signal transmission device according to claim 1, wherein the first major surface of the first lead frame and the third major surface of the second lead frame are directed in the same direction.

14. The signal transmission device according to claim 1, wherein the electromagnetic resonance coupler has a fifth major surface, and
the second major surface of the first lead frame and the fourth major surface of the second lead frame are located on the fifth major surface.

15. The signal transmission device according to claim 14, wherein the first major surface of the first lead frame and the third major surface of the second lead frame are located in a same hypothetical plane.

16. A manufacturing method for a signal transmission device including
a first lead frame having a first major surface and a second major opposite to the first major surface,
a second lead frame having a third major surface and a fourth major surface and isolated from the first lead frame, the fourth major surface located opposite to the third major surface,
a transmission circuit that sends a transmission signal,
a receiving circuit, and
an electromagnetic resonance coupler that transmits the transmission signal, sent by the transmission circuit, to the receiving circuit in a contactless manner,
the manufacturing method comprising:
arranging the electromagnetic resonance coupler across between the second major surface of the first lead frame and the fourth major surface of the second lead frame;
arranging, after the arranging of the electromagnetic resonance coupler, the transmission circuit on the first major surface of the first lead frame; and
arranging, after the arranging of the electromagnetic resonance coupler, the receiving circuit on the third major surface of the second lead frame.

* * * * *